US007108797B2

(12) United States Patent
Chen et al.

(10) Patent No.: US 7,108,797 B2
(45) Date of Patent: Sep. 19, 2006

(54) METHOD OF FABRICATING A SHIFTABLE MAGNETIC SHIFT REGISTER

(75) Inventors: Tze-chiang Chen, Yorktown Heights, NY (US); Stuart S. P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 10/787,738

(22) Filed: Feb. 25, 2004

(65) Prior Publication Data

US 2004/0251232 A1 Dec. 16, 2004

Related U.S. Application Data

(63) Continuation-in-part of application No. 10/458,554, filed on Jun. 10, 2003, now Pat. No. 6,834,005, and a continuation-in-part of application No. 10/458,147, filed on Jun. 10, 2003, now Pat. No. 6,898,132.

(51) Int. Cl.
*G11B 5/127* (2006.01)
*B44C 1/22* (2006.01)
*H01L 21/00* (2006.01)

(52) U.S. Cl. .................. 216/22; 216/39; 29/603.01; 29/603.13; 29/603.18; 360/113; 438/3

(58) Field of Classification Search ............... 216/22, 216/39; 438/3; 360/113; 29/603.01, 603.13, 29/603.18
See application file for complete search history.

(56) References Cited

U.S. PATENT DOCUMENTS

| 3,333,255 | A | * | 7/1967 | David | 365/83 |
| 3,611,328 | A | | 10/1971 | Spain | 340/174 TF |
| 3,846,770 | A | | 11/1974 | Schwee et al. | 340/174 |
| 3,868,659 | A | | 2/1975 | Schwee | 340/174 |
| 3,883,858 | A | * | 5/1975 | Lienhard et al. | 365/87 |
| 3,997,885 | A | | 12/1976 | Battarel | 340/174 |
| 4,075,612 | A | | 2/1978 | Johnson et al. | 365/171 |
| 4,075,613 | A | | 2/1978 | Torok | 365/87 |
| 4,080,591 | A | | 3/1978 | Torok | 365/171 |
| 4,192,012 | A | | 3/1980 | Schwee et al. | 365/87 |
| 4,199,819 | A | | 4/1980 | Schwee et al. | 365/87 |
| 4,250,565 | A | | 2/1981 | Cosimini et al. | 365/87 |
| 4,253,160 | A | | 2/1981 | Paul et al. | 365/87 |
| 4,253,161 | A | | 2/1981 | Paul et al. | 365/87 |

(Continued)

OTHER PUBLICATIONS

L. Geppert, "The New Incredible Memories," IEEE Spectrum, Apr. 2003, pp. 49-54.

(Continued)

*Primary Examiner*—Shamim Ahmed
(74) *Attorney, Agent, or Firm*—Samuel A. Kassatly

(57) ABSTRACT

A magnetic data track used in a magnetic shift register memory system may be fabricated by forming a multilayered stack of alternating dielectric and/or silicon layers. Vias of approximately 10 microns tall with a cross-section on the order of 100 nm×100 nm are etched in this multilayered stack of alternating layers. Vias may be etched form smooth or notched walls. Vias are filled by electroplating layers of alternating types of ferromagnetic or ferrimagnetic metals. The alternating ferromagnetic or ferrimagnetic layers are comprised of magnetic materials with different magnetization or magnetic exchange or magnetic anisotropies. These different magnetic characteristics allow the pinning of magnetic domain walls at the boundaries between these layers. Alternatively, vias are filled with a homogeneous ferromagnetic material. Magnetic domain walls are formed by the discontinuity in the ferromagnetic or ferromagnetic material that occurs at the notches or at the protuberances along the via walls.

67 Claims, 39 Drawing Sheets

U.S. PATENT DOCUMENTS

| | | | | |
|---|---|---|---|---|
| 4,410,963 | A | 10/1983 | Lo et al. | 365/87 |
| 5,650,958 | A | 7/1997 | Gallagher et al. | 365/173 |
| 5,729,410 | A | 3/1998 | Fontana, Jr. et al. | 360/113 |
| 5,801,984 | A | 9/1998 | Parkin | 365/158 |
| 6,955,926 | B1 * | 10/2005 | Chen et al. | 438/3 |
| 2002/0101761 | A1 | 8/2002 | Naji | 365/171 |
| 2003/0107833 | A1 | 6/2003 | Rettner et al. | 360/48 |
| 2003/0128460 | A1 | 7/2003 | Zolla | 360/97.01 |

OTHER PUBLICATIONS

Richard Butner, "Computing Unplugged, Magnetic RAM cures your computer of shorter memory loss," available at: http://www.research.ibm.com/thinkresearch/pages/2001/20010202_mram.shtml, as of May 14, 2003.

Y. Ooba et al., "A Thin Magnetic Film Shift Register," Paper 6.4, presented at the 1972 INTERMAG Conference, Kyoto, Japan, Apr. 10-13, 1972.

Hermann Deichelmann, "Magnetic Domain Tip Memories—Construction and Applications," Journal of Magnetism and Magnetic Materials 4 (1977) 174-179.

D.H. Smith, "A Magnetic Shift Register Employing Controlled Domain Wall Motion," IEEE Transaction on Magnetics, vol. Mag-1, No. 4, Dec. 1965, pp. 281-284.

J. S. Sallo et al., "An "ORTHOCORE" Magnetic Shift Register," IEEE Transactions on Magnetics, vol. MAG-2, No. 3, Sep. 1966, pp. 197-201.

* cited by examiner

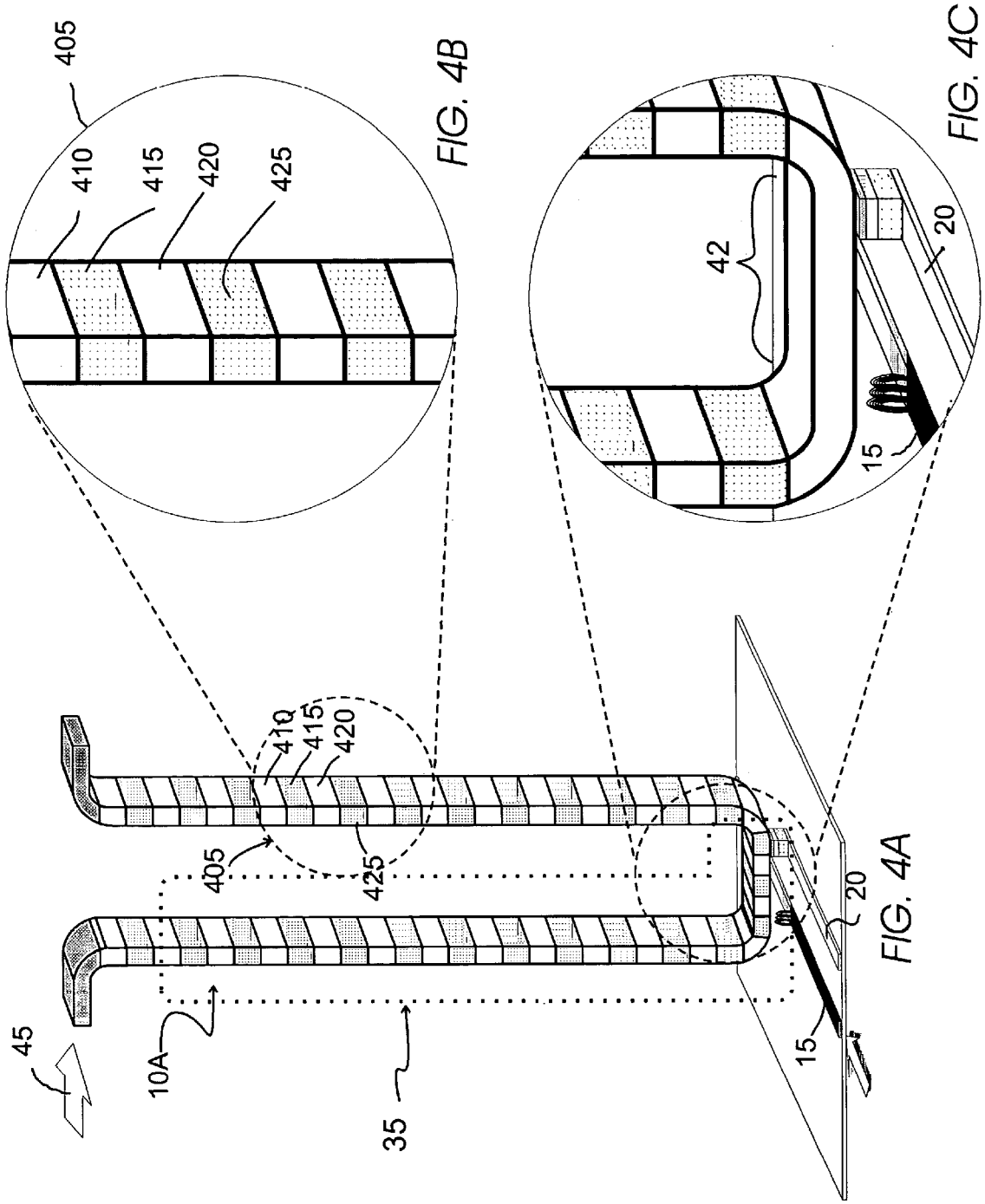

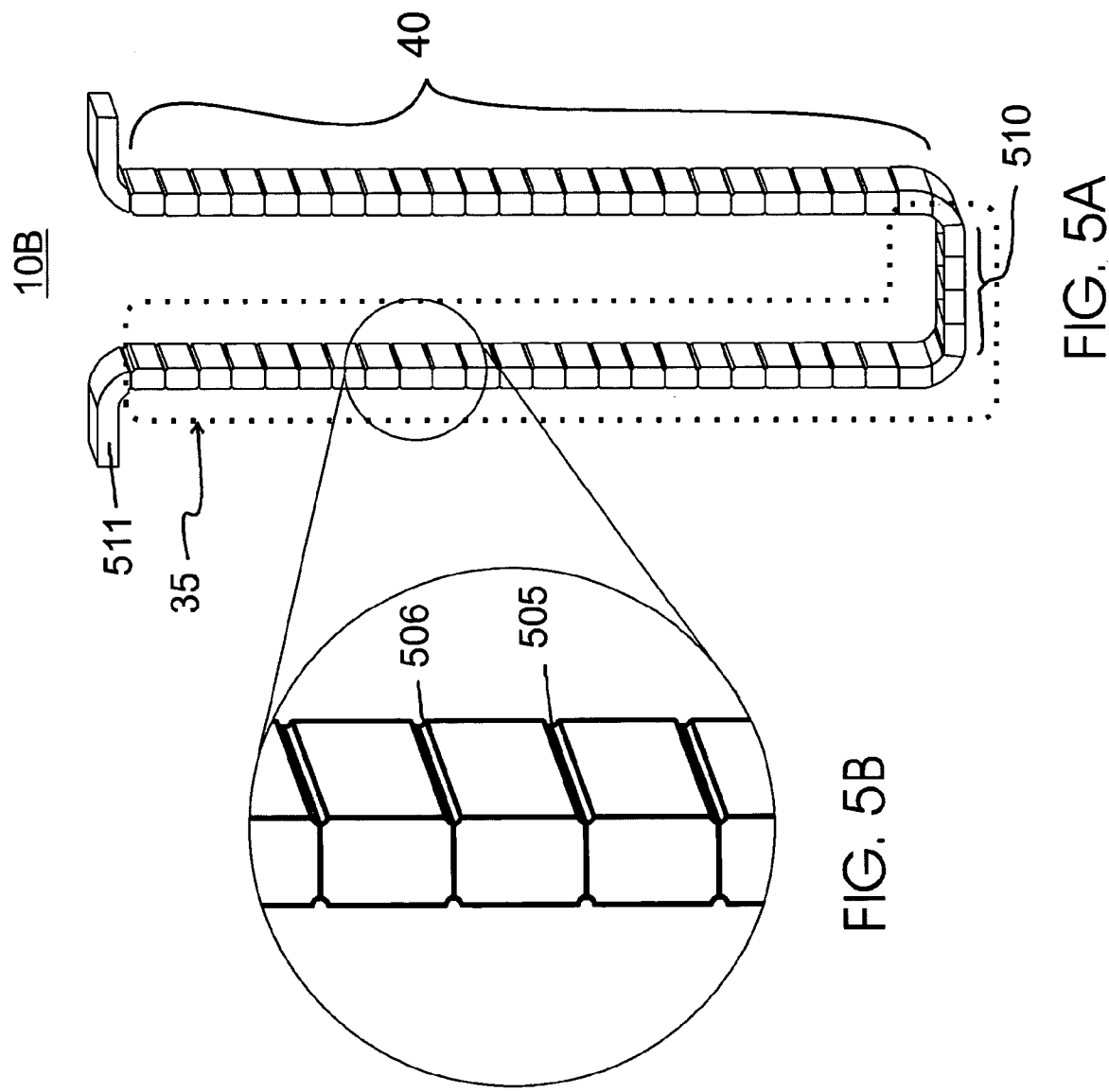

METHOD OF FABRICATING A SHIFTABLE MAGNETIC SHIFT REGISTER

PRIORITY CLAIM

The present application is a continuation-in-part of, claims the priority of U.S. patent application Ser. No. 10/458,554, titled "Shiftable Magnetic Shift Register and Method of Using the Same," issued as U.S. Pat. No. 6,834,005, and Ser. No. 10/458,147, titled "System and Method for Writing to a Magnetic Shift Register," issued as U.S. Pat. No. 6,898,132, which were filed on Jun. 10, 2003, which are incorporated herein by reference in their entirety.

FIELD OF THE INVENTION

The present invention generally relates to memory storage systems, and particularly to a memory storage system that uses the magnetic moment of magnetic domains to store data. Specifically, the present invention relates to a method for fabricating a magnetic data track for use in a magnetic shift register memory device.

BACKGROUND OF THE INVENTION

The two most common conventional non-volatile data storage devices are disk drives and solid-state random access memories (RAM). Disk drives are capable of inexpensively storing large amounts of data, i.e., greater than 100 GB. However, disk drives are inherently unreliable. A hard drive comprises a fixed read/write head and a moving medium upon which data is written. Devices with moving parts tend to wear out and fail. Solid-state random access memories currently store data on the order of 1 GB (gigabyte) per device, and are relatively expensive, per storage unit, compared to a disk drive.

The most common type of solid-state RAM is flash memory. Flash memory relies on a thin layer of polysilicon that is disposed in oxide below a transistor's on-off control gate. This layer of polysilicon is a floating gate, isolated by the silicon from the control gate and the transistor channel. Flash memory is relatively slow, with reading and writing times on the order of a microsecond. In addition, flash memory cells can begin to lose data after less than a million write cycles. While this may be adequate for some applications, flash memory cells may begin to fail rapidly if used constantly to write new data, such as in a computer's main memory. Further, the access time for flash memory is much too long for computer applications.

Another form of RAM is the ferroelectric RAM, or FRAM. FRAM stores data based on the direction that ferroelectric domains point. FRAM has access times much faster than Flash memory and consumes less energy than standard dynamic random access memory (DRAM). However, commercially available memory capacities are currently low, on the order of 0.25 MB (megabyte). In addition, memory storage in a FRAM relies on physically moving atoms, leading to eventual degradation of the medium and failure of the memory.

Yet another form of RAM is the Ovonic Unified Memory (OUM) that utilizes a material that alternates between crystalline and amorphous phases to store data. The material used in this application is a chalcogenide alloy. After the chalcogenide alloy experiences a heating and cooling cycle, it can be programmed to accept one of two stable phases: polycrystalline or amorphous. The differences in the respective resistances of the two phases allow the chalcogenide alloy to be used as memory storage. Data access time is on the order of 50 ns. However, the size of these memories is still small, on the order of 4 MB currently. In addition, OUM relies on physically changing a material from crystalline to amorphous, likely causing the material to eventually degrade and fail.

Semiconductor magnetoresistive RAM (MRAM) encodes data bits in a ferromagnetic material by utilizing the direction of the material's magnetic moment. Atoms in ferromagnetic materials respond to external magnetic fields, aligning their magnetic moments to the direction of the applied magnetic field. When the field is removed, the atoms' magnetic moments still remain aligned in the induced direction. A field applied in the opposite direction causes the atoms to realign themselves with the new direction. Typically, the magnetic moments of the atoms within a volume of the ferromagnetic material are aligned parallel to one another by a magnetic exchange interaction. These atoms then respond together, largely as one macro-magnetic moment, or magnetic domain, to the external magnetic field.

One approach to MRAM uses a magnetic tunneling junction as the memory cell. The magnetic tunneling junction comprises two layers of ferromagnetic material separated by a thin insulating material. The direction of the magnetic domains is fixed in one layer. In the second layer, the domain direction is allowed to move in response to an applied field. Consequently, the direction of the domains in the second layer can either be parallel or opposite to the first layer, allowing the storage of data in the form of ones and zeros. However, currently available MRAM can only store up to 1 Mb (megabit), much less than needed for most memory applications. Larger memories are currently in development. In addition, each MRAM memory cell stores only one bit of data, thereby limiting the maximum possible memory capacity of such devices.

A magnetic shift register replaces many conventional memory devices including but not limited to magnetic recording hard disk drives, and many solid-state memories such as DRAM, SRAM, FeRAM, and MRAM. The magnetic shift register provides capacious amounts of storage comparable to those provided in conventional memory devices but without any moving parts and at a cost comparable to hard disk drives.

Briefly, the magnetic shift register memory device uses the inherent, natural properties of the domain walls in ferromagnetic materials to store data. The magnetic shift register memory device utilizes one read/write device to access numerous bits, on the order of 100 bits of data or more. Consequently, a small number of logic elements can access hundreds of bits of data.

The magnetic shift register memory device uses spin-based electronics to write and read data in ferromagnetic material so that the physical nature of the material in the magnetic shift register is unchanged. A shiftable magnetic shift register comprises a data track formed of a fine wire or strip of material made of ferromagnetic material. The wire can be comprised of a physically uniform, magnetically homogeneous ferromagnetic material or layers of different ferromagnetic materials. Information is stored as direction of magnetic moment within the domains in the track. The wire can be magnetized in small sections in one direction or another.

An electric current is applied to the track to move the magnetic domains along the track in the direction of the electric current, past reading or writing elements or devices. In a magnetic material with domain walls, current passed across the domain wall moves the domain wall in the direction of the current flow. As the current passes through a domain, it becomes "spin polarized". When this spin-polarized current passes into the next domain across a domain wall, it develops a spin torque. This spin torque moves the domain wall. Domain wall velocities can be very high, on the order of 100 to 500 m/sec.

In summary, current passed through the track (having a series of magnetic domains with alternating directions) can move these domains past the reading and writing elements. The reading device can then read the direction of the magnetic moments. The writing device can change the direction of the magnetic moments, thus writing information to the track.

What is needed is an improved method for fabricating the magnetic data tracks needed to build a magnetic shift register memory device.

SUMMARY OF THE INVENTION

The present invention satisfies this need, and presents methods for fabricating the magnetic data tracks needed to build a magnetic shift register memory device.

The magnetic shift register memory device comprises the storage of information in magnetic wires that are largely perpendicular to a plane that comprises reading and writing elements. These reading and writing elements are constructed using conventional CMOS technology. The magnetic shift register memory promises a 100-fold increase in density compared to conventional CMOS memories. The magnetic wires can be formed as tall (approximately 10 microns) and narrow (approximately 0.1 micron) pillars, with connections between two of these pillars on one end of the pillars.

The magnetic data track is fabricated by forming a multilayered stack of alternating layers of different materials formed from silicon or dielectrics. Vias having a height of approximately 1 to 10 microns and a cross-section on the order of 100 nm×100 nm are etched in this multi-layered stack structure. The vias can have a cross-section that is elliptical, rectangular, square, or any other desirable or suitable shape. Fabricating techniques for creating vias of these dimensions are based on techniques used to manufacture trench capacitors used by DRAMs. Conventional techniques for fabricating these trench capacitors have achieved dimensions of approximately 9 to 10 microns deep and approximately 0.1 microns in cross-section. Reference is made to U.S. Pat. Nos. 6,544,838 and 6,284,666, which are incorporated herein by reference.

In one embodiment, the vias are etched by a non-selective etch to form vias with smooth walls. The vias are filled by electroplating layers of alternating types of ferromagnetic or ferrimagnetic metals. The thickness of each layer can be, for example, between approximately 50 nm to 500 nm. The alternating ferromagnetic or ferrimagnetic layers are comprised of magnetic materials with different magnetization or magnetic exchange or magnetic anisotropies. These different magnetic characteristics allow the pinning of magnetic domain walls at the boundaries between these layers or within one of these layers.

In another embodiment, a selective etch is performed after the vias have been non-selectively etched. This selective etch removes layers of material in the multi-layer stack structure at a higher rate than layers of the other material, forming notches or protuberances in the walls of the vias.

The vias are filled with a homogeneous ferromagnetic material by, for example, electroplating or chemical vapor deposition (CVD). Magnetic domain walls are formed nearby the discontinuities in the ferromagnetic or ferrimagnetic material that occurs at the notches or at the protuberances along the via walls.

Means of connecting current leads to either end of each data track are provided for the purposes of injecting current to move the domain walls along the data track.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 4 is comprised of FIGS. 4A, 4B, and 4C, wherein FIGS. 4A and 4B represent a schematic diagram illustrating an embodiment of the magnetic shift register of FIG. 1 constructed of multiple types of alternating ferromagnetic materials, and wherein FIG. 4C is a schematic diagram of another embodiment of the shift register of FIG. 1, illustrating a well or bottom section of the shift register as being composed of a single ferromagnetic material;

FIG. 5 is comprised of FIGS. 5A and 5B, and represents a schematic diagram illustrating an embodiment of the magnetic shift register of FIG. 1 constructed with indentations in a homogeneous ferromagnetic material;

DETAILED DESCRIPTION OF PREFERRED EMBODIMENTS

The following definitions and explanations provide background information pertaining to the technical field of the present invention, and are intended to facilitate the understanding of the present invention without limiting its scope:

Homogeneous magnetic material means a contiguous volume of magnetic material, which may have a complex shape, which nominally has the same magnetic properties, such as magnetization, magnetic anisotropy, magnetic exchange and magnetic damping, independent of the position within the volume.

Inhomogeneous magnetic material means a contiguous volume of magnetic material, which may have a complex shape, whose magnetic properties, such as magnetization, magnetic anisotropy, magnetic exchange and magnetic damping, may vary with position within the volume due, for example, to a change in material composition and/or due to some physical process during the deposition of this material or acting on the material after the material has been deposited.

Figure 1:
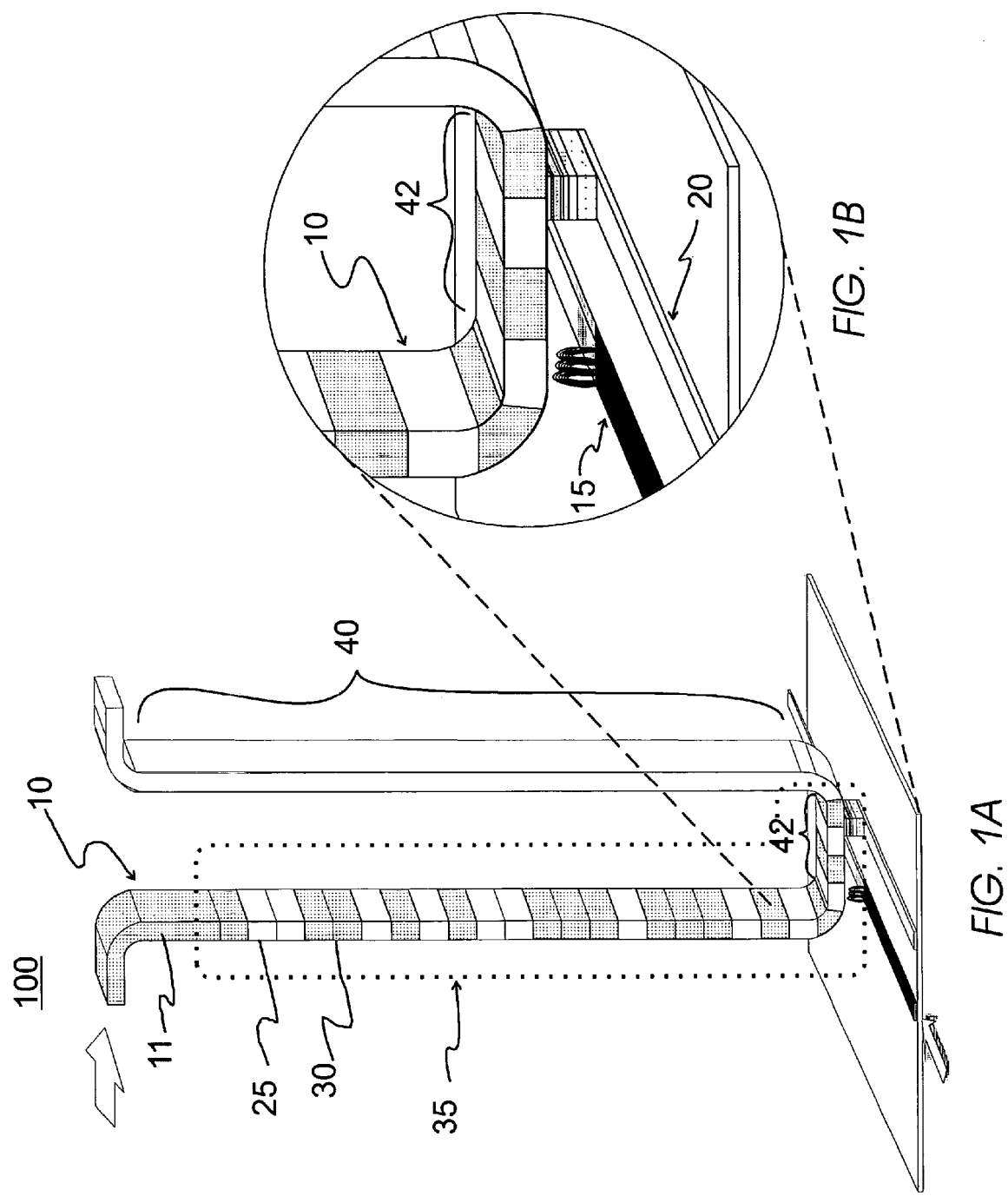
FIG. 1 is comprised of FIGS. 1A and 1B, and represents an exemplary operating embodiment in which a writing element is used to write data to a magnetic shift register according to the present invention.

FIG. 1 (FIGS. 1A and 1B) illustrates an exemplary high-level architecture of a magnetic memory system 100 comprising a magnetic shift register 10 that utilizes a writing device (also referred to herein as writing element) 15 and a reading device (also referred to herein as reading element) 20. Both the reading device 20 and the writing device 15 form a read/write element of system 100.

The magnetic shift register 10 comprises a fine data track 11 preferably made of ferromagnetic or ferromagnetic material. The data track 11 can be magnetized in small sections, or domains, in one direction or another. Information is stored in regions such as domains 25, 30 in the data track 11. The order parameter of the magnetic material from which the track is fabricated, that is the magnetization direction or the direction of the magnetic moment, changes from one direction to another. This variation in the direction of the magnetic moment forms the basis for storing information in the data track 11.

In one embodiment, the magnetic shift register 10 comprises a data region 35 and a reservoir 40, connected by a central region 42. The data region 35 comprises a contiguous set of domains such as domains 25, 30 that store data. Additional length is provided to the magnetic shift register 10 in the form of a reservoir 40.

The reservoir 40 is made sufficiently long so that it accommodates all the domains in the data region 35 when these domains are moved completely from data region 35 through central region 42 across the writing element 15 and reading element 20 for the purposes of writing and reading domains in the central region 42. At any given time, the domains are thus stored partially in data region 35 and partially in reservoir 40, so it is the combination of data region 35, reservoir 40, and central region 42 that forms the storage element. In one embodiment, the reservoir 40 is devoid of magnetic domains in a quiescent state.

Thus, the data region 35 at any given time can be located within a different portion of the magnetic shift register 10, and the reservoir 40 can be divided into two regions on either side of the data region 35. Although the data region 35 can be one contiguous region, the spatial distribution and extent of the domains within the data region 35 can be approximately the same no matter where the data region 35 resides within the shift register 10. In another embodiment, portions of the storage region can be expanded during the motion of this region particularly across the reading element 20 and writing element 15. A portion or the entire data region 35 is moved into the reservoir 40 to access data in specific domains.

The reservoir 40 shown in FIG. 1 has approximately the same size as the data region 35. However, other alternative embodiments can allow the reservoir 40 to have a different size than the data region 35. As an example, the reservoir 40 can be much smaller than the data region 35 if more than one reading element 20 and writing element 15 are used for each magnetic shift register 10. For example, if two reading elements 20 and writing elements 15 are used for one magnetic shift register 10 and are disposed equally along the length of the data region 35, then the reservoir 40 only needs to be approximately half as long as the data region 35.

An electric current 45 is applied to the data track 11 to move the magnetic moments within domains 25, 30, along the data track 11, and past the reading device 20 or the writing device 15. In a magnetic material with domain walls, a current passed across the domain walls moves the domain walls in the direction of the current flow. As the current passes through a domain, it becomes "spin polarized". When this spin-polarized current passes through into the next domain across the intervening domain wall, it develops a spin torque. This spin torque moves the domain wall. Domain wall velocities can be very high, i.e., on the order of 100 to several hundred m/sec, so that the process of moving a particular domain to the required position for the purposes of reading this domain or for changing its magnetic state by means of the writing element can be very short.

Figure 2:
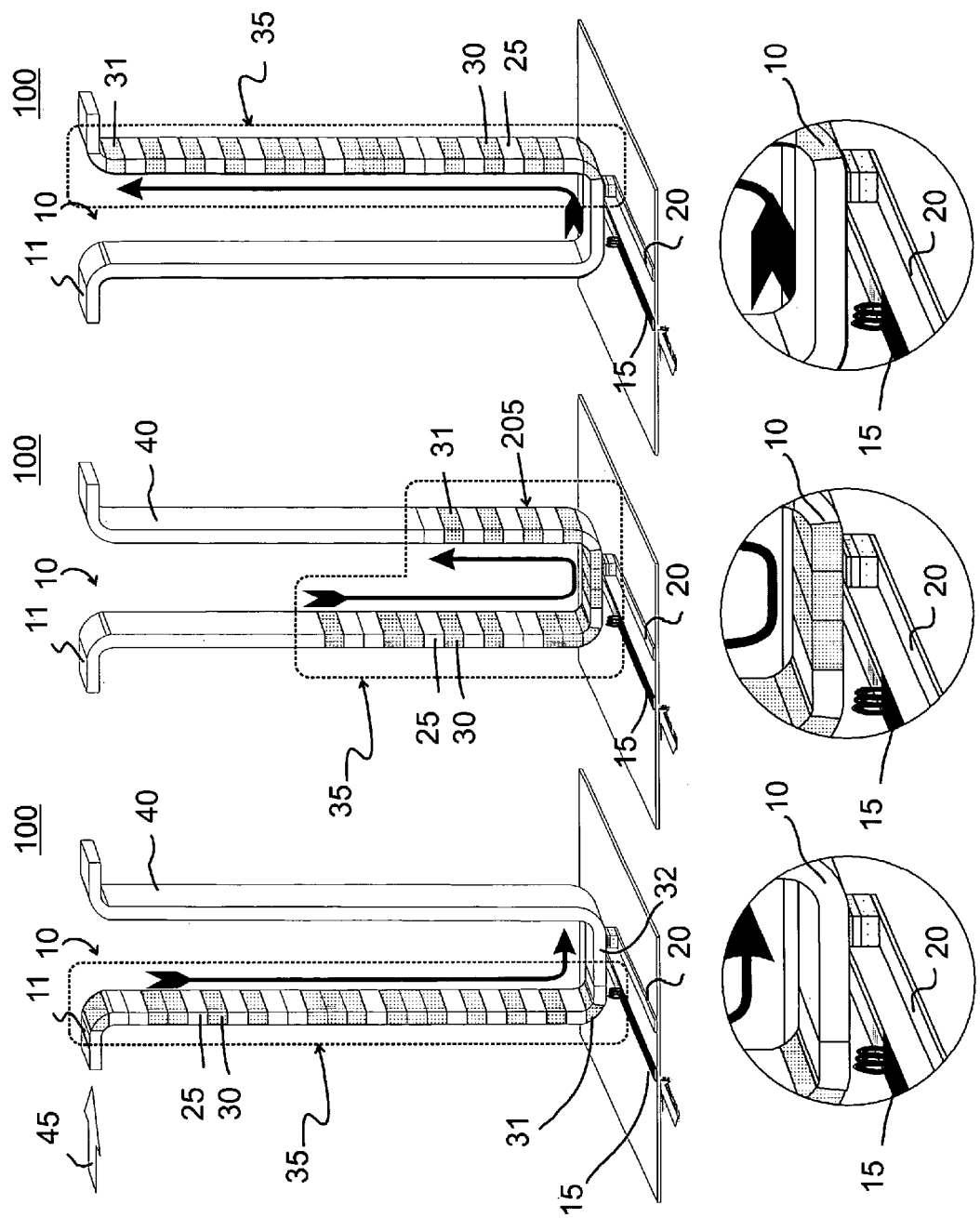
FIG. 2 is comprised of FIGS. 2A, 2B, and 2C and represents a schematic diagram illustrating a method of operation of the magnetic shift register of FIG. 1.

The domains, such as domains 25, 30, 31, are moved (or shifted) back and forth over the writing device 15 and the reading device 20 to move the data region 35 in and out of the reservoir 40, as shown in FIG. 2 (FIGS. 2A, 2B, 2C). In the example of FIG. 2A, the data region 35 initially resides on the left side of the well, i.e., central region 42, of the magnetic shift register 10, with no domains in the reservoir 40. FIG. 2C shows the case where the data region 35 resides entirely on the right side of the magnetic shift register 10.

To write data in a specific domain, such as domain 31, a current 45 is applied to the magnetic shift register 10 to move domain 31 over, and in alignment with the writing device 15. All the domains in the data region 35 move when the current is applied to the magnetic shift register 10.

The movement of the domains is controlled by both the magnitude and direction of the current, and the time over which the current is applied. In one embodiment, one current pulse of a specified shape (magnitude versus time) and duration is applied to move the domains in the storage region in one increment or step. A series of current pulses are applied to move the domains the required number of increments or steps. Thus, a shifted portion 205 (FIG. 2B) of the data region 35 is pushed (shifted or moved) into the reservoir region 40.

The direction of motion of the domains within the data track 11 depends on the direction of the applied current. The length of the current pulse can be in the range of a few hundred picoseconds to tens of nanoseconds and will depend on the magnitude of the current. The larger the magnitude of the current the shorter the length of the current pulse needed. The shape of the current pulse (i.e. the detailed dependence of current versus time in the pulse) may also be adjusted for the optimal motion of the domain walls. The current pulse shape must be designed properly, in conjunction with the detailed specifics of the ferromagnetic material in the track, such that the domain walls are moved from one position to the next position without having so much energy or momentum that they move beyond the next most position.

To read data in a specific domain, such as domain 25, additional current is applied to the magnetic shift register 10 to move domain 25 over, and in alignment with, the reading device 20. A larger shifted portion of the data region 35 is pushed (shifted or moved) into the reservoir 40.

The reading device 20 and writing device 15 shown in FIGS. 1 and 2 form part of a control circuit that defines a reference plane in which the reading device 20 and writing device 15 are arrayed. In one embodiment, the magnetic shift register 10 stands vertically out of this reference plane, largely orthogonal to this plane.

To operate the magnetic shift register 10, the control circuit comprises, in addition to the reading element 20 and writing element 15, logic and other circuitry for a variety of purposes, including the operation of the reading element 20 and writing element 15, the provision of current pulses to move the domains within the magnetic shift register 10, and the means of coding and decoding data in the magnetic shift register 10. In one embodiment the control circuit is fabricated using CMOS processes on a silicon wafer. The magnetic shift registers 10 are preferably designed to have a small footprint on the silicon wafer so as to maximize the storage capacity of the memory device while utilizing the smallest area of silicon to keep the lowest possible cost.

In the embodiment shown in FIG. 1 the footprint of the magnetic shift register 10 is determined largely by the area of the wafer occupied by the reading elements 20 and writing elements 15. Thus, the magnetic shift register 10 is comprised of data tracks 11 extending largely in the direction out of the plane of the wafer. The length of the data tracks 11 in the vertical direction determines the storage capacity of the magnetic shift register 10. Since the vertical extent can be much greater than the extent of the data track 11 in the horizontal direction, hundreds of magnetic bits can be stored in the magnetic shift register 10 while the area occupied by the magnetic shift register 10 in the horizontal plane is very small. Thus, the magnetic shift register 10 can store many more bits for the same area of silicon wafer as compared to conventional solid-state memories.

Although the data tracks 11 of the magnetic shift register 10 are shown as being largely orthogonal to the plane of the reading element 20 and writing element 15 (the circuitry plane), these data tracks 11 can also be inclined, at an angle, to this reference plane, as an example, for the purpose of greater density or for ease of fabrication of these devices.

Figure 3:
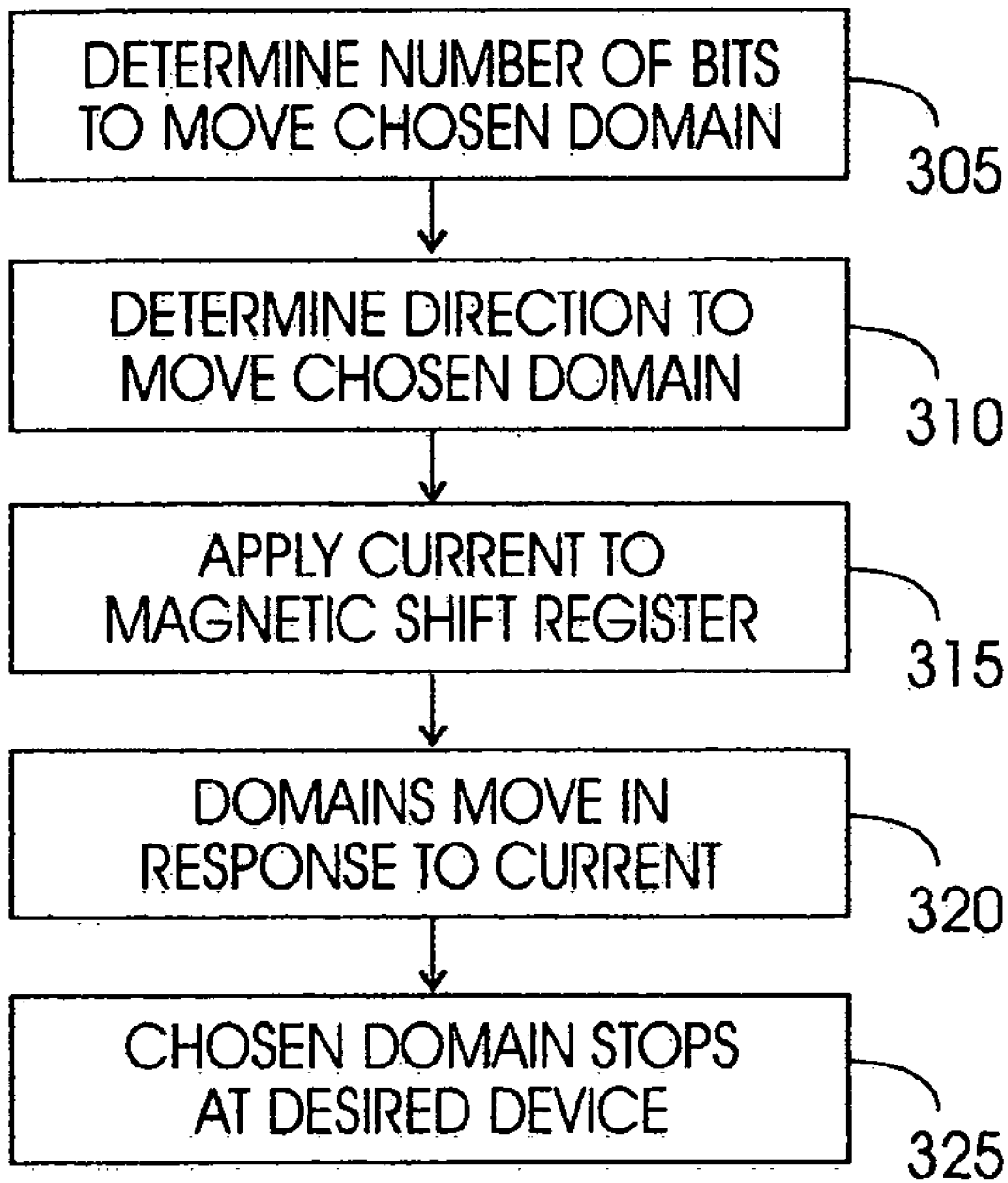
FIG. 3 is a process flow chart illustrating a method of operation of the magnetic shift register of FIG. 1.

A method 300 of operating the magnetic shift register 10 is illustrated in FIG. 3, with further reference to FIG. 2 (FIGS. 2A, 2B, and 2C). With reference to FIG. 2A, the memory system 100 determines, at block 305, the number of bits required to move domain 25 to either the writing device 15 or reading device 20. The memory system 100 also determines the direction required to move domain 25 in block 310. In FIG. 2A, domain 25 is on the left of the writing device 15 and the reading device 20. A positive current 45 can be required to move domain 25 to the right, for example, while a negative current 45 can be required to move domain 25 to the left.

The memory system 100 then applies the desired current 45 to the magnetic shift register 10 at block 315. Current 45 can be one pulse or a series of pulses, moving the domain 25 one bit at a time. It is also possible to vary the length of duration or the magnitude of the current within the pulse or the pulse shape (current versus time within the pulse) to cause the domain 25 within the data region 35 to move by several increments during the application of one pulse. The domains in the data region 35 move in response to the current 45 in block 320. Domain 25 stops at the desired device, i.e., the writing device 15 or the reading device 20 (block 325).

With reference to FIG. 4 (FIGS. 4A, 4B), an alternative magnetic shift register 10A can be similar to the magnetic shift register 10 of FIGS. 1 and 2, but comprising alternating magnetic layers, to pin the possible locations of the domains within the magnetic shift register 10A. Pinning the possible locations of the domains prevents the designated domains from drifting.

The magnetic layers can be comprised of various ferromagnetic or ferrimagnetic materials where these magnetic materials are chosen appropriately based primarily on the magnitude of their magnetization (magnetic moment per unit volume), exchange parameter, magnetic anisotropy, and damping coefficient. The choice of these materials is also influenced by their manufacturability and compatibility with the process used to fabricate the magnetic shift register.

As shown in region 405 of the magnetic shift register 10A, one type of magnetic material can be used for domains 410, 420, while a different type of magnetic material can be used for alternating domains 415, 425. In another embodiment, multiple types of magnetic materials can be used, in varying order of materials.

The introduction of different ferromagnetic layers in the magnetic shift register 10A creates local energy minima, similar to "potential wells", so that the domain walls between domains of opposite polarity will align themselves with the boundaries between the alternating ferromagnetic layers 410, 415, etc. Thus, the extent and size of the domains are determined by the thicknesses of the magnetic layers.

A current pulse 45 applied to the magnetic shift register 10A causes the domains 410, 415, 420, 425 within the region 405 to move in the direction of the current 45. However, unless the current pulse 45 is of sufficient amplitude and duration, the domains 410, 415, 420, 425 may not move past the boundaries between the two different types of magnetic material. Consequently, the data region 35 can be moved one bit at a time, and the domains are not allowed to drift past their desired positions.

In addition to pinning the possible locations of the domains, using different layers of magnetic material also allows higher tolerances for current amplitude and pulse duration. In this embodiment, the portion of the magnetic shift register 10A that passes over the writing device 15 and the reading device 20 can be a homogeneous magnetic material as illustrated in FIG. 4C or layers of different magnetic materials as illustrated in FIG. 4A.

The length of the alternating magnetic regions 410, 420, etc. and 415, 425 etc. can be different. Moreover, although it is preferred that the length of each type of magnetic region 410, 420, etc., and 415, 425, etc. be the same throughout the magnetic shift register 10A, this is not essential, and these lengths can vary somewhat throughout the magnetic shift register 10A. What is important is that the potential pins the domains in their defined positions against current induced motion induced by the current pulses.

With reference to FIG. 5 (FIGS. 5A, 5B), another magnetic shift register 10B that is made of homogeneous magnetic material can be made inhomogeneous by physically varying the width or the area of the data track 11. Local energy minima can be created within the magnetic shift register 10B by physically shaping the magnetic shift register 10B.

In the shaping approach of FIG. 5, indentations, such as indentations 505, 506, are introduced in the ferromagnetic material of the magnetic shift register 10B. The indentations 505, 506 can either be open or filled with a material that can be metallic or insulating.

In one embodiment, these indentations 505, 506 can be placed at a uniform spacing. In another embodiment, the spacing between these indentations 505, 506 can be non-uniform along the length of the magnetic shift register 10B. The indentations 505, 506 are aligned with each other on either side of the data track 511.

It may be convenient to fabricate a magnetic shift register with indentations on only one side of the data track 511. Since these indentations 505, 506 are used to pin the domain walls, only one indentation on one side of the data track 511 can provide a sufficient pinning potential. Indentations can be situated on one or two or more of any of the four sides of the data track 511 shown in FIG. 5. The indentations can also be alternated from one side to another side for successive pinning sites along the track for ease of fabrication (e.g. to make a denser set of pinning sites along the track than is possible by having all the indentations arranged on a single side of the track).

In another embodiment, the indentations 505, 506 are replaced with extrusions where the width of the data track 511 is locally increased and not decreased. What is required is a means of pinning the domains by changing the local potential for the domain walls.

In yet another embodiment, the width or area of the data track 511 is alternated in successive regions so that the data track 511 is comprised of regions of alternating widths or areas.

The magnetic shift register 10B does not need to be uniformly filled with indentations or extrusions or alternating magnetic regions along its length. The magnetic shift register 10B need only be filled with a sufficient number of such pinning sites such that the data region 35 moves by only one, or a specified number of increments per current pulse. For example, only one pinning site per N domains can be sufficient where N can be more than one.

The reservoir 40 may or may not include these indentations. A bottom section 510 of the magnetic shift register 10B that crosses the writing device 15 and the reading device 20 may or may not include these indentations 505, 506.

In a further embodiment, the magnetic shift register 10B is made of a combination of different ferromagnetic materials with indentations 505, 506, combining the features of magnetic shift register 10A and 10B.

In general, the data track 11 of the magnetic shift register 10 is fabricated by forming a multilayered stack comprising layers of alternating silicon and/or dielectric materials. Vias having a height of approximately 0.5 to 10 microns with a cross-section on the order of 100 nm by 100 nm are etched in this multi-layered stack of alternating silicon or dielectric layers. Although dimensions are provide throughout, it should be understood that these dimensions are given for exemplary purposes only and the present invention is not limited to the values or dimensions. For example, the height of the vias can range between approximately 0.5 microns and approximately 10 microns. The cross-section of the vias can range between approximately 10 nm by 10 nm and approximately 1 micron by 1 micron. These vias are then filled with ferromagnetic or ferrimagnetic material to form data region 35 and reservoir 40 of the data track 11 of the magnetic shift register 10 of FIG. 1.

The vias can have a cross-section that is elliptical, rectangular, or square. In the case of a single layer of silicon fabricating techniques exist for creating vias of these dimensions based on trench capacitors used by DRAMs. Conventional techniques for fabricating these trench capacitors have achieved dimensions of approximately 1 to 10 microns deep and approximately 0.1 microns in cross-section. Reference is made to U.S. Pat. Nos. 6,544,838; 6,284,666; 5,811,357; and 6,345,399, which are incorporated herein by reference. These fabrication techniques are used to fabricate data track 11 of the magnetic shift register 10, illustrated in FIGS. 6, 7, 8, 9, 10, 11, 12, and 13.

FIG. 6 (FIGS. 6A, 6B, 6C, 6D) illustrates an embodiment of the formation of the bottom of data track 11, central region 42. An insulator 605 such as, for example, silicon dioxide or silicon nitride is formed with a thickness of approximately 300 nm. Photoresist is applied to insulator 605 and patterned in the form of a rectangle 610. Using standard etching techniques, rectangle 610 is etched to a depth of approximately 200 nm to form trench 615. Reference is made to U.S. Pat. No. 6,051,504 for additional details on the process of silicon nitride etching, and U.S. Pat. No. 5,811,357 for additional details on the process of silicon dioxide etching, which are incorporated herein by reference.

Figure 6A:
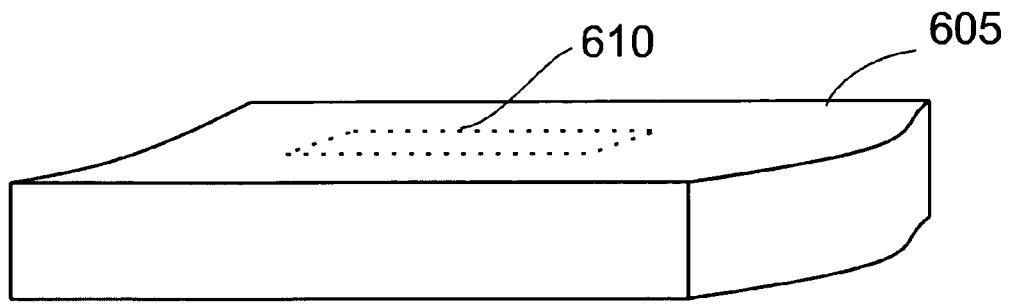
FIG. 6 is comprised of FIGS. 6A, 6B, 6C and 6D and represents a diagram illustrating the formation of the bottom region of a data track of the magnetic shift register of FIG. 1.
Figure 6B:
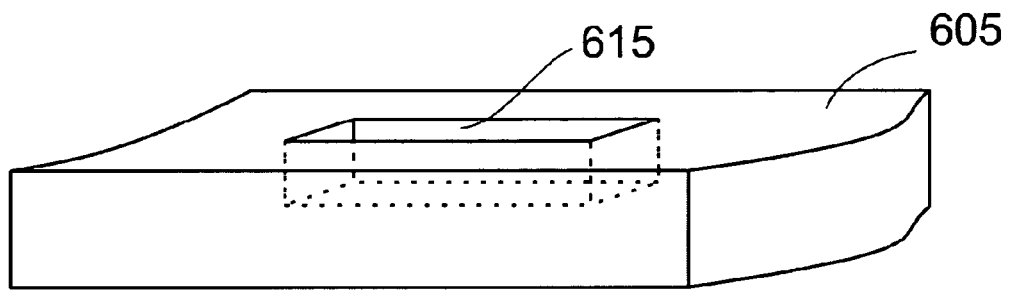
Figure 6C:
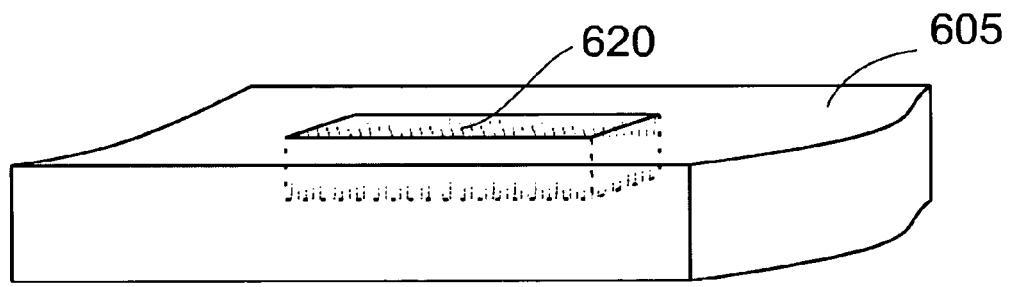
Figure 6D:
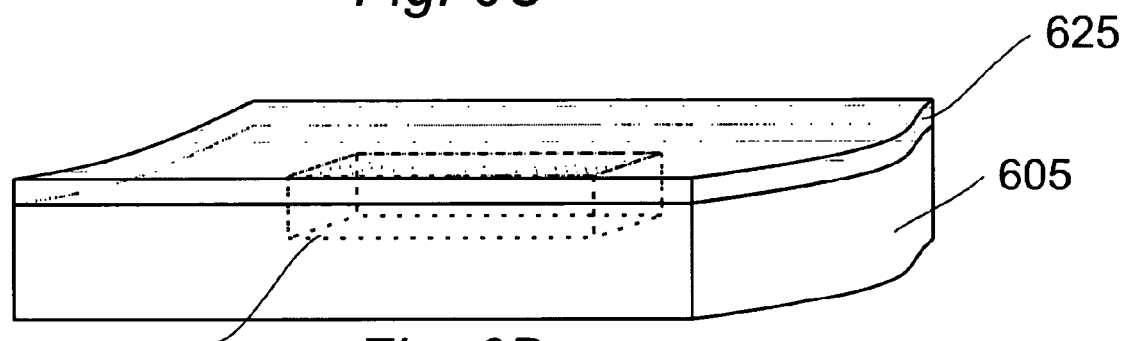

Trench 615 is filled with a material in FIG. 6C to form block 620. Block 620 can comprise a homogeneous magnetic material selected, for example, from the group comprising ferromagnetic materials and ferrimagnetic materials, and corresponding to central region 42. In this case, block 620 is planarized and polished. Exemplary ferromagnetic or ferrimagnetic materials used in block 620 are a permalloy, a nickel-iron alloy, a cobalt-iron alloy, an alloy formed from one or more of Ni, Co and Fe, an alloy formed from one or more of Ni, Co and Fe plus other elements, for example, B, Zr, Hf, Cr, Pd, Pt, etc. Alternatively, block 620 can be formed from an inhomogeneous magnetic material, for example, comprising alternating regions of different ferromagnetic or ferrimagnetic metals, similar to those, for example, shown as regions 410, 420, and 415, 425 in FIG. 4A. These regions can be formed by additional processing steps not shown in FIG. 6, which might include additional lithography, patterning, etching, material deposition using, for example, plating or sputter deposition or CVD, and planarizing steps. Alternatively, block 620 can comprise a sacrificial material that will later be etched away. The sacrificial material may be formed by low-pressure chemical vapor deposition, followed by chemical mechanical polishing for planarization.

A thin layer of dielectric 625, for example, silicon nitride, may then be deposited on top of insulator 605, serving as a bottom capping layer, to protect the trench, if needed, during subsequent process steps. The thickness of the bottom capping layer ranges between approximately 10 and 500 nm. The bottom capping layer 625 can be made of silicon nitride, silicon oxide, or any other suitable dielectric. In another embodiment, the bottom capping layer 625 might not be necessary.

Figure 7:
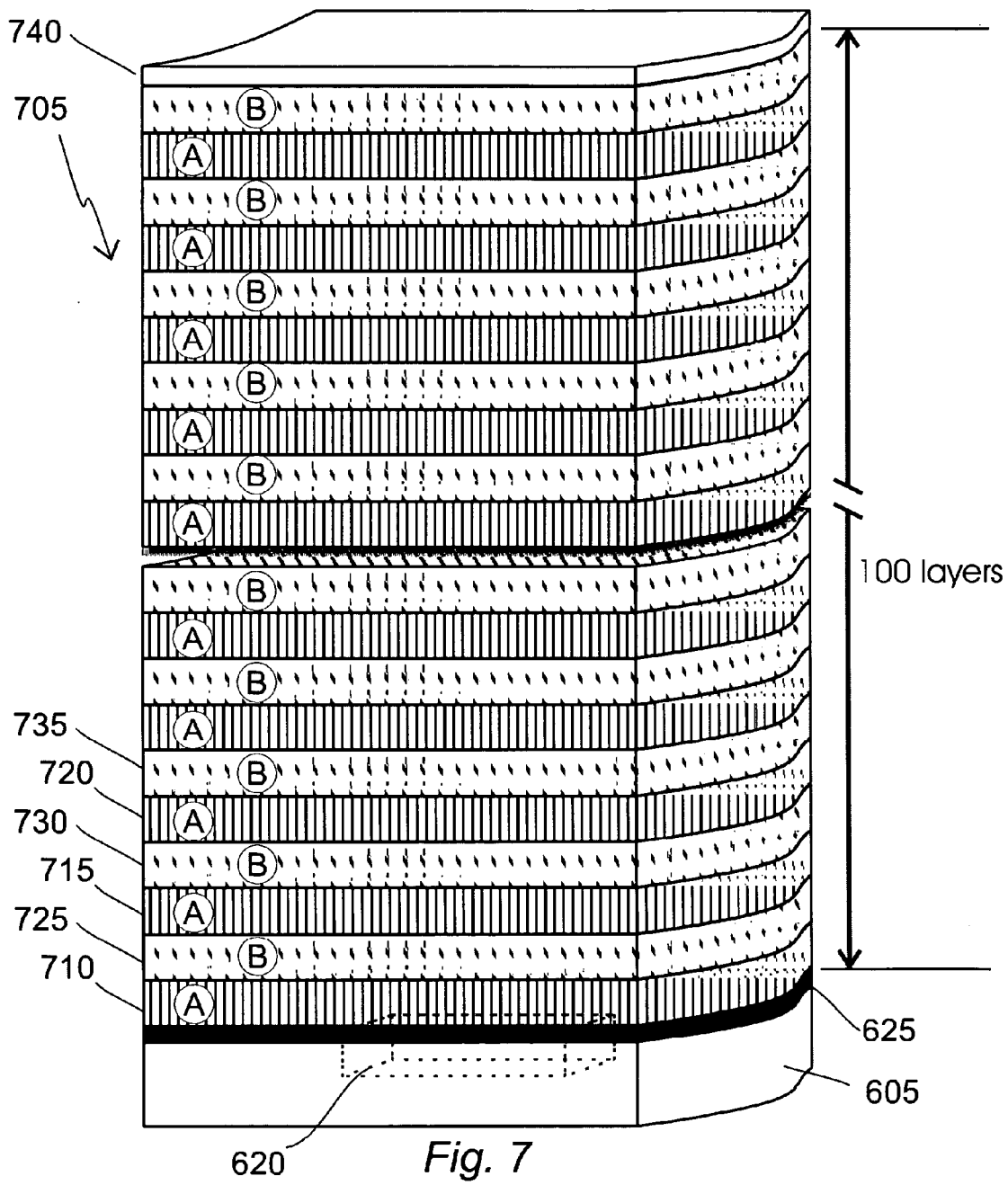
FIG. 7 is a diagram illustrating the formation of a multi-layer stack structure in which the data region and reservoir of the data track in the magnetic shift register of FIG. 1 can be formed.
Figure 8A:
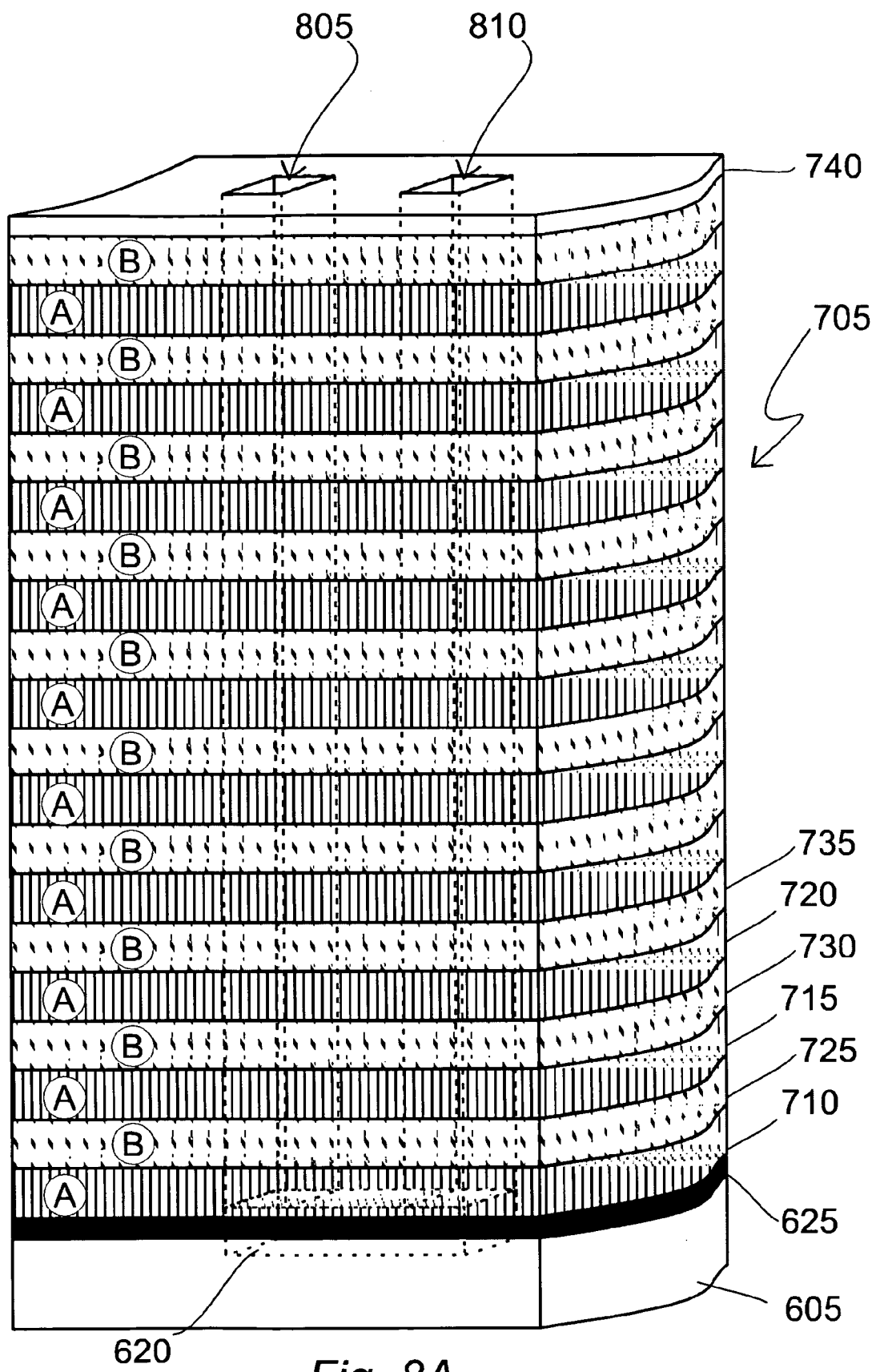
FIG. 8 is comprised of FIGS. 8A, 8B, 8C, 8D, and 8E and represents a diagram illustrating the formation of vias in the multi-layer stack structure for filling with ferromagnetic or ferrimagnetic material to form the data region and reservoir of the magnetic shift register of FIG. 1.
Figure 8B:
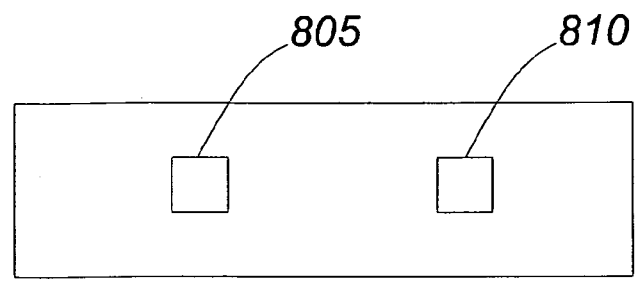
Figure 8C:
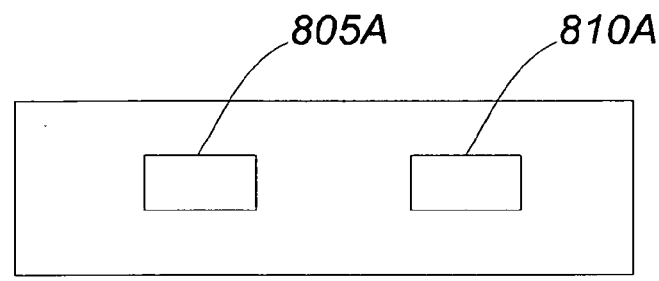
Figure 8D:
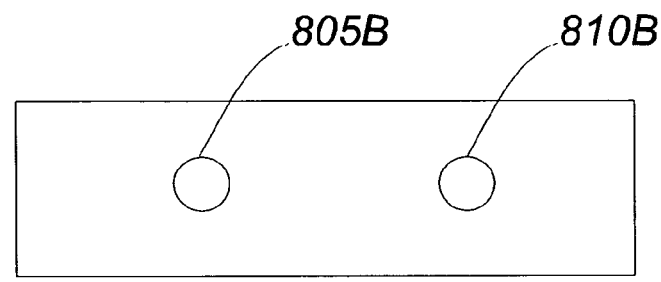
Figure 8E:
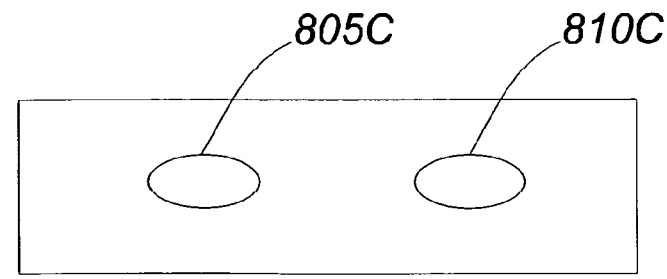

FIG. 7 illustrates the fabrication of a structure in which two vias can be formed, creating data region 35 and reservoir 40 of the data track 11. A multi-layer stack structure 705 is formed of alternating silicon/dielectric or dielectric/dielectric materials (referred to as materials A and B). The materials A and B are chosen for their etching properties. In a preferred embodiment, material A is comprised of silicon dioxide ($SiO_2$) and material B is comprised of silicon (Si). Alternatively, material A comprises silicon dioxide while material B comprises silicon nitride ($Si_3N_4$).

In the example of FIG. 7, a first set of layers such as layers 710, 715, 720 are formed of material A, for example, silicon dioxide. A second set of layers such as layers 725, 730, 735 are formed of a material B, for example, silicon or silicon nitride. The first and second set of layers can be formed using various techniques. For example, polycrystalline silicon layers may be formed using low-pressure chemical vapor deposition or amorphous silicon layers may be formed by sputter deposition. A thin layer of dielectric, for example, silicon nitride, may be deposited on top of the multi-layer stack structure 705, serving as an upper capping layer 740. The thickness of the upper capping layer 740 ranges between approximately 10 and 500 nm. The upper capping layer can be made of silicon nitride, silicon oxide, or any other suitable dielectric.

Material A and material B can be selected with different etch rates, allowing the formation of notches or protuberances in the walls of the vias. While shown of equal thickness in FIG. 7, layers formed of material A and material B can have different thicknesses.

The multi-layer stack structure 705 can comprise, for example, approximately 100 layers of alternating layers of material A and material B for a total thickness, for example, of approximately 0.5 to 10 microns or more. The thicknesses of the materials A and material B that form, for example, layers 710, 715, 720, 725, 730, 735 correspond to domain wall separations in data region 35 or reservoir 40 of the data track 11.

Material A or material B are etched to form notches or protuberances. The thickness of one material represented, for example, by material A, can correspond to the separation between domain walls in the data track 11. The other material represented, for example, by material B, will form the notches or protuberances in data region 35 or reservoir 40 of the of the data track 11. Such a configuration for data track 11 is illustrated by FIG. 5. Although the layers A and layers B represented by layers 710, 715, 720, 725, 730, 735 are shown of equal thicknesses, in practice they can be of very different thicknesses. The width of each notch or protuberance can range between approximately 5 nm and 100 nm.

FIG. 8 (FIGS. 8A, 8B, 8C, 8D, 8E) illustrates the formation of vias 805, 810 in the multi-layer stack structure 705. In an embodiment utilizing silicon as material B (i.e., layers 725, 730, 735), the sidewall of vias 805, 810 is oxidized to form a thin insulator layer of silicon dioxide (with a thickness ranging between approximately 3 nm and 30 nm). Vias 805, 810 can be filled with a homogeneous ferromagnetic or ferrimagnetic material to form data region 35 and reservoir 40 of the data track 11. A cross-section view of the multi-layer stack structure 705 taken perpendicular to the vias 805, 810 is shown in FIG. 8B illustrating the square cross-section of the vias 805, 810. Vias 805, 810 may be formed with various other cross-sections, for example, a rectangular cross-section as indicated by vias 805A, 810A shown in FIG. 8C, a circular cross-section as indicated by vias 805B, 810B in FIG. 8D, and an elliptical cross-section as indicated by vias 805C, 810C shown in FIG. 8E.

Figure 9:
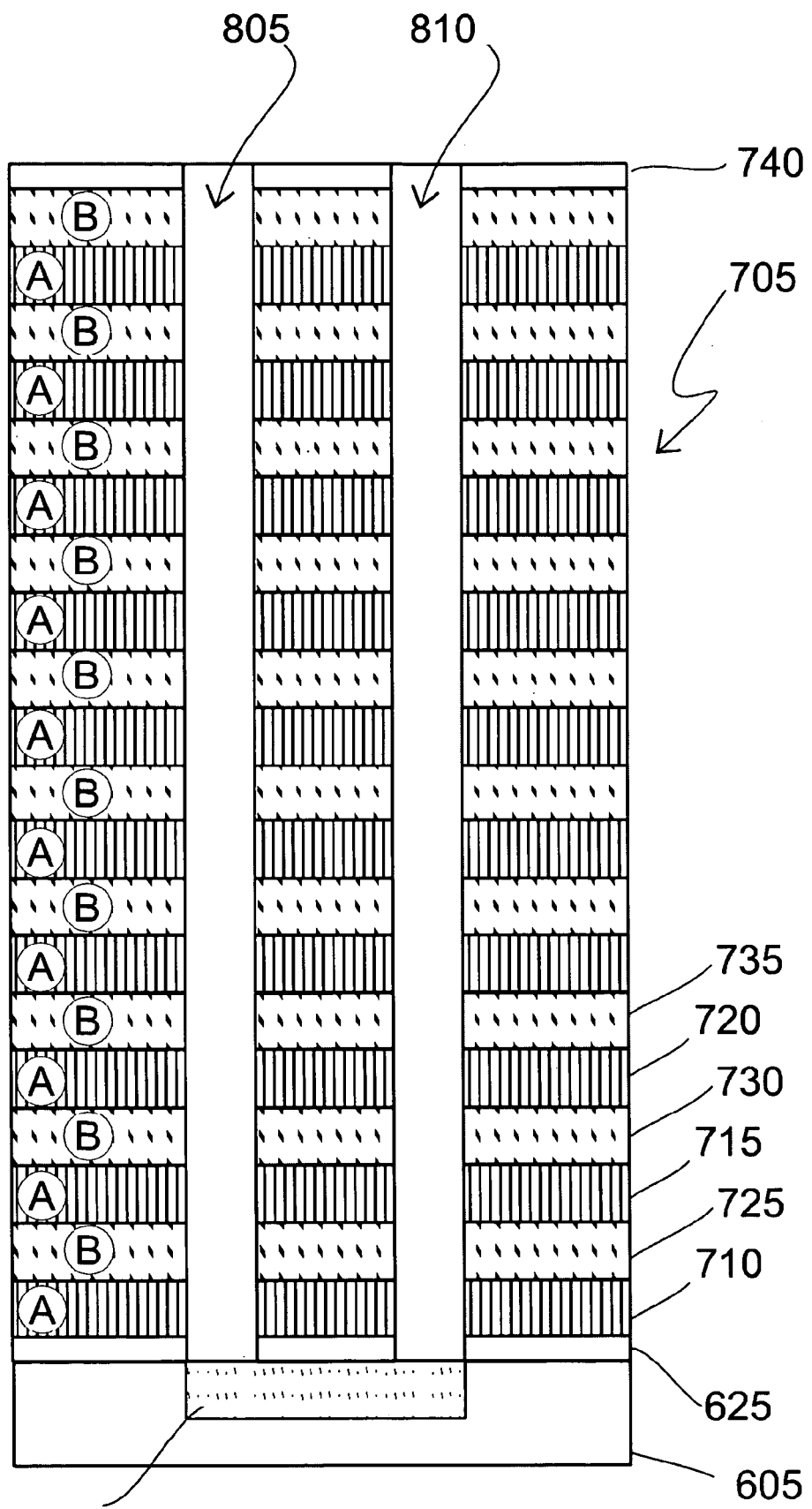
FIG. 9 is a cross-sectional diagram illustrating vias etched with planar smooth walls from the top of the multi-layer stack structure of FIG. 7 to the bottom region of FIG. 6.

As illustrated by the cross-sectional view of FIG. 9, vias 805, 810 are etched through the multi-layer stack structure 705 to block 620 in insulator 605. In the example of FIGS. 8 and 9, vias 805, 810 are formed with planar smooth walls by the process of etching the via. In an embodiment in which material B (i.e., layers 725, 730, 735) is comprised of silicon, vias 805, 810 may be formed by alternating the dry etching process between a process which is selective for silicon as compared to silicon dioxide and a process which is selective for silicon dioxide as compared to silicon. The term "selective" is used to indicate that the etchant etches the first material faster than the second material. In other words, in the dry etching process for silicon selective to silicon dioxide, silicon is etched at a faster rate than silicon dioxide in order to gain better etching control. Reference is made to U.S. Pat. Nos. 6,544,838 and 6,284,666 for more details on the dry etching process for silicon selective to silicon dioxide, which patents are incorporated herein by reference. Reference is made to U.S. Pat. Nos. 6,294,102 and 5,811,357 for more details on the dry etching process for silicon dioxide selective to silicon, which patents are incorporated herein by reference.

When material A is formed of silicon oxide and material B is formed of silicon nitride vias 805, 810 can similarly be formed by alternating the dry etching process, successively, between a process which etches silicon nitride preferentially over silicon oxide (reference is made to U.S. Pat. Nos. 6,461,529 and 6,051,504, which are incorporated herein by reference) and a process which etches silicon dioxide preferentially over silicon nitride (reference is made to U.S. Pat. Nos. 6,294,102 and 5,928,967, which are incorporated herein by reference). If block 620 is comprised of a metal such as a ferromagnetic or ferrimagnetic material, the etchant will not likely substantially etch into the material of block 620. Formation of the vias 805, 810 is followed by etching the capping layer 625 to open the contact to the bottom section of homogeneous ferromagnetic or ferrimagnetic material, block 620.

Prior to the etching of the vias 805, 810, the capping layer 740 is etched using an appropriate etchant or the capping layer 740 may be etched using one of the etchants for layer A or B depending on these material constituents and that of layer 740. The capping layer 740 may be used, for example, to prevent oxidation of the topmost layer of the multi-layer stack structure of alternating silicon and/or dielectric layers when the top layer in this stack is comprised of silicon.

FIG. 10 (FIGS. 10A, 10B, 10C, 10D, 10E) illustrates the effect of using a selective wet etching process after vias 805, 810 are formed. The multi-layer stack structure 705 is illustrated in FIG. 10 (FIGS. 10A, 10B, 10C, 10D, 10E) without the capping layer 740 or substrate capping layer 625. By using a selective wet etching process, material A and material B can be etched at different rates. As an example, a hydrofluoric acid (HF) based chemical (for example, buffered or diluted HF) can be used for wet-etching silicon dioxide selective to both silicon oxide and silicon nitride, and phosphoric acid $H_3PO_4$ based chemical can be used for wet-etching silicon nitride selective to silicon dioxide.

Etching material A and material B at different rates forms regular variations in the cross-section of vias 805, 810. When filled with ferromagnetic or ferrimagnetic material, the variations in the cross-sections of the vias 805, 810 produce protuberances or notches in data region 35 or reservoir 40 of the data track 11. The protuberances or notches in the magnetic material track 11 can be used to pin magnetic domain walls in data region 35 and reservoir 40. The configuration of notches or protuberances in vias 805, 810 is selected for optimum performance of the data track 11 in the magnetic shift register 10. In particular, the length and depth of the notches or protuberances and their shape can be varied to vary the pinning potential of the domain walls.

Figure 10A:
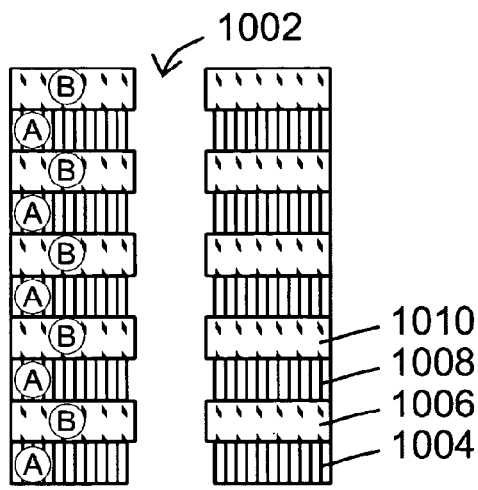
FIG. 10 is comprised of FIGS. 10A, 10B, 10C, 10D, and 10E and represents the effect of using a selective etching process on the walls of the vias, creating vias with regular variations in cross-section.

FIG. 10A illustrates a cross-section of a portion of a via 1002 illustrating a selective etching process with material A (represented by layers 1004, 1008) etched faster than material B (represented by layers 1006, 1010). When via 1002 is filled with ferromagnetic or ferrimagnetic material, layers 1004, 1008 form protuberances while layers 1006, 1010 form notches in data region 35 or reservoir 40 of data track 11.

Figure 10B:
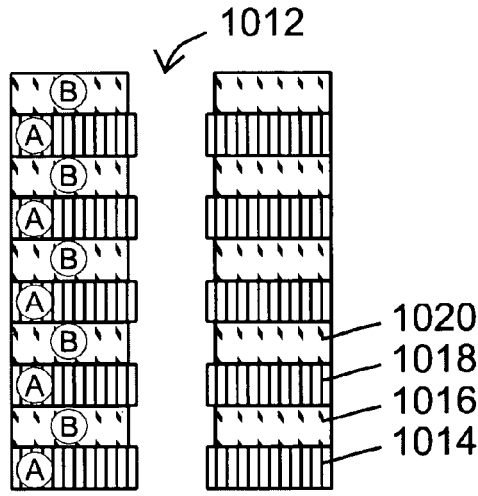

FIG. 10B illustrates a cross-section of a portion of a via 1012 where material A (represented by layers 1014, 1018) etches slower than material B (represented by layers 1016, 1020). When via 1012 is filled with ferromagnetic or ferromagnetic material, layers 1014, 1018 form notches while layers 1016, 1020 form protuberances in data region 35 or reservoir 40 of data track 11.

Figure 10C:
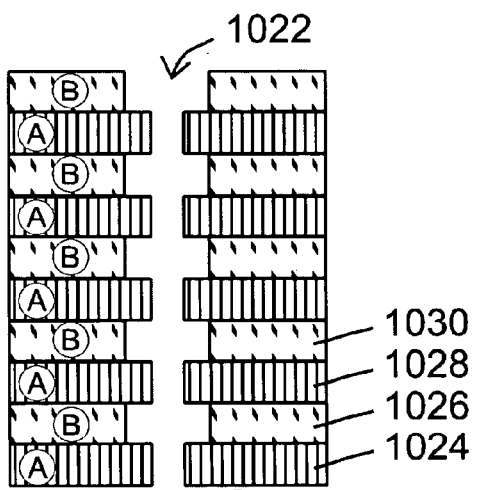

Material A, material B, and the etching process can be selected to provide shallow notches, as illustrated in FIGS. 10A and 10B, or deeper notches, as illustrated by via 1022 in FIG. 10C. Material B (represented by layers 1026, 1030) etches much faster than material A (represented by layers 1024, 1028).

Figure 10D:
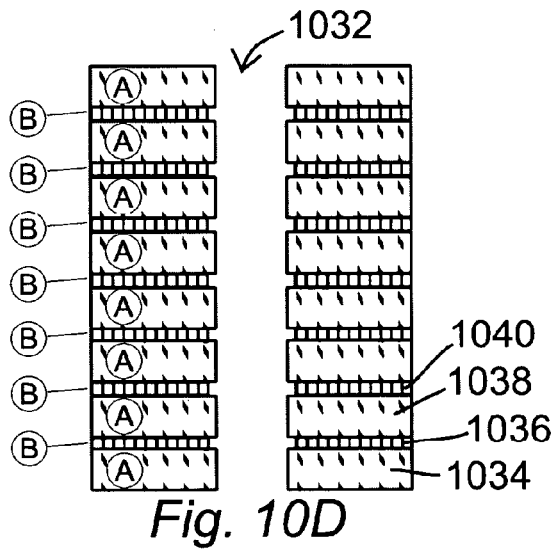
Figure 10E:
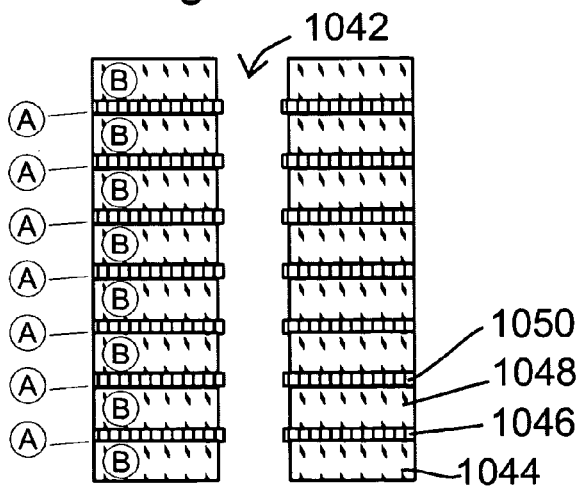

The thicknesses of layers of material A and material B can also be varied, as illustrated by FIGS. 10D and 10E. FIG. 10D illustrates a cross-section of a via 1032 in which layers of material A (represented by layers 1034, 1038) are thicker than layers of material B (represented by layers 1036, 1040). When via 1032 is filled with ferromagnetic or ferromagnetic material, layers 1036, 1040 form thin protuberances while layers 1034, 1038 form wide notches in data region 35 or reservoir 40 of data track 11.

FIG. 10E illustrates a cross-section of a via 1042 in which layers of material A (represented by layers 1046, 1050) are thinner than layers of material B (represented by layers 1044, 1048). When via 1042 is filled with ferromagnetic or ferromagnetic material, layers 1046, 1050 form thin notches while layers 1044, 1048 form wide protuberances in data region 35 or reservoir 40 of data track 11.

Figure 11A:
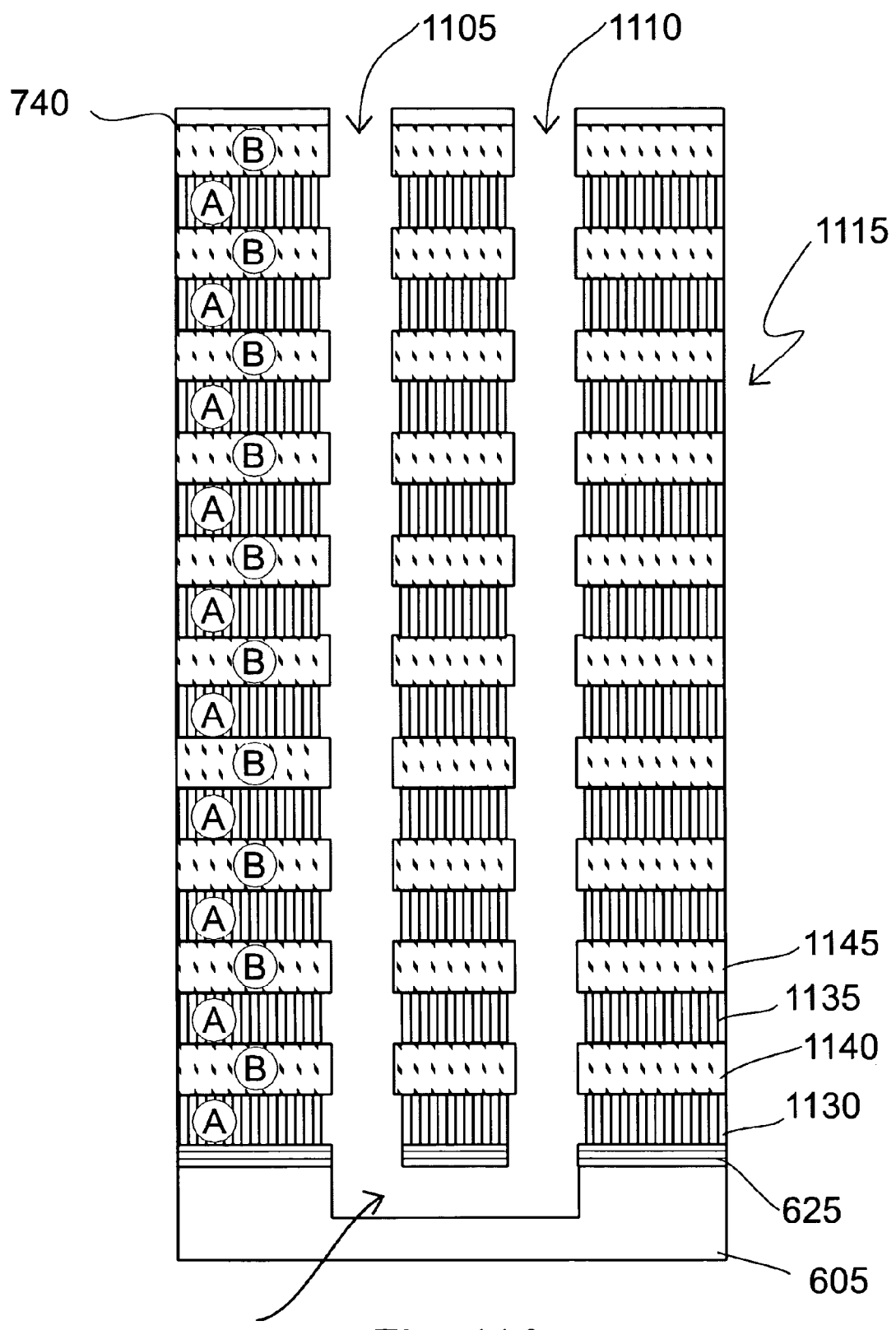
FIG. 11 is comprised of FIGS. 11A and 11B and illustrates a cross-section of a data track form which can be filled with magnetic material to fabricate the data track of the magnetic shift register of FIG. 1.
Figure 11B:
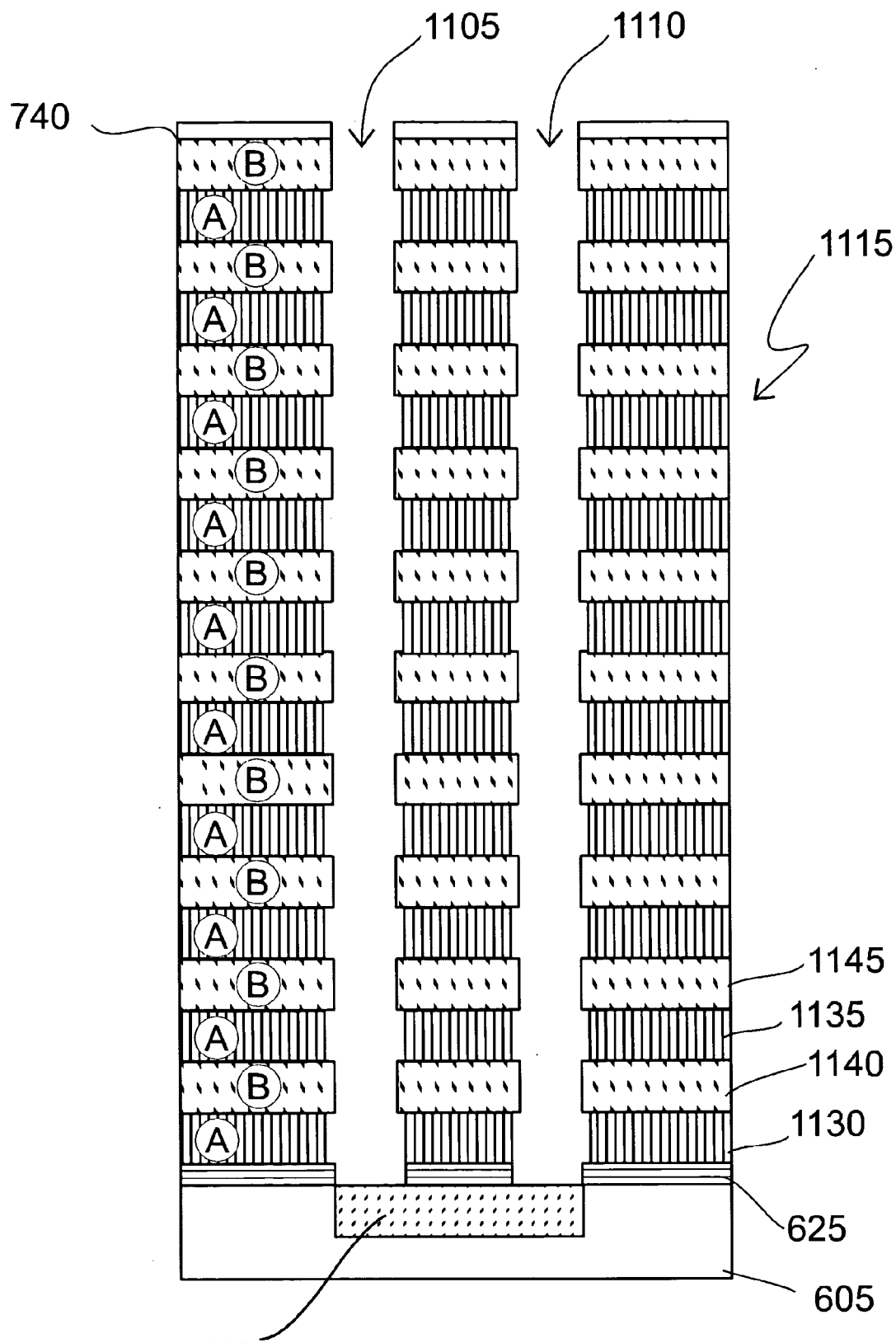

FIG. 11 (FIGS. 11A, 11B) illustrates a cross-section of a form for the data track 11 comprising vias 1105, 1110 (etched in multi-layer stack structure 1115) and trench 1120. To produce the trench 1120, block 620 is filled with a sacrificial dielectric material (FIG. 6). This material is etched away when vias 1105, 1110 are formed. In an alternate embodiment shown in FIG. 11B, block 620 comprises ferromagnetic or ferrimagnetic material 1125 that remains after via 1105, 1110 are created.

As illustrated by FIG. 11A, material A (represented by layers 1130, 1135) etches at a faster rate than material B (represented by layers 1140, 1145). Consequently, the data track 11 formed by vias 1105, 1110 will have regularly spaced notches and protuberances and equally thick layers of material A and material B.

Figure 12A:
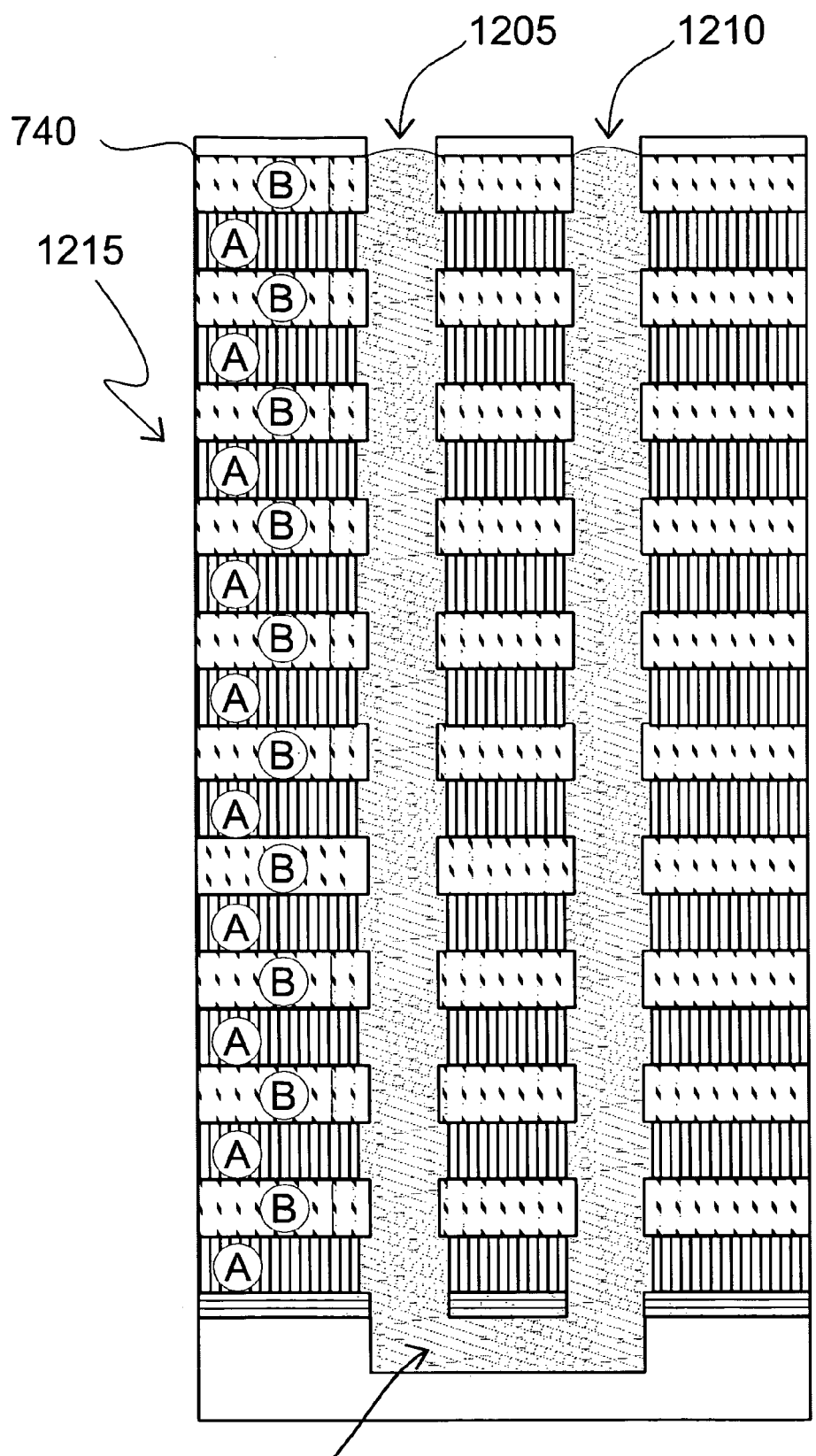
FIG. 12 is comprised of FIGS. 12A and 12B and illustrates a data track created by filling the vias and bottom trench with ferromagnetic or ferrimagnetic material.
Figure 12B:
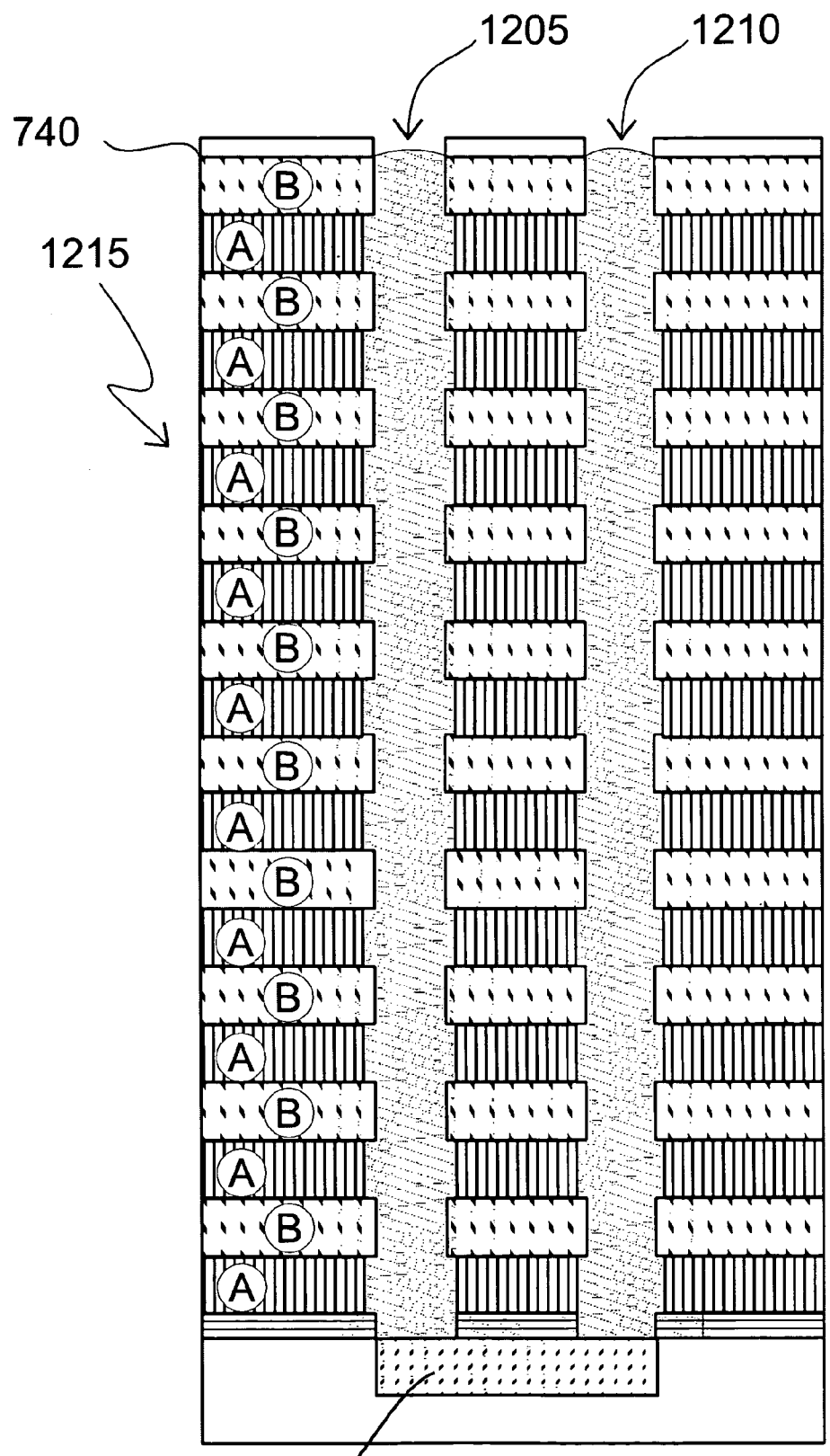

FIG. 12 (FIGS. 12A, 12B) illustrates a track 1215 created by filling vias 1105, 1110, and trench 1120 with ferromagnetic or ferrimagnetic material as indicated by filled vias 1205, 1210 and bottom region 1220. Filled via 1205 corresponds to data region 35, filled via 1210 corresponds to reservoir 40, and bottom region 1220 corresponds to central region 42.

Vias 1105, 1110 and trench 1120 can be filled by various methods, for example, electroless plating or electroplating. Reference is made to U.S. Pat. No. 3,702,263 for the process of electroless plating and to U.S. Pat. No. 4,315,985 for the process of electroplating, which patents are incorporated herein by reference. Alternatively, block 1125 can comprise a magnetic material such as ferromagnetic or ferrimagnetic material before vias 1105, 1110 are filled. The magnetic material of block 1125 may or may not be the same as that used to fill vias 1105, 1110. The metal of block 1125 can be used as a seed layer electrode for the electroless or electroplating process. It is more desirable to use an electroplating process because this is much faster than an electroless plating process. To carry out electroplating a contact must be provided to the seed layer electrode. This can be accomplished via a sacrificial wire or contact (not shown in the figure) or could be a very thin layer of metal, such as Al, which is deposited on the side wall of the vias 1105, 1110. After the plating process is completed the Al metal on the side walls can be oxidized to form aluminum oxide, which is insulating, by heating the track at a temperature in the vicinity of 300 C. For the case of FIG. 11A where the sacrificial layer was removed then a thin seed layer electrode may be deposited by a process, such as chemical vapor deposition, prior to filling the vias.

Figure 13:
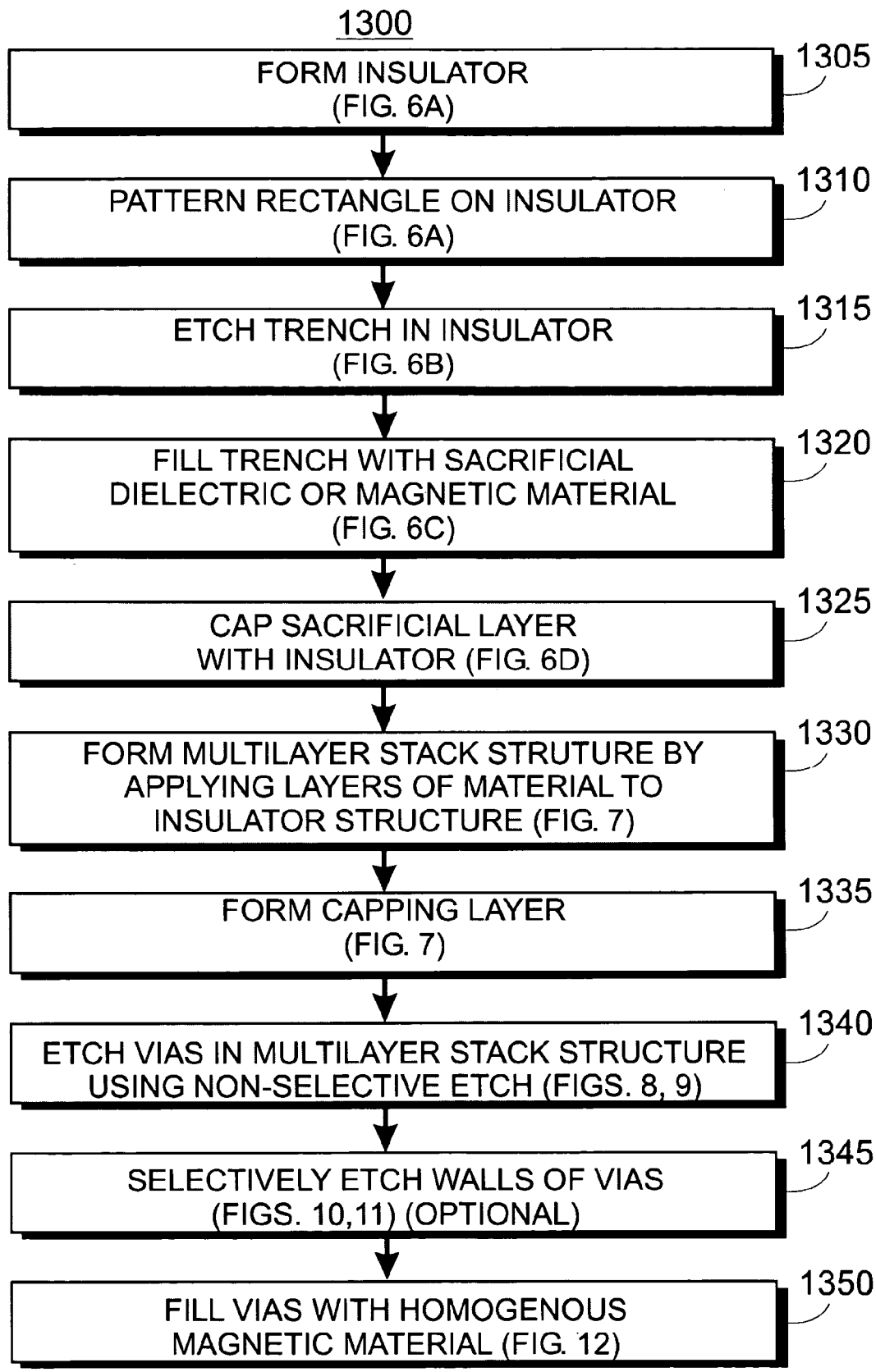
FIG. 13 is a process flow chart illustrating a method of fabricating a magnetic shift register of FIG. 1 with homogeneous magnetic material, as illustrated by FIG. 12.

A method 1300 for fabricating a track 1215 is illustrated by the process flow chart of FIG. 13. An insulator 605 is formed at step 1305 (FIG. 6A). At step 1310, a rectangle 610 is patterned on insulator 605 (FIG. 6A). Rectangle 610 is etched at step 1315 to form trench 615 (FIG. 6B). Trench 615 is filled with a sacrificial dielectric, ferromagnetic material, or ferrimagnetic material at step 1320 (FIG. 6C). The trench 62 is then preferably covered with a capping layer 625 in step 1325

Multiple layers of alternating materials A and B are applied to the insulator 605 in step 1330, forming multi-layer stack structure 705 (FIG. 7). The multi-layer stack structure 705 can comprise, for example, approximately 100 layers of alternating materials A and B for a total thickness, for example, of approximately 10 microns. The capping layer 740 is formed on top of the multi-layer stack structure 705 at step 1335.

Vias 805, 810 are non-selectively etched through the multi-layer stack structure 705 to block 620 at step 1340 (FIGS. 8, 9). If block 620 is filled with sacrificial dielectric material, the sacrificial dielectric material is also etched away in step 1340 (FIG. 11).

An optional selective etching process can be used at step 1345 to selectively etch one material faster than the other, forming notches and protuberances in the walls of vias 805, 810 (FIG. 10, 11). Vias 805, 810 are filled with ferromagnetic or ferrimagnetic material at step 1350 (FIG. 12), forming the data track 11 of the magnetic shift register 10.

Another embodiment of the fabrication of the data track 11 forms conductive pads in the lower insulator layer and the central region 42 is formed in the top layer of the multi-layer stack structure 705. This fabrication process is illustrated by FIGS. 14, 15, 16, 17, 18, 19, 20, 21, 22, and 23.

FIG. 14 (FIGS. 14A, 14B, 14C, 14D) illustrates the fabrication of conducting pads that will connect to data region 35 and reservoir 40 at the bottom of data track 11. An insulator 1405 such as, for example, silicon nitride or silicon dioxide is formed at a thickness of approximately 300 nm.

Photoresist is applied to insulator 1405 and patterned in the form of rectangles 1410, 1415. Using standard etching techniques, rectangles 1410, 1415 are etched to a depth of approximately 200 nm to form trenches 1420, 1425. Reference is made to U.S. Pat. No. 6,051,504 for the process of silicon nitride etching and U.S. Pat. No. 5,811,357 for the process of silicon dioxide etching, which patents are incorporated herein by reference.

Figure 14A:
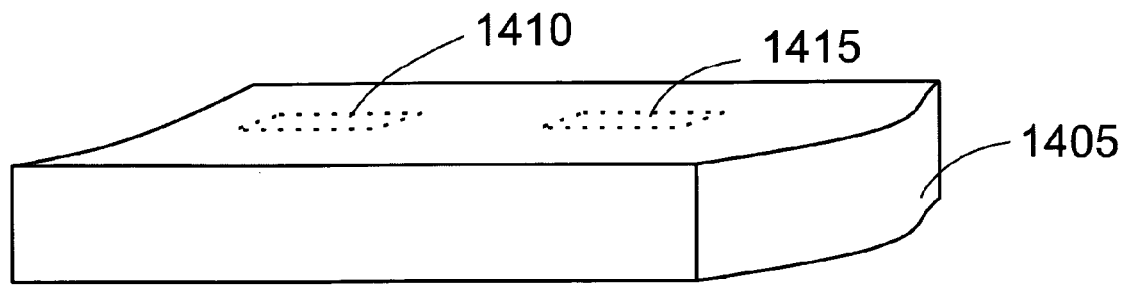
FIGS. 14A–D illustrates the fabrication of conducting pads that will connect to the data region and reservoir of the data track of the magnetic shift register of FIG. 1.
Figure 14B:
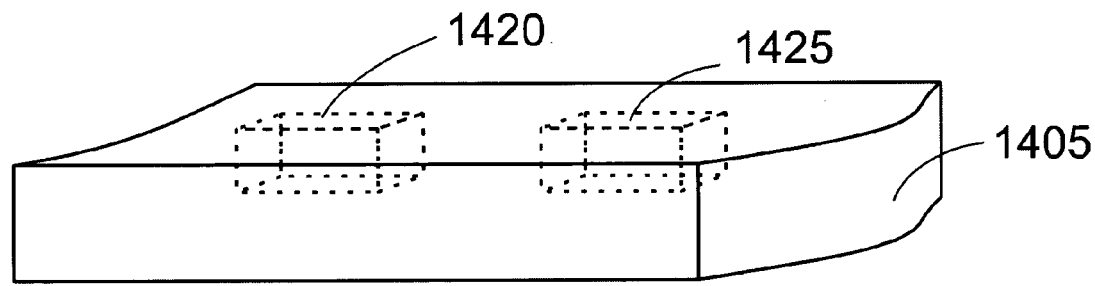
Figure 14C:
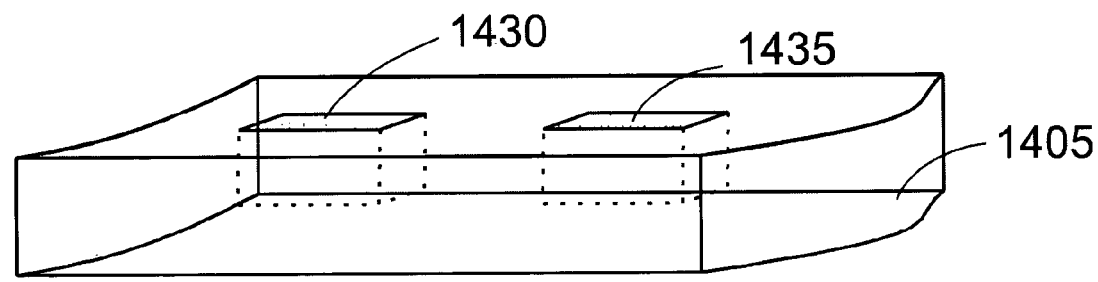
Figure 14D:
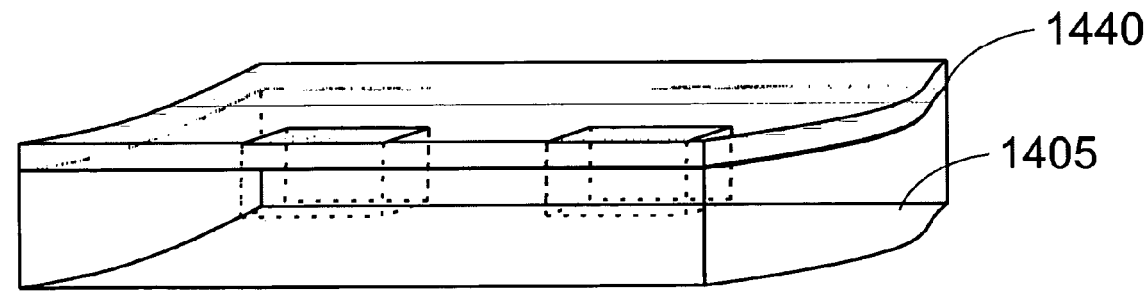

Trenches 1420, 1425 are filled with a material in FIG. 14C to form blocks or bottom pads 1430, 1435. Blocks 1430, 1435 can comprise a conductive material to form conductive pads at the bottom of data track 11. Exemplary conductive materials used in blocks 1430, 1435 are conducting silicon, copper, etc. Alternatively, blocks 1430, 1435 can comprise a sacrificial material that will later be etched away. The sacrificial material can be made, for example, of silicon dioxide. The sacrificial material is formed by low-pressure chemical vapor deposition, followed by chemical mechanical polishing for planarization. A thin layer of dielectric, for example, silicon nitride, is then deposited on top of insulator 1405, serving as a capping layer 1440. The thickness of the capping layer 1440 ranges between approximately 10 and 500 nm. The capping layer 1440 can be made of silicon nitride, silicon oxide, or any other suitable dielectric.

Figure 15:
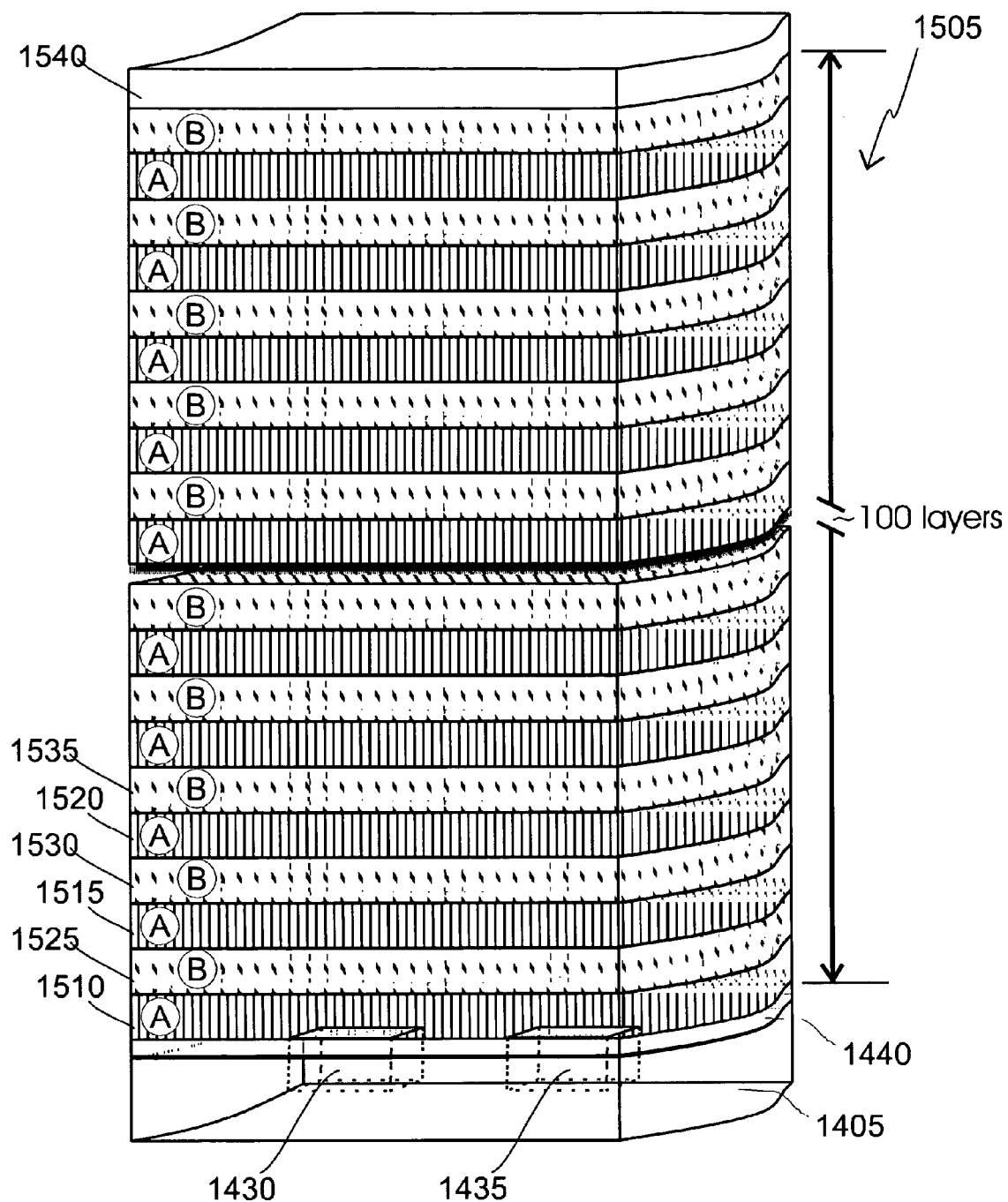
FIG. 15 illustrates the fabrication of a multi-layer stack structure in which two vias can be formed for creating the data region and reservoir of the magnetic shift register of FIG. 1.

FIG. 15 illustrates the fabrication of a structure in which two vias can be formed, creating data region 35 and reservoir 40 of the data track 11. A multi-layer stack structure 1505 is formed of alternating materials, material A and material B. Materials A and B are formed from silicon/dielectric or dielectric/dielectric materials. In a preferred embodiment, material A is comprised of silicon dioxide and material B is formed from silicon. The silicon can be formed as polycrystalline silicon by the process of low pressure chemical vapor deposition or can be formed from amorphous silicon by the process of sputter deposition. Alternatively, material A comprises silicon dioxide while material B comprises silicon nitride.

In the example of FIG. 15, a first set of layers such as layers 1510, 1515, 1520 are formed of material A, for example, silicon dioxide. A second set of layers such as layers 1525, 1530, 1535 are formed of material B, for example, silicon or silicon nitride. A thin layer of dielectric, for example, silicon nitride, is deposited on top of the multi-layer stack structure 1505, serving as a capping layer 1540. The thickness of the capping layer 1540 ranges between approximately 10 and 500 nm. The bottom capping layer 1540 can be made of silicon nitride, silicon oxide, or any other suitable dielectric.

Material A and material B can be selected with different etch rates, allowing the formation of notches or protuberances in the walls of the vias. While shown of equal thickness in FIG. 15, material A and material B can have different thicknesses.

The multi-layer stack structure 1505 can comprise, for example, approximately 100 layers of alternating material A and material B for a total thickness, for example, of approximately 10 microns. The thicknesses of the layers such as layers 1510, 1515, 1520, 1525, 1530, 1535 correspond to individual magnetic domains or as domain wall pinning sites in data region 35 or reservoir 40 of the data track 11.

Material A or material B are etched to form notches or protuberances. Although the layers such as layers 1510, 1515, 1520, 1525, 1530, 1535 are shown of equal thickness, in practice they can be of different thickness. The thickness of one material represented, for example, by material A, can correspond to the separation between domain walls in the data track 11. The other material represented, for example, by material B, will form the notches or protuberances in data region 35 or reservoir 40 of the data track 11. Such a configuration for the data track 11 is illustrated by FIG. 5. The domain walls can either be confined at the notches or protuberances or can be confined within the regions between the notches or protuberances depending on the magnetic properties of the material forming the track.

Figure 16:
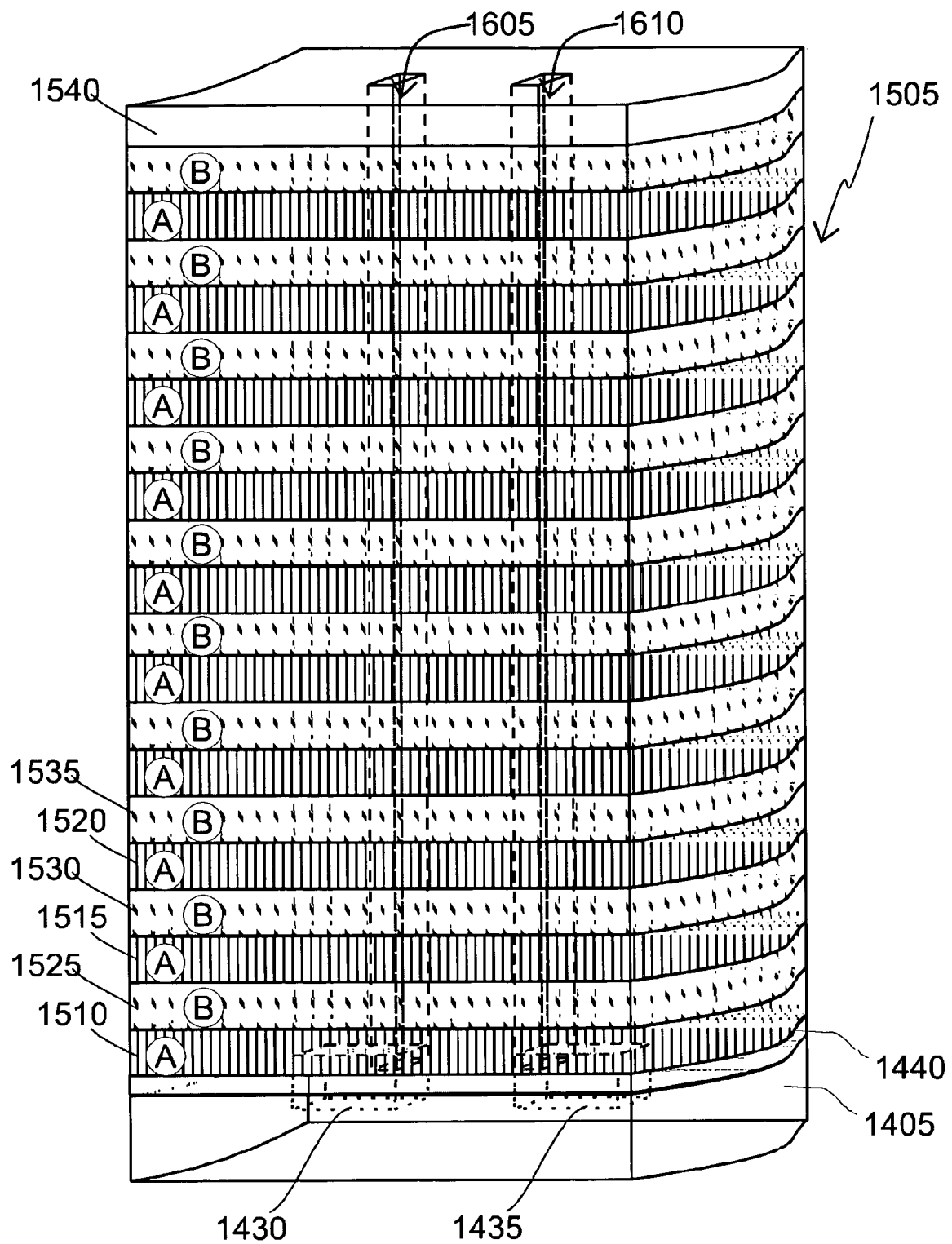
FIG. 16 is a diagram illustrating the formation of vias in the multi-layer stack structure for filling with ferromagnetic or ferrimagnetic material to form the data region and reservoir of the magnetic shift register of FIG. 1.

FIG. 16 illustrates the formation of vias 1605, 1610 in the multi-layer stack structure 1505. In an embodiment utilizing silicon as material B (i.e., layers 1525, 1530, 1535), the sidewall of vias 1605, 1610 is oxidized to form a thin insulator layer of silicon dioxide (with a thickness ranging between approximately 3 nm and 30 nm). Vias 1605, 1610 can be filled with homogeneous magnetic material, such as ferromagnetic or ferrimagnetic material, to form data region 35 and reservoir 40 of the data track 11.

Figure 17:
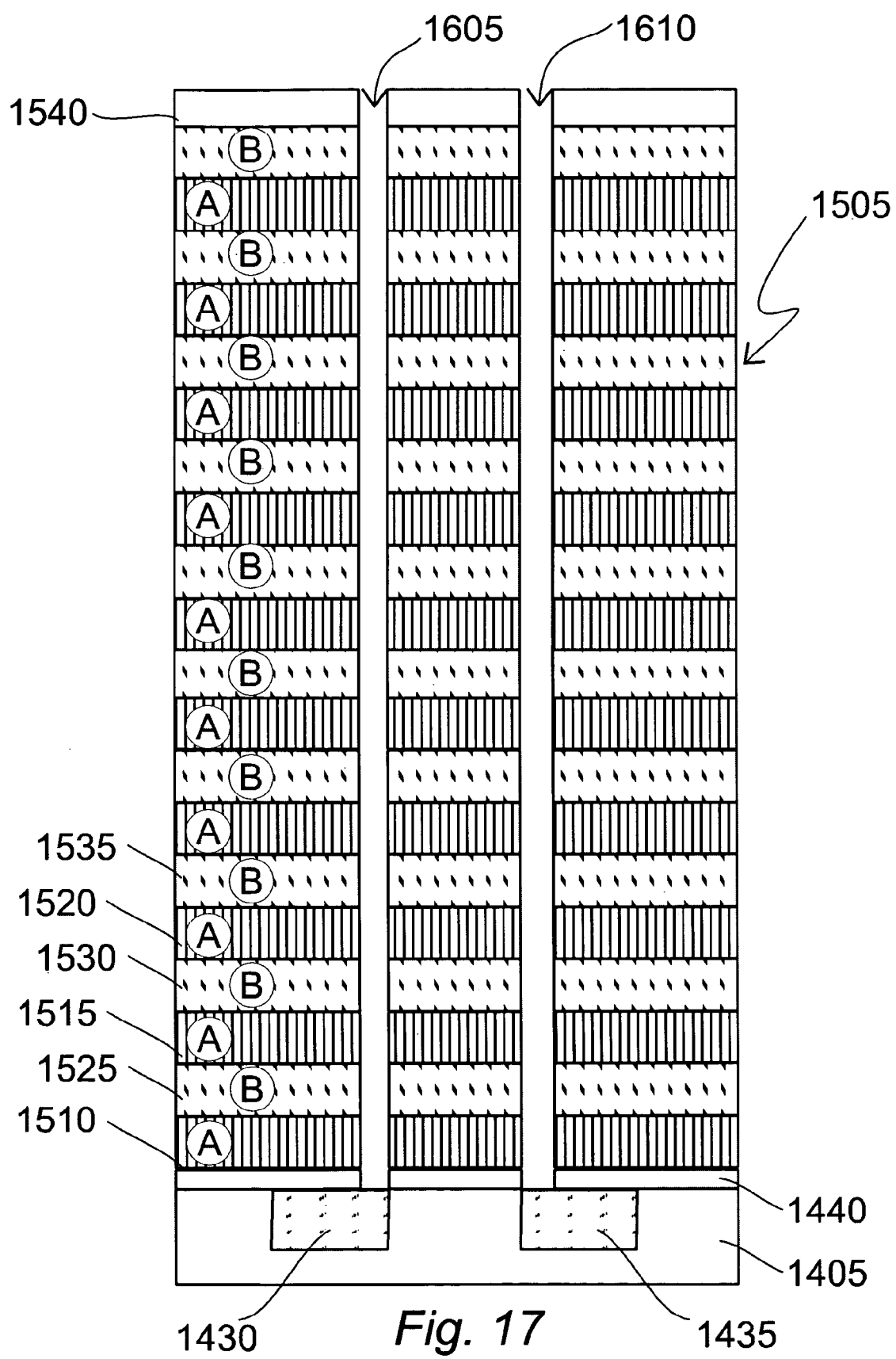
FIG. 17 is a cross-sectional view of the multi-layer stack structure of FIG. 16 illustrating the formation of vias etched from the top of the multi-layer stack structure to the conducting pads of FIG. 14.

As illustrated by the cross-sectional view of FIG. 17, vias 1605, 1610 are etched through the multi-layer stack structure 1505 and the capping layer 1440 to blocks 1430, 1435. In the example of FIGS. 16 and 17, vias 1605 and 1610 are formed with planar smooth walls by the process of non-selectively etching the via. In an embodiment in which material A (i.e. layers 1510, 1515, 1520) is comprised of silicon dioxide and material B (i.e., layers 1525, 1530, 1535) is comprised of silicon, vias 1605, 1610 may be formed by alternating the dry etching process for silicon selective to silicon dioxide and for silicon dioxide selective to silicon. Reference is made to U.S. Pat. Nos. 6,544,838 and 6,284, 666 for the process of alternating the dry etching process for silicon selective to silicon dioxide, which patents are incorporated herein by reference. Reference is made to U.S. Pat. Nos. 6,294,102 and 5,811,357 for the process of alternating the dry etching process for silicon dioxide selective to silicon, which patents are incorporated herein by reference.

In an alternative embodiment where material A is formed from silicon oxide and material B is formed from silicon nitride vias 1605 and 1610 can be formed by alternating the dry etching process for silicon nitride selective to silicon oxide (reference is made to U.S. Pat. Nos. 6,461,529 and 6,051,504, which are incorporated herein by reference) and for silicon dioxide selective to silicon nitride (reference is made to U.S. Pat. Nos. 6,294,102, and 5,928,967, which are incorporated herein by reference). A non-selective etching process will etch material A and material B at the same rate. If blocks 1430, 1435 are comprised of a conductor such as conducting silicon, copper, etc. the etching material will not substantially erode the material of blocks 1430, 1435.

Figure 18:
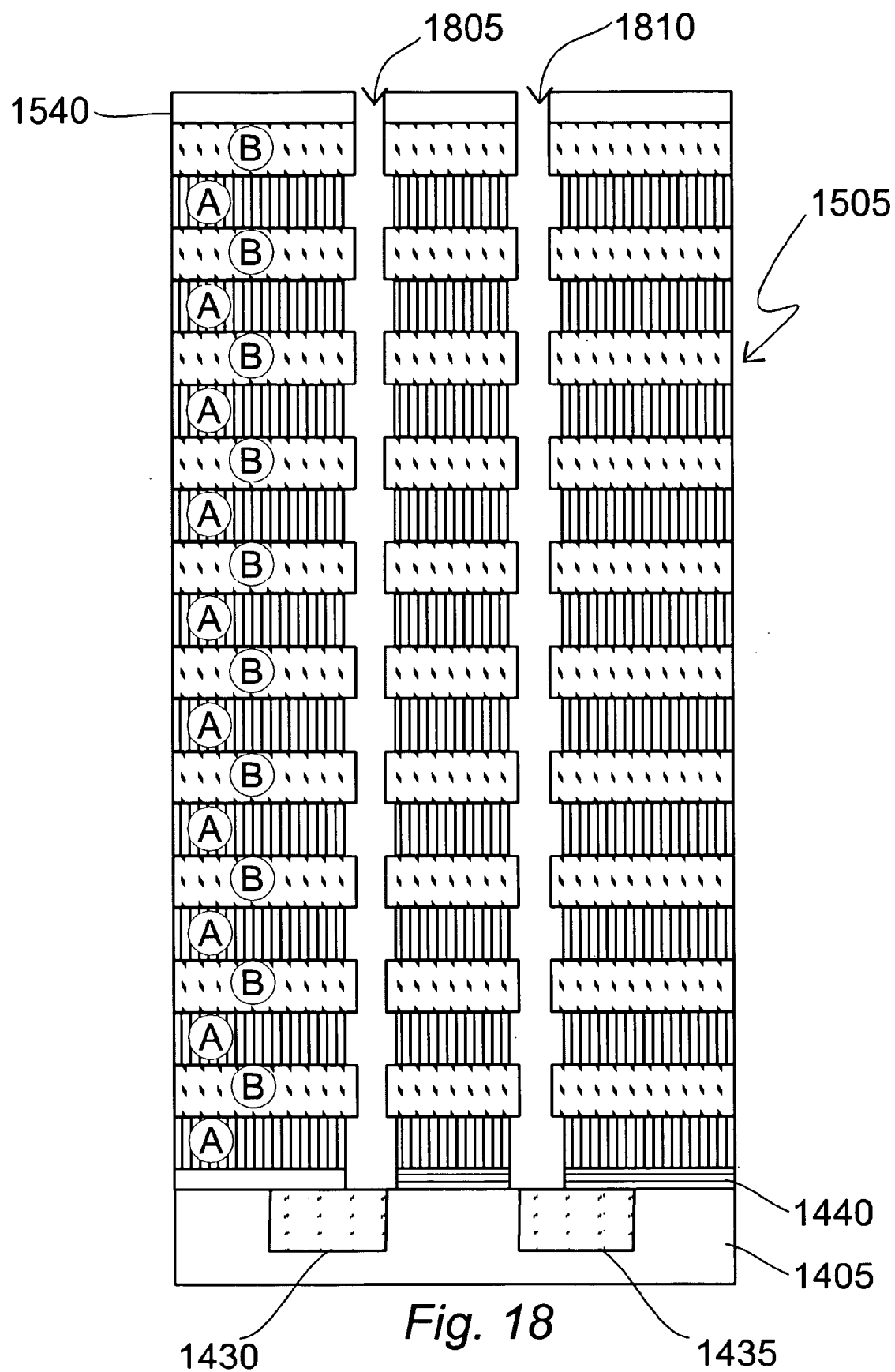
FIG. 18 is a diagram illustrating the effect of using a selective etching process on the cross-section of the via, creating regular variations in the via cross-section.

FIG. 18 illustrates the effect of using a selective etching process on materials with different etch rates. By using a selective etching process, material A and material B of the multi-layer stack structure 1505 can be etched at different rates. For example, hydrofluoric acid HF based chemical (e.g. buffered or diluted HF) can be used for wet-etching silicon dioxide selective to silicon, and phosphoric acid $H_3PO_4$ base chemical can be used for wet-etching silicon nitride selective to silicon dioxide.

Etching material A and material B at different rates forms regular variations in cross-section in vias 1805, 1810. When filled with ferromagnetic or ferromagnetic material, the variations in cross-section of vias 1805, 1810 produce protuberances or notches in data region 35 or reservoir 40 of the data track 11. The protuberances or notches in the track 11 serve to delineate possible boundaries between magnetic regions in the track 11 i.e. magnetic domain walls which are written into the track using the writing element 15 shown, for example, in FIG. 1B. Thus these notches or protuberances are used to pin domain walls in the track in their quiescent state in data region 35 and reservoir 40. The configuration of notches or protuberances in vias 1805, 1810 is selected for optimum performance of the data track 11. Configurations for vias 1805, 1810 and selection of the thicknesses of materials A and B can be similar to those of FIG. 10 (FIGS. 1A, 10B, 1C, 10D, 1E).

Figure 19:
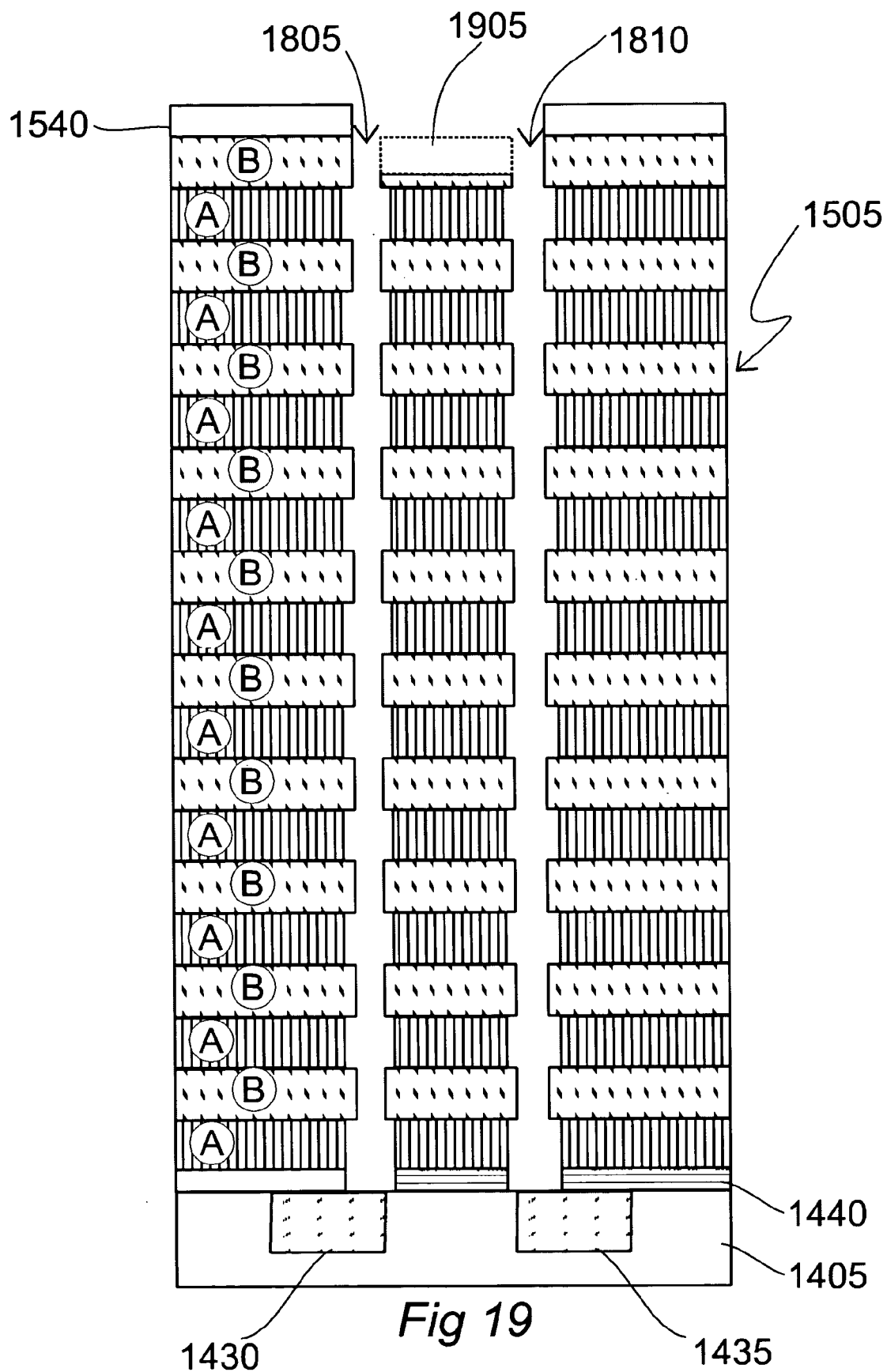
FIG. 19 is a diagram illustrating the removal of material at the top of the multi-layer stack structure between the vias to create a trench for the magnetic region that connects the data region with the reservoir of the data track of the magnetic shift register of FIG. 1.

FIG. 19 illustrates the result of removing material from the multi-layer stack structure 1505 to form a region or top trench 1905. The removal of the material to form region 1905 can be implemented, for example, by etching with photoresist, etc. (reference is made to U.S. Pat. Nos. 6,461, 529 and 6,051,504, which are incorporated herein by reference). Region 1905 is then filled with ferromagnetic material or ferrimagnetic material to form central region 2010 of the data track 11, as illustrated by the data track 2005 of FIG. 20.

Figure 20:
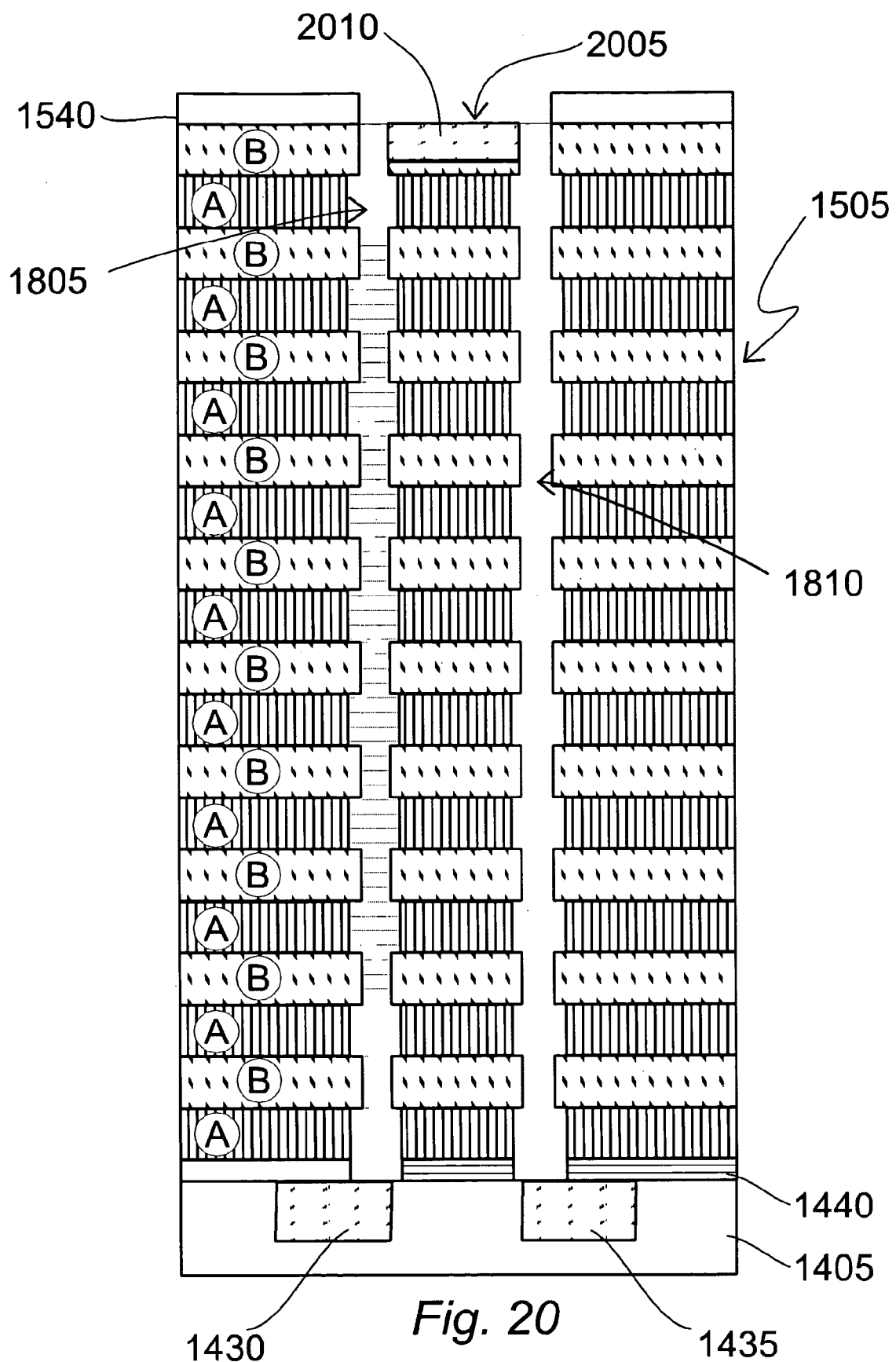
FIG. 20 is a diagram illustrating a data track fabricated by filling the vias of FIG. 17 and the region of FIG. 19 with homogeneous ferromagnetic or ferrimagnetic material.

FIG. 20 illustrates a data track 2005 created by filling vias 1805, 1810, and region 1905 with ferromagnetic or ferrimagnetic material. Vias 1805, 1810 and region 1905 can be filled by various methods, for example, Electroless plating or electroplating. Reference is made to U.S. Pat. No. 3,702, 263 for the process of electroless plating and to U.S. Pat. No. 4,315,985 for the process of electroplating, which are incorporated herein by reference.

Figure 21A:
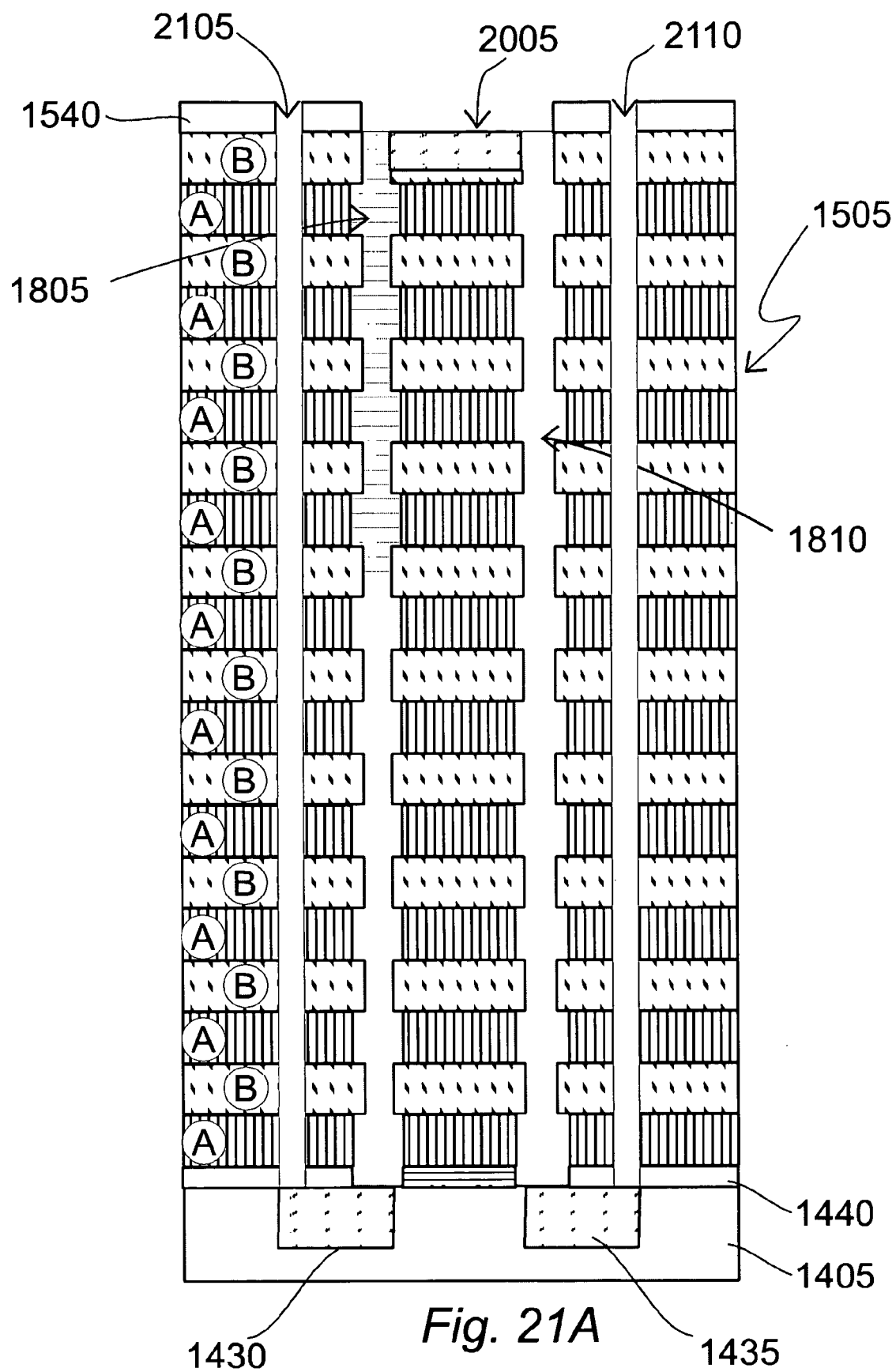
FIG. 21 is comprised of FIGS. 21A and 21B and represents a diagram illustrating a cross-sectional view of vias etched in the multi-layer stack structure to form conductors connecting to the data track of the magnetic shift register of FIG. 1.
Figure 21B:
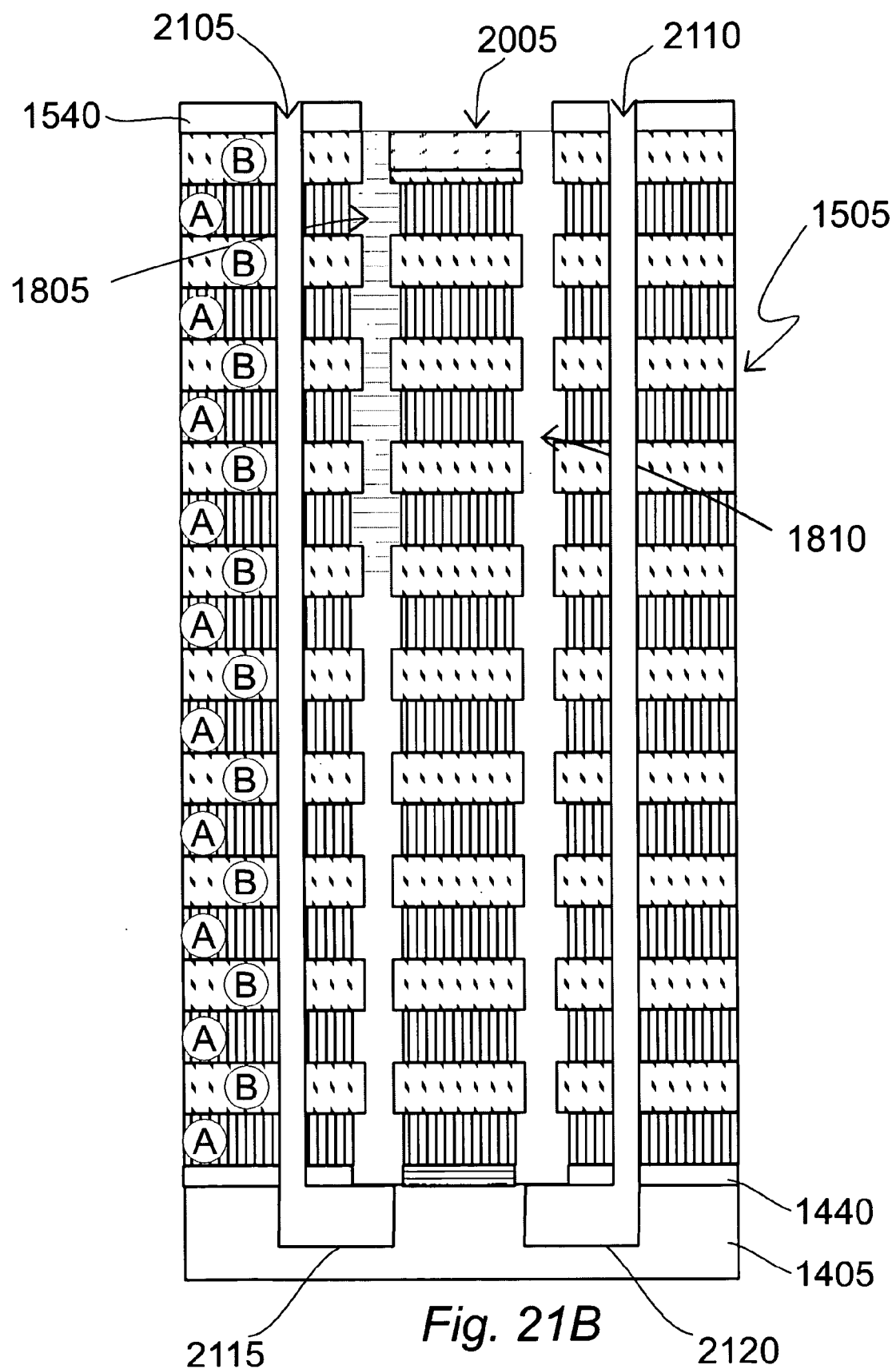

As illustrated by the cross-sectional view of FIG. 21 (FIGS. 21A, 21B), vias 2105, 2110 are etched through the multi-layer stack structure 1505 to blocks 1430, 1435. Vias 2105, 2110 will form conductors that connect external circuitry to the data track 2005 by means of contact with blocks 1430, 1435. In an embodiment where the material A is formed from silicon oxide and the material B from silicon nitride vias 2105, 2110 can be formed by alternating the dry etching process for silicon nitride selective to silicon oxide (reference is made to U.S. Pat. Nos. 6,461,529 and 6,051, 504, which are incorporated herein by reference) and for silicon dioxide selective to silicon nitride (reference is made to U.S. Pat. Nos. 6,294,102 and 5,928,967, which are incorporated herein by reference).

In an alternate embodiment, blocks 1430, 1435 are comprised of sacrificial dielectric material that is etched away by the etching process that forms vias 2105, 2110. Consequently, trenches 2115, 2120 are formed, as illustrated by FIG. 21B.

Figure 22A:
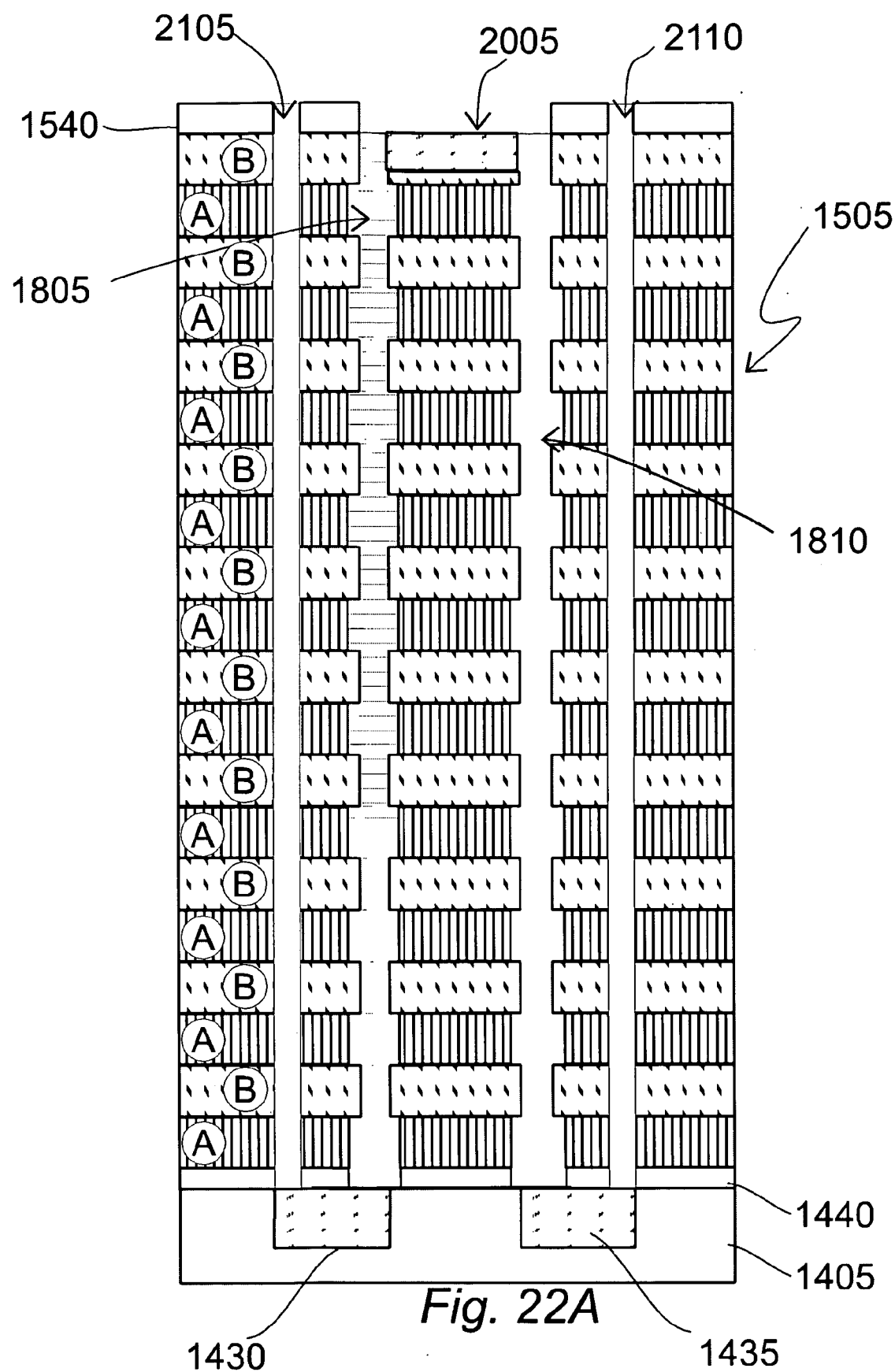
FIG. 22 is comprised of FIGS. 22A and 22B and represents a diagram illustrating the result of filling the vias of FIG. 21 with conductive material.
Figure 22B:
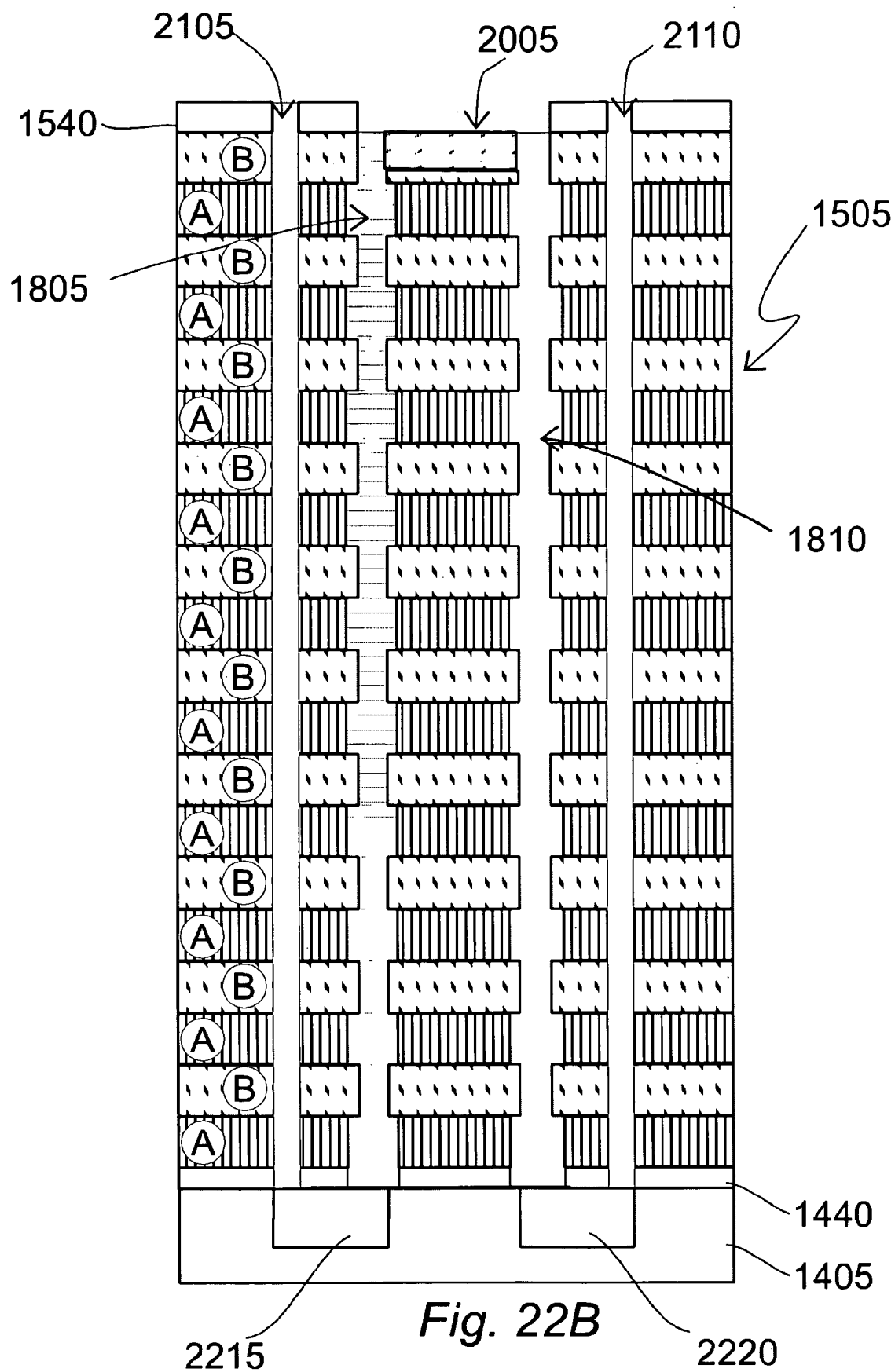

FIG. 22 (FIGS. 22A, 22B) illustrates the result of filling vias 2105, 2110 with conductive material such as polysilicon, tungsten, etc. to blocks 1430, 1435 (FIG. 22A). In an alternate embodiment, trenches 2115, 2120 are filled by the same process as that of vias 2105, 2110 and with the same conductive material that fills vias 2105, 2110, forming conductive pads.

Figure 23:
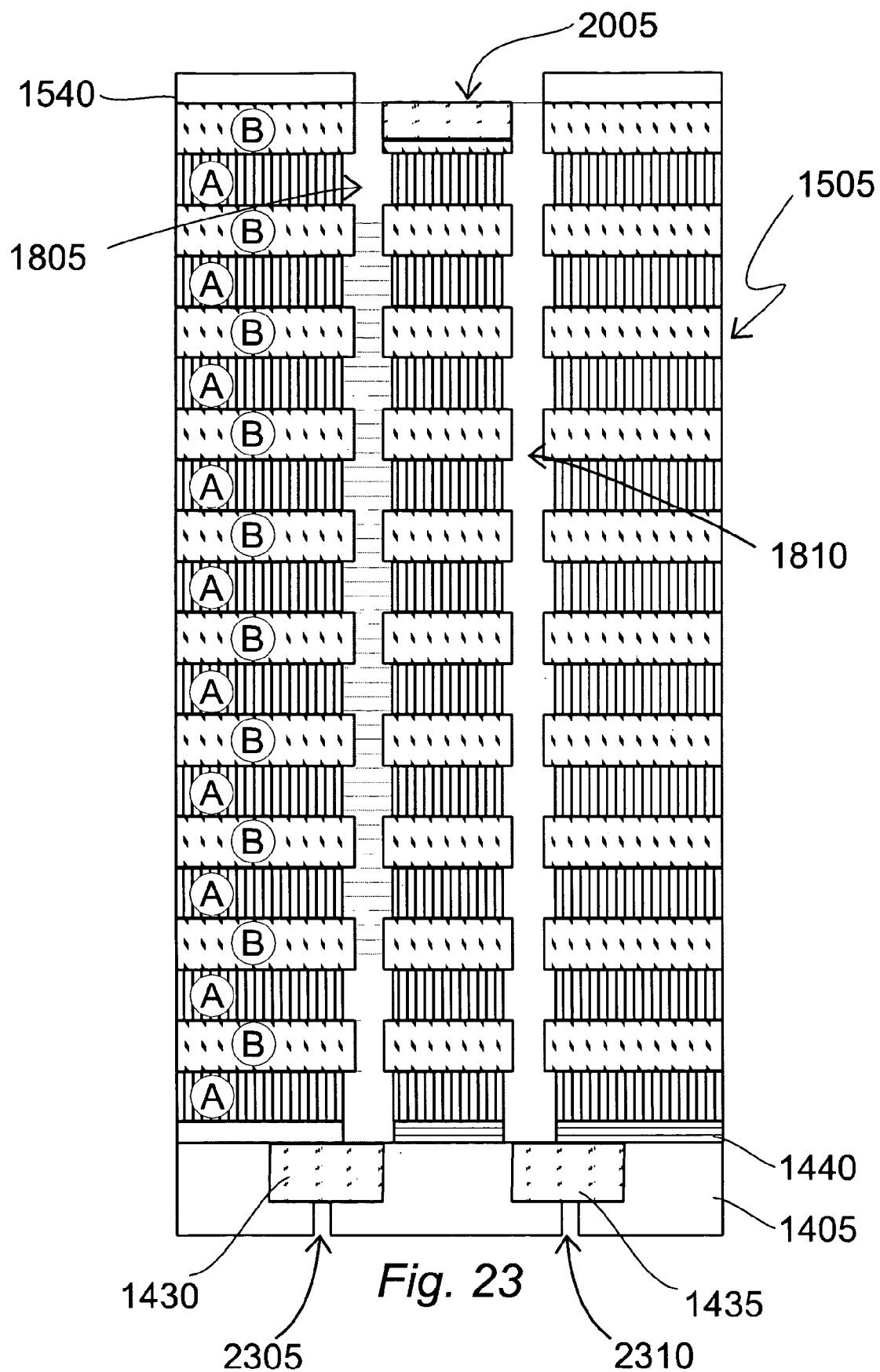
FIG. 23 is a diagram illustrating the formation of vias to the bottom of the conductor of FIG. 14, forming shorter conductive paths to the data track of the magnetic shift register of FIG. 1.

The configuration of vias 2105, 2110 is presented as an example of the techniques for forming conductive connections to the data track 2005. In a further embodiment, conductors to blocks 1430, 1435 can be formed by etching vias 2305, 2310 through insulator 1405, as illustrated by FIG. 23. Filling vias 2305, 2310 with conductive material will electrically connect the data track 2005 via metallic vias through to the bottom of the insulator 1405, allowing connections to a device for example for creating current pulses to be delivered to the track 11.

Figure 24A:
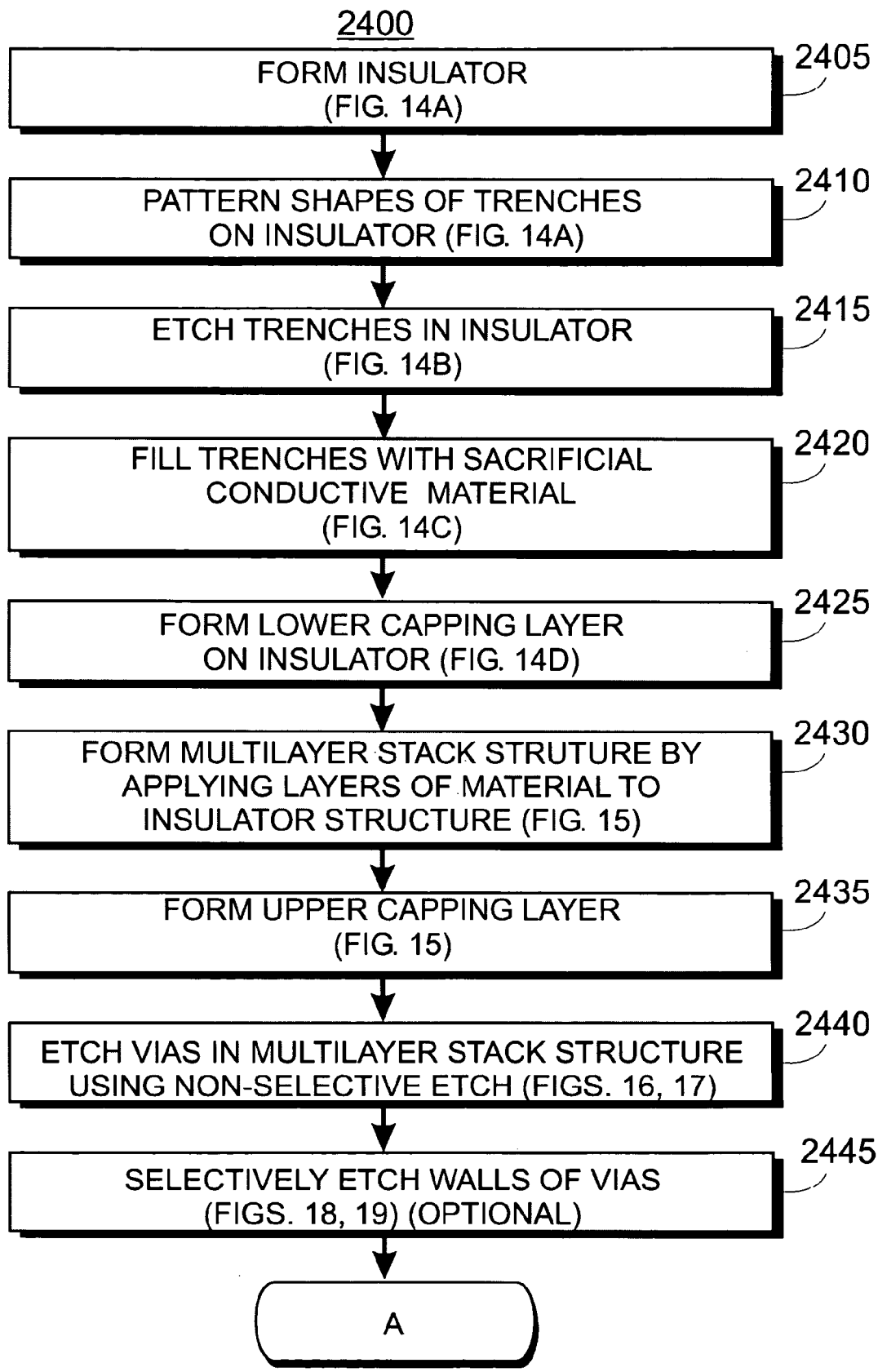
FIG. 24 is comprised of FIGS. 24A and 24B and represents a process flow chart illustrating a method of fabricating the data track of the magnetic shift register of FIG. 1 with homogeneous magnetic material, illustrated by FIG. 23.
Figure 24B:
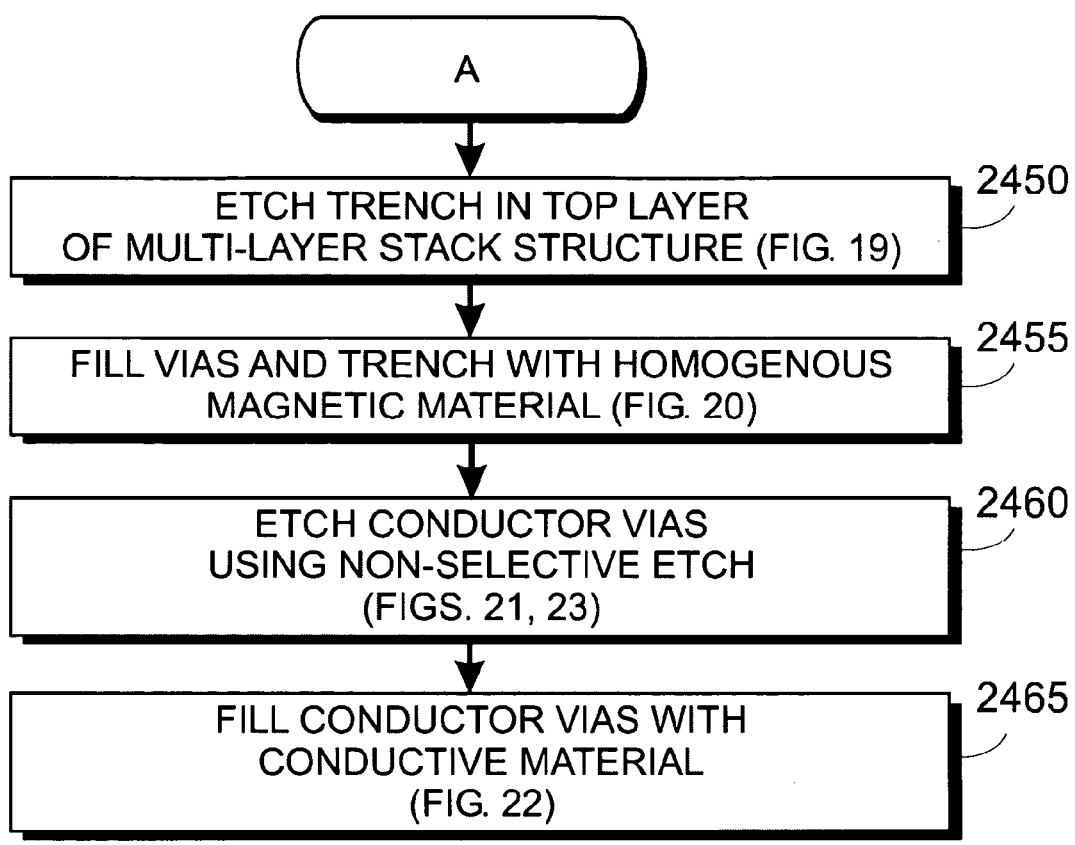

A method 2400 for fabricating a data track 2005 is illustrated by the process flow chart of FIG. 24 (FIGS. 24A, 24B). An insulator 1405 is formed at step 2405 (FIG. 14A). At step 2410, rectangles 1410, 1415 are patterned on insulator 1405 (FIG. 14A). Rectangles 1410, 1415 are etched at step 2415 to form trenches 1420, 1425 (FIG. 14B). Trenches 1420, 1425 are filled with a sacrificial dielectric or a conductive material at step 2420 (FIG. 14C) to form blocks 1430, 1435. A capping layer is then applied to the surface of the insulator 1405 in step 2425.

Multiple layers of alternating materials A and B are applied to the insulator 1405 in step 2430, forming the multi-layer stack structure 1505 (FIG. 15). The multi-layer stack structure 1505 can comprise, for example, approximately 100 layers of alternating materials A and B for a total thickness, for example, of approximately 10 microns. The capping layer 1540 is formed on top of the multi-layer stack structure 1505 at step 2435. Vias 1605, 1610 are non-selectively etched through the multi-layer stack structure 1505 to blocks 1430, 1435 at step 2440 (FIGS. 16, 17).

An optional selective etching process can be used at step 2445 to selectively etch one material faster than the other in walls of vias 1605, 1610, forming notches and protuberances in the walls of vias 1605, 1610 (FIG. 18, 19).

Region 1905 is removed by etching at step 2450, creating a trench 1905, that connects via 1805 with via 1810 (FIG. 19). Vias 1805, 1810, and trench 1905 are filled with ferromagnetic or ferrimagnetic material at step 2455 (FIG. 20), forming data track 2005.

Vias 2105, 2110 are etched from the top of multi-layer stack structure 1505 to blocks 1430, 1435 at step 2460. If blocks 1430, 1435 are filled with sacrificial dielectric material, the sacrificial dielectric material is also etched away in step 2460 (FIG. 21), forming trenches 2115, 2120. Vias 2105, 2110 are filled with conductive material at step 2465, forming a current path through the data track 2005 (FIG. 22). If sacrificial dielectric material has been etched away from blocks 1430, 1435 at step 2460, step 2465 also fills trenches 2115, 2120, forming conductive pads 2215, 2220.

Figure 25A:
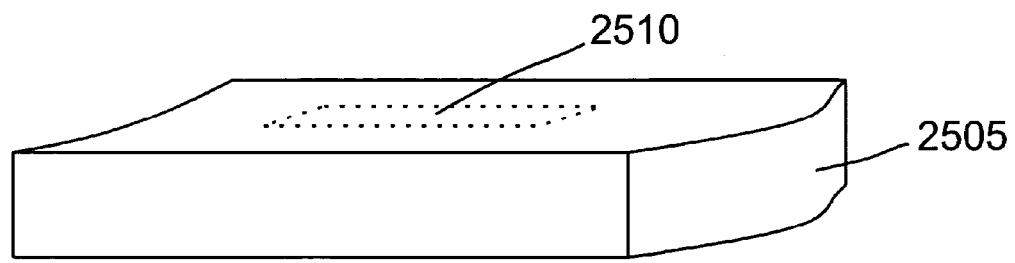
FIG. 25 is comprised of FIGS. 25A, 25B, and 25C and represents a diagram illustrating a formation of the region in the data track of FIG. 1 that connects the data region and the reservoir.
Figure 25B:
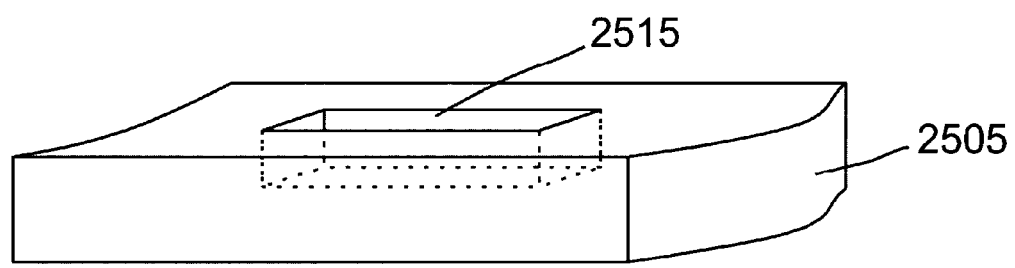
Figure 25C:
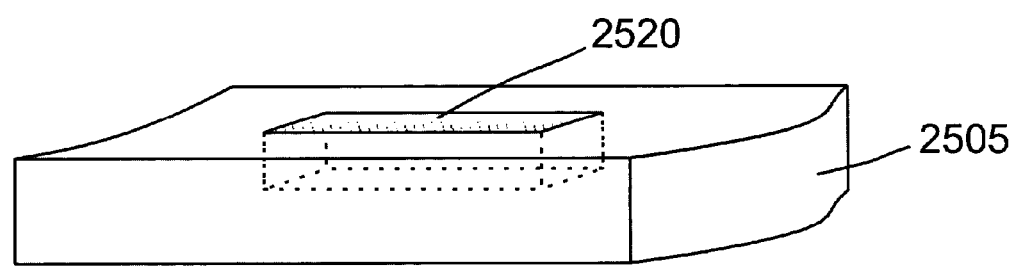

FIG. 25 (FIGS. 25A, 25B, 25C) illustrates an embodiment of the formation of the bottom of data track 11, central region 42. An insulator 2505 such as, for example, silicon nitride or silicon dioxide, is formed at a thickness of approximately 300 nm. Photoresist is applied to insulator 2505 and patterned in the form of a rectangle 2510. Using standard etching techniques, rectangle 2510 is etched to a depth of approximately 200 nm to form trench 2515. Reference is made to U.S. Pat. No. 6,051,504 for the process of silicon nitride etching and U.S. Pat. No. 5,811,357 for the process of silicon dioxide etching, which patents are incorporated herein by reference.

Trench 2515 is filled with a material in FIG. 25C to form block 2520. Block 2520 can comprise ferromagnetic or ferrimagnetic material, corresponding to central region 42 of data track 11. If block 2520 comprises ferromagnetic or ferrimagnetic material, block 2520 is planarized and polished. Exemplary ferromagnetic or ferrimagnetic materials used in block 2520 are permalloy, nickel iron, etc. Alternatively, block 2520 can comprise a sacrificial material that will later be etched away. The sacrificial material can be formed by low-pressure chemical vapor deposition and followed by chemical mechanical polishing for planarization. A thin layer of dielectric, for example, silicon nitride, is then deposited on top of insulator 2505, serving as a capping layer (not shown in FIG. 25). The thickness of the capping layer ranges between approximately 10 and 500 nm. The capping layer can be made of silicon nitride, silicon oxide, or any other suitable dielectric.

Figure 26:
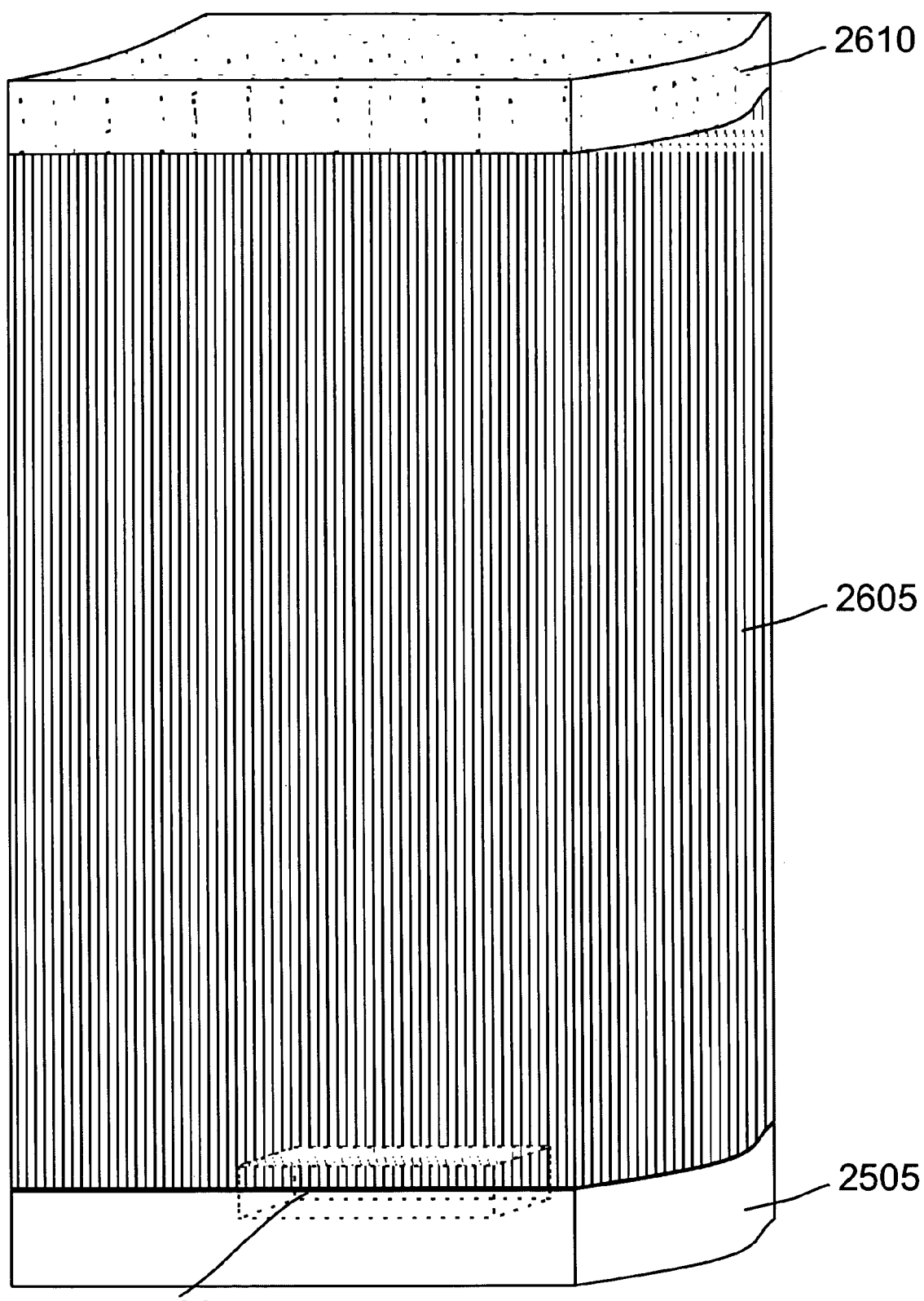
FIG. 26 is a diagram illustrating the fabrication of a uniform layer structure in which two vias can be formed for creating the data region and the reservoir of the data track of FIG. 1.

FIG. 26 illustrates the fabrication of a structure in which two vias can be formed, creating data region 35 and reservoir 40 of the data track 11. A uniform layer structure 2605 (also referenced herein as the uniform layer 2605) is formed with thickness, for example, of approximately 10 microns. Layer 2605 may be comprised of silicon or a dielectric material, for example, silicon dioxide or silicon nitride. A thin layer of dielectric, for example, silicon nitride, may be deposited on top of the uniform layer 2605, serving as a capping layer 2610, if the layer 2605 is formed from silicon to prevent oxidation of the surface of the silicon layer. The thickness of the capping layer 2610 can range, for example, between approximately 10 and 500 nm. The bottom capping layer 2610 can be made of silicon nitride, silicon oxide, or any other suitable dielectric.

Figure 27:
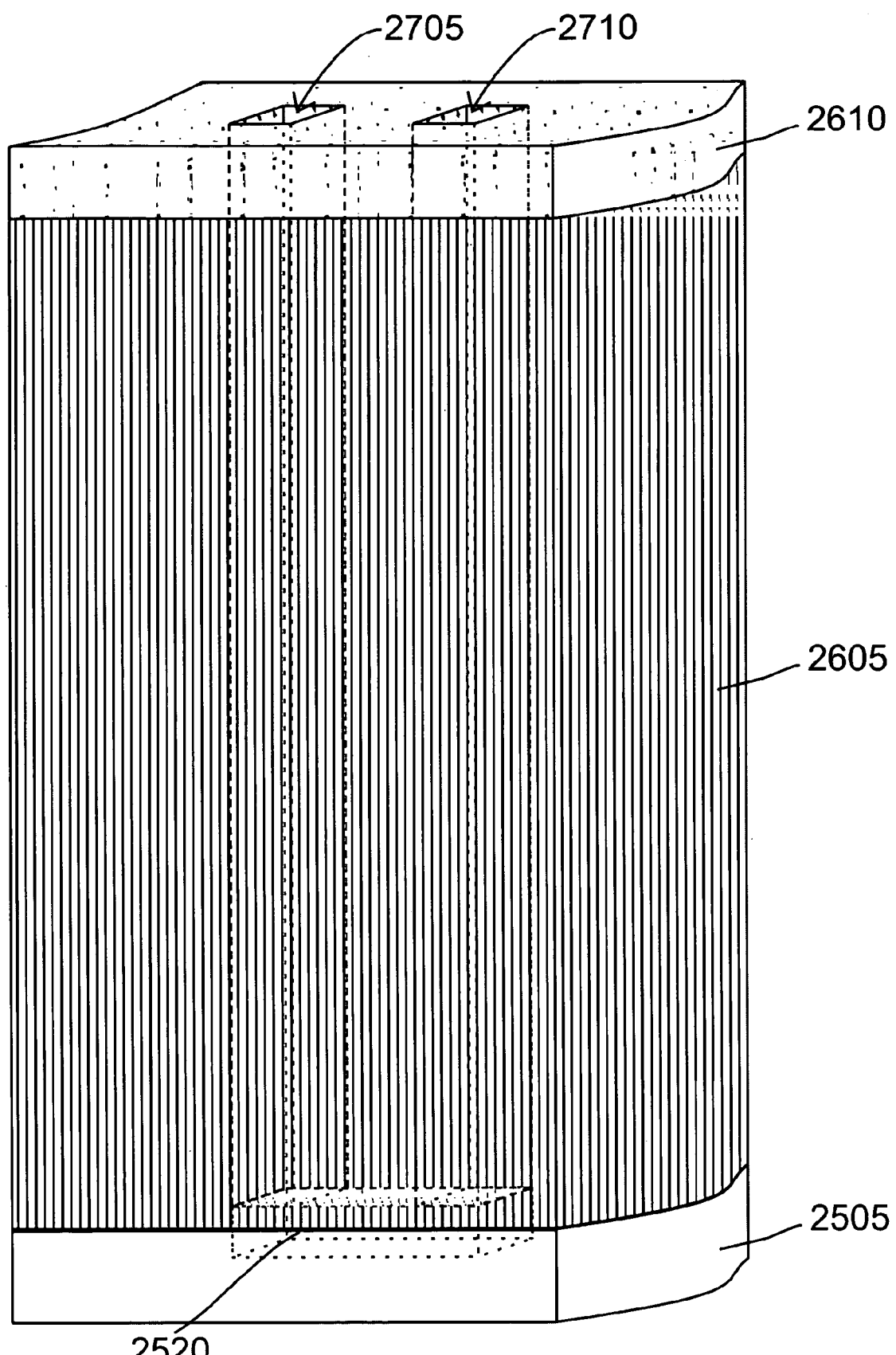
FIG. 27 is a diagram illustrating the formations of vias in a uniform layer structure for the data region and reservoir of the data track of FIG. 1.

FIG. 27 illustrates the formation of vias 2705, 2710 in the uniform layer 2605. Vias 2705, 2710 can be filled with ferromagnetic or ferrimagnetic material to form data region 35 and reservoir 40 of the data track 11. In an embodiment utilizing silicon as the uniform layer 2605, the sidewalls of vias 2705, 2710 are oxidized to form a thin insulator layer of silicon dioxide (with a thickness ranging between approximately 3 nm and 30 nm).

Figure 28:
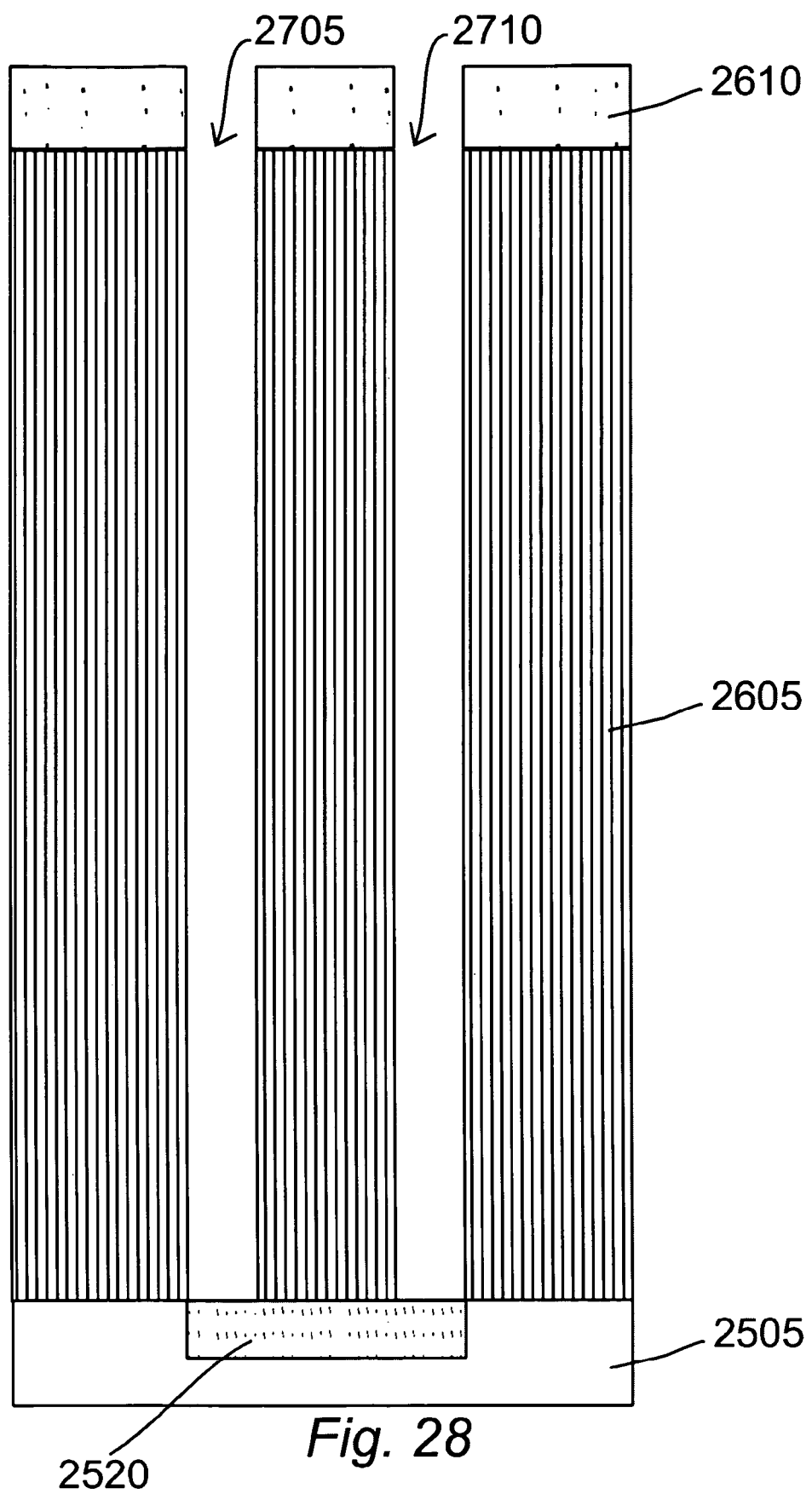
FIG. 28 is a diagram illustrating the cross-section of the uniform layer structure and vias of FIG. 27.

As illustrated by the cross-sectional view of FIG. 28, vias 2705, 2710 are etched through the uniform layer 2605 to block 2520 in insulator 2505. Vias 2705, 2710 are formed with planar smooth walls. In the case of uniform layer 2605 being silicon, the sidewalls of vias 2705, 2710 are oxidized to form a thin insulator layer of silicon dioxide (with a thickness ranging between approximately 3 nm and 30 nm). Formation of the vias 2705, 2710 is followed by etching the capping layer 2610 to open the contact to the bottom section of homogeneous ferromagnetic or ferrimagnetic material, block 2520. Capping layer 2610 is resistant to oxidation similar to insulator 2505. If block 2520 is comprised of a metal such as a ferromagnetic or ferrimagnetic material, the etching material will not substantially etch into the material of block 2520.

Figure 29A:
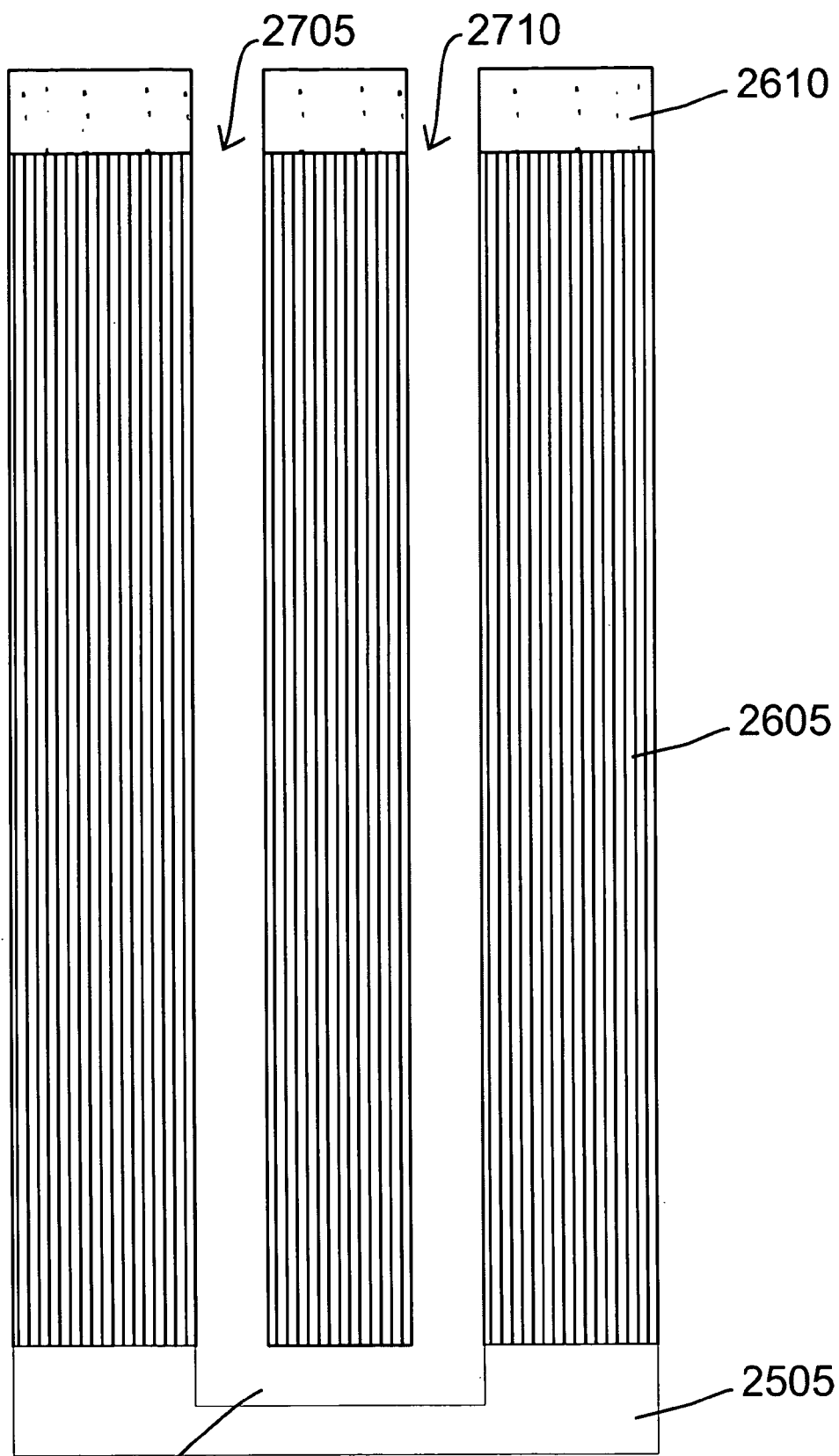
FIG. 29 is comprised of FIGS. 29A and 29B and represents a diagram illustrating a cross-section of the vias of FIG. 27 and a trench connecting the two vias.
Figure 29B:
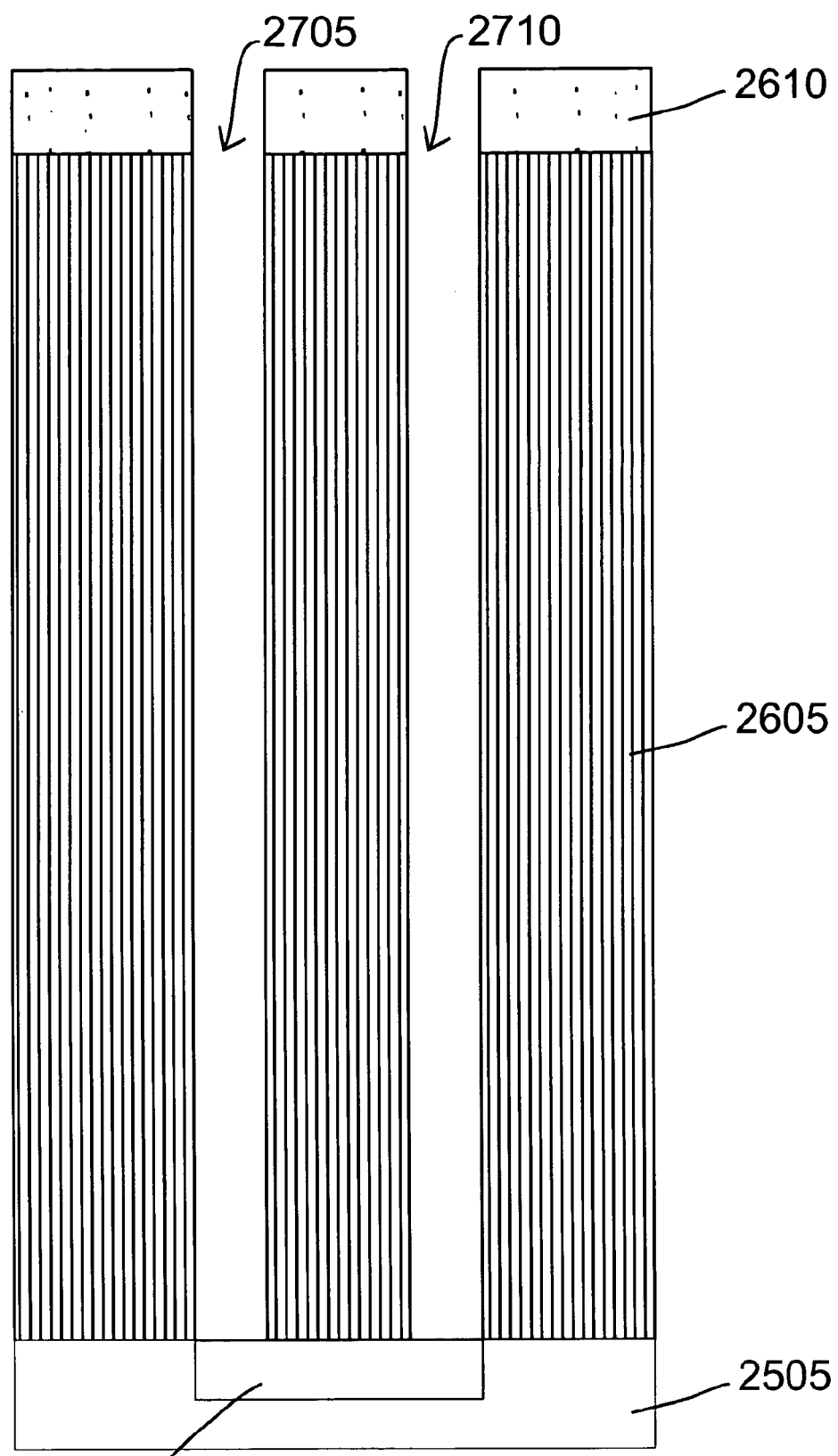

FIG. 29 (FIGS. 29A, 29B) illustrates a cross-section of a form for the data track 11 comprising vias 2705, 2710 (etched in the uniform layer 2605) and trench 2905. To produce the trench 2905, block 2520 is filled with a sacrificial dielectric material (FIG. 25). This material is etched away when vias 2705, 2710 are formed. In an alternate embodiment shown in FIG. 29B, block 2910 is comprised of ferromagnetic or ferrimagnetic material that remains after via 2705, 2710 are created.

Figure 30:
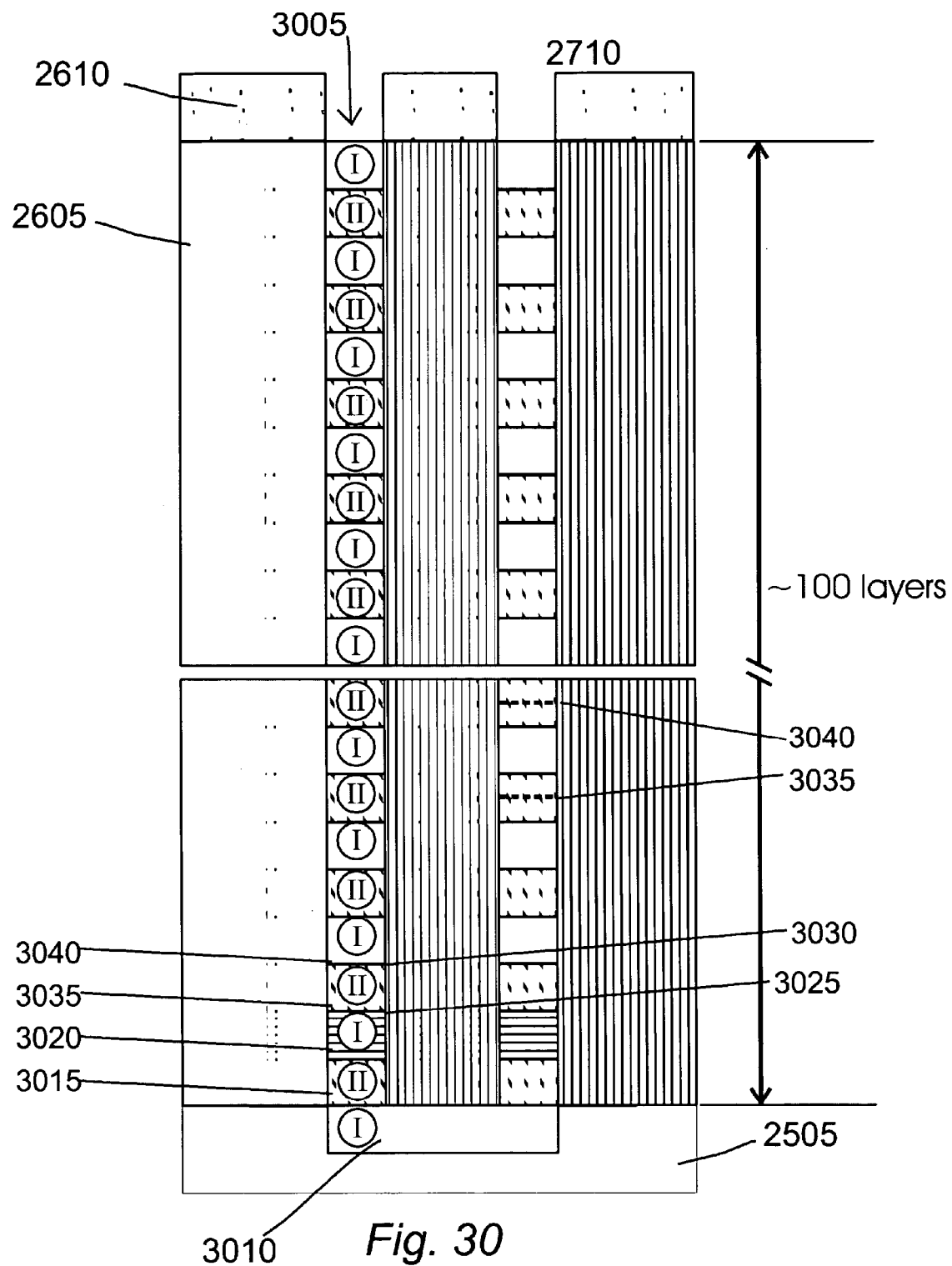
FIG. 30 is a diagram illustrating the result of filling the vias of FIG. 27 with alternating magnetic materials to fabricate the data track of FIG. 1.

FIG. 30 illustrates a track 3005 created by filling vias 2705, 2710, and trench 2905 (FIG. 29) with alternate layers of different types of ferromagnetic or ferrimagnetic material. Vias 2705, 2710 and trench 2905 can be filled by various methods, for example, electroless plating or electroplating. Reference is made to U.S. Pat. No. 3,702,263 for the process of electroless plating and to U.S. Pat. No. 4,315,985 for the process of electroplating, which patents are incorporated herein by reference. Trench 2905 is filled with one magnetic material, material I, creating block 3010. Block 3010 corresponds to central region 42 of the data track 11.

Magnetic material II is then deposited in a layer on block 3010, forming layer 3015. Magnetic material I is then deposited on layer 3015, forming layer 3020. Magnetic material I and magnetic material II are alternately deposited into the vias to form alternating layers for a total, for example, of approximately 100 layers. The thickness of each layer such as layers 3015, 3020 can be, for example, between approximately 50 to 500 nm thick. The alternating ferromagnetic or ferrimagnetic layers 3015, 3020 are comprised of magnetic materials with different magnetic properties including magnetization and/or magnetic exchange and/or magnetic anisotropies. These different magnetic characteristics allow the pinning of magnetic domain walls at the boundaries between these layers or within the layers themselves.

Alternatively, block 2520 can comprise a material such as ferromagnetic or ferrimagnetic material before vias 2705, 2710 are filled. The metal of block 2520 can be used as an electrode for the electroplating process. The magnetic material of block 2520 may or may not be the same as that used to fill vias 2705, 2710.

Domain walls 3025, 3030 can occur at the interfaces between alternating magnetic layers. The alternating ferromagnetic or ferrimagnetic layers 3020, 3035 are comprised of magnetic materials with different magnetization or magnetic exchange or magnetic anisotropies. These different magnetic characteristics allow the pinning of magnetic domain walls at the boundary 3025 between layers 3020, 3035. For example, domain wall 3025 occurs between layer 3020 and layer 3035. Domain wall 3030 occurs between layer 3035 and 3040.

In an alternate embodiment, domain walls 3045, 3050 can occur within each layer of one of the magnetic materials, for example, magnetic material 11. The ability to form layers with domain walls inside the magnetic material depends on the properties of the ferromagnetic or ferrimagnetic material. Placement of the domain walls within the data track 11 can be optimized by design through selection of the magnetic materials used for magnetic material I and magnetic material II.

Figure 31A:
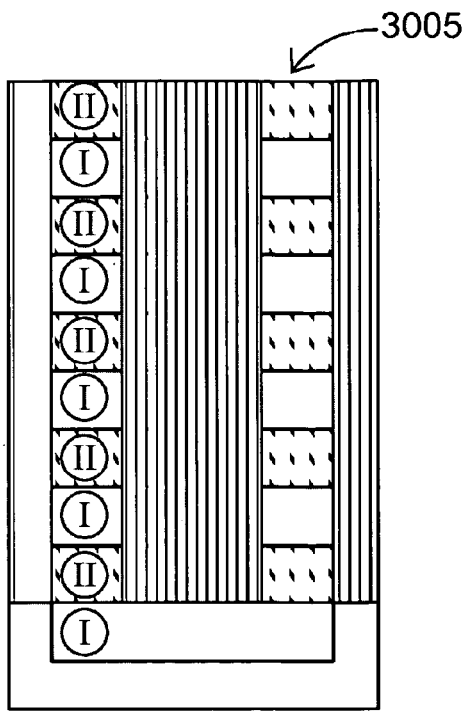
FIG. 31 is comprised of FIGS. 31A, 31B, and 31C and represents a diagram illustrating the fabrication of the data track of FIG. 1 using alternating layers of magnetic material of alternating thicknesses.
Figure 31B:
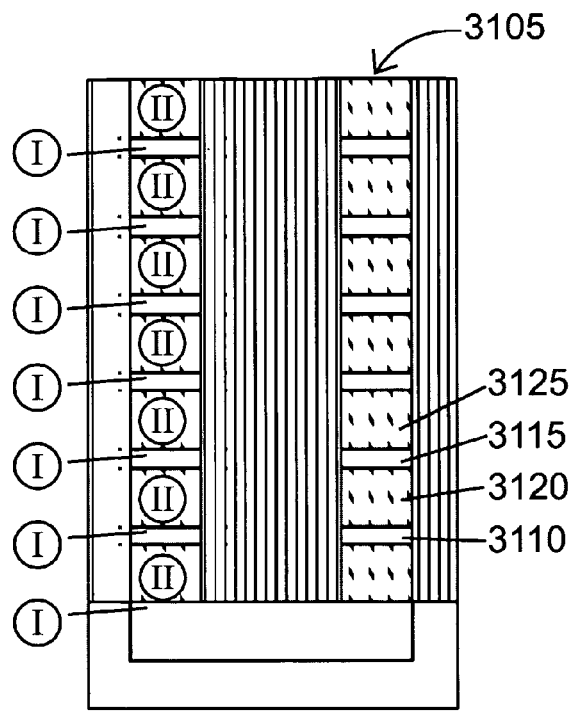
Figure 31C:
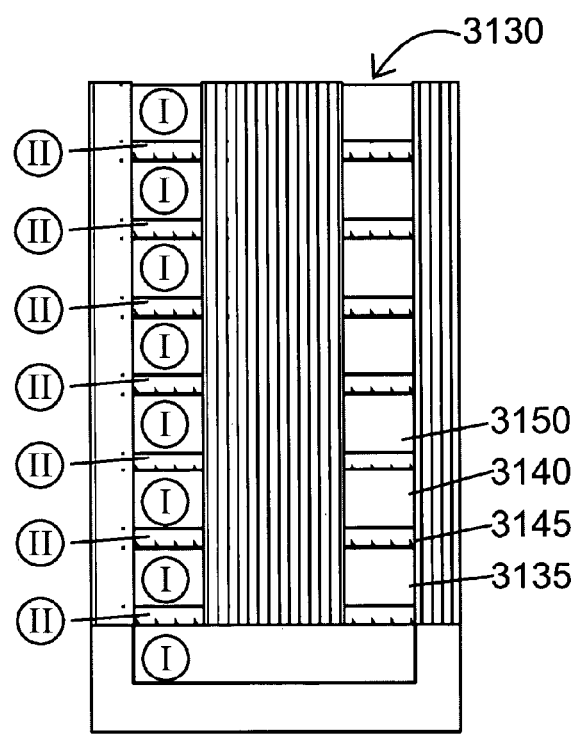

The thicknesses of the layers of magnetic material can vary, as illustrated by FIG. 31 (FIGS. 31A, 31B, 31C). For ease of illustration, capping layer is not shown in FIG. 31 (FIGS. 31A, 31B, 31C). FIG. 31A illustrates a data track 3005 comprised of magnetic layers of equal thickness. FIG. 31B illustrates a data track 3105 comprised of magnetic layers of unequal thickness. In FIG. 31B, layers of magnetic material I (represented by layers 3110, 3115) are thin. Layers of magnetic material II (represented by layers 3120, 3125) are thick. In FIG. 31C, data track 3130 is also comprised of magnetic layers of unequal thickness. In FIG. 31C, layers of magnetic material I (represented by layers 3135, 3140) are thick. Layers of magnetic material II (represented by layers 3145, 3150) are thin.

Figure 32:
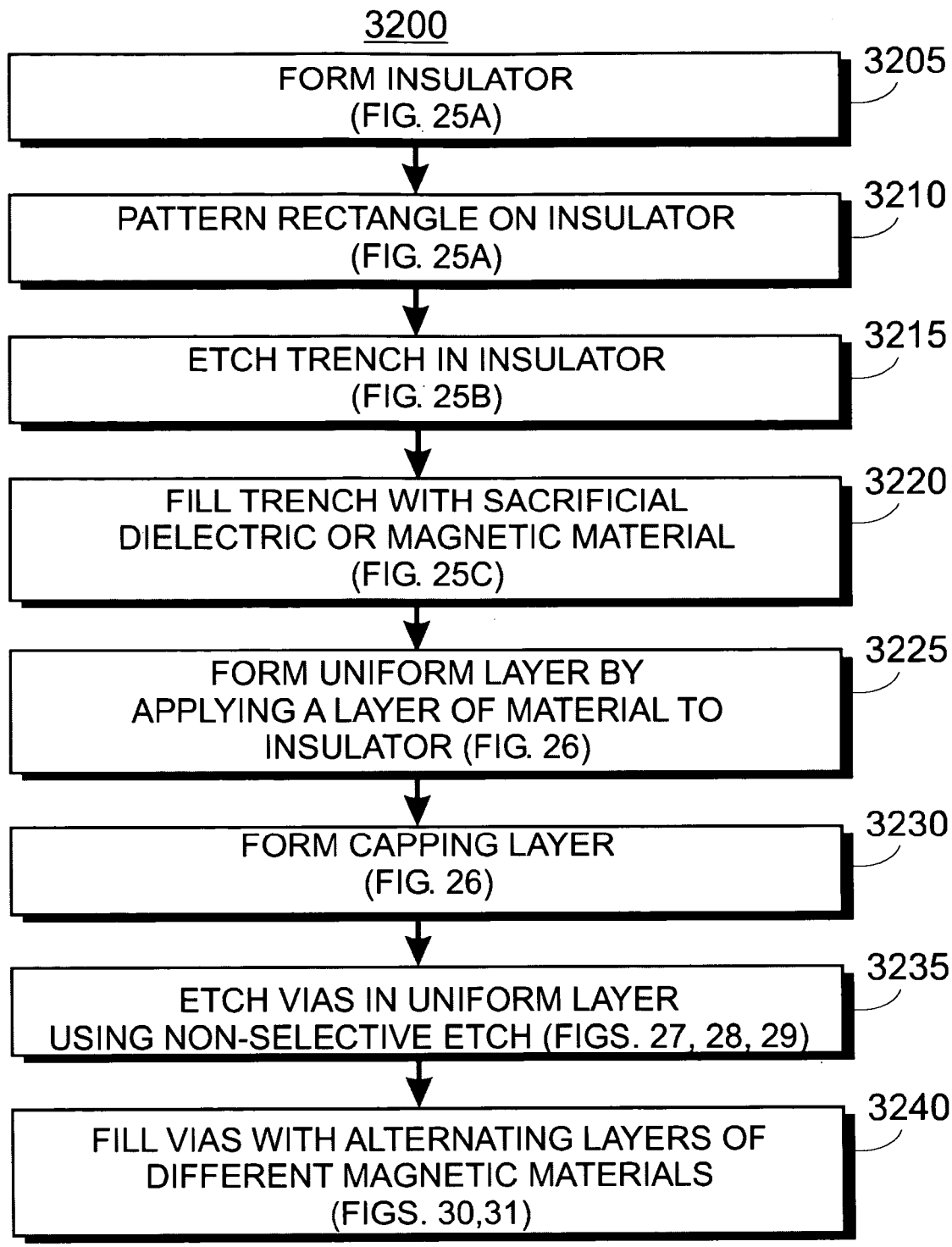
FIG. 32 is a process flow chart illustrating a method of fabricating the data track of the magnetic shift of FIG. 1 using alternating layers of magnetic material.

FIG. 32 illustrates a method 3200 of fabricating a data track 3005 comprised of layers of different ferromagnetic or ferrimagnetic material. An insulator 2505 is formed at step 3205 (FIG. 25A). At step 3210, a rectangle 2510 is patterned on insulator 2505 (FIG. 25A). Rectangle 2510 is etched at step 3215 to form trench 2515 (FIG. 25B). Trench 2515 is filled with a sacrificial dielectric, ferromagnetic material, or ferrimagnetic material at step 3220 (FIG. 25C), creating block 2520. A uniform layer 2605 is applied to the insulator in step 3225 (FIG. 26). The uniform layer 2605 can have a thickness, for example, of approximately 10 microns. The capping layer 2610 is formed on top of the uniform layer 2605 at step 3230 (FIG. 26). A capping layer may also be applied to the top of layer 2505 after the block 2520 has been completed.

Vias 2705, 2710 are etched through the uniform layer 2605 to block 2520 at step 3235 (FIGS. 27, 28, 29) using a non-selective etching process. If block 2520 is filled with sacrificial dielectric material, the sacrificial dielectric material is also etched away in step 3235 (FIG. 29).

Vias 2705, 2710 are filled with alternating magnetic layers of different types of ferromagnetic or ferrimagnetic material at step 3240 (FIG. 30), forming the data track 3005. The thicknesses of layers of magnetic material in track 3005 can be varied (FIG. 31).

The process of creating track 11 using method 3200 is similar to the process of fabricating track 11 using method 1300, with the exception that multiple layers of magnetic material are used. Similarly, a track 11 can be fabricated using method 3200. In this embodiment, a uniform dielectric material replaces multi-layer stack structure 1505 and data track 2005 is filled with alternate layers of magnetic material are rather than a uniform magnetic material.

It is to be understood that the specific embodiments of the invention that have been described are merely illustrative of certain applications of the principle of the present invention. Numerous modifications may be made to the method of fabricating data tracks for use in a magnetic shift register system described herein without departing from the spirit and scope of the present invention. The dimensions described herein are provided for illustration purpose only; it should be abundantly clear that there is no intention to limit the scope of the present invention to these dimensions.

What is claimed is:

1. A method of forming a magnetic shift register in which data is stored, the method comprising:
    forming at least two vias in a body;
    patterning inner surfaces of the at least two vias in order to define and pin domain walls of a plurality of magnetic domains in a data track;
    connecting the at least two vias to form the data track along which the magnetic domains are selectively shifted; and
    filling the at least two vias with magnetic material.

2. The method of claim 1, wherein forming the at least two vias comprises etching the body.

3. The method of claim 2, wherein the body comprises two or more layers of materials that are selected from the group consisting of a dielectric and silicon.

4. The method of claim 3, wherein etching the body comprises using a combination of selective and non-selective etching.

5. The method of claim 4, wherein patterning the inner surfaces of the at least two vias comprises forming irregularities along the inner surfaces of the at least two vias.

6. The method of claim 5, wherein the irregularities comprise at least one notch.

7. The method of claim 5, wherein the irregularities comprise at least one protuberance.

8. The method of claim 4, wherein the body includes alternating layers of material A and layers of material B.

9. The method of claim 8, wherein material A includes silicon dioxide and material B includes silicon.

10. The method of claim 8, wherein material A includes silicon dioxide and material B includes silicon nitride.

11. The method of claim 4, wherein the layers of materials A and B have different etch rates with respect to one or more preselected etchants.

12. The method of claim 1, wherein connecting the two vias comprises connecting the two vias with a magnetic connector.

13. The method of claim 12, wherein connecting the two vias with the magnetic connector comprises forming a trench; and
    filling the trench with a magnetic material that provides a magnetically continuous path between the two vias.

14. The method of claim 13, wherein forming the trench comprises forming the trench in the body.

15. The method of claim 14, wherein forming the trench comprises forming the trench in an upper portion of the body.

16. The method of claim 14, wherein forming the trench comprises forming the trench in a bottom portion of the body.

17. The method of claim 13, further comprising forming the body on an insulator substrate; and
    wherein forming the trench comprises forming the trench in the insulator substrate.

18. The method of claim 1, wherein the magnetic material is selected from the group consisting of ferromagnetic materials and ferrimagnetic materials.

19. The method of claim 18, wherein the magnetic material is conducting.

20. The method of claim 1, further comprising forming the body of a single uniform structure.

21. The method of claim 20, wherein forming the at least two vias comprises etching the at least two vias in the uniform structure using a non-selective etching process.

22. The method of claim 20, wherein the uniform structure includes a material that is selected from the group consisting of silicon and a dielectric material.

23. The method of claim 22, wherein the uniform structure includes a material that is selected from the group consisting of silicon dioxide and silicon nitride.

24. The method of claim 6, wherein the width of the notch ranges between approximately 5 nm and 100 nm.

25. The method of claim 7, wherein the width of the protuberance ranges between approximately 5 nm and 100 nm.

26. A method of making a magnetic shift register comprising a data track, the method comprising:
forming a central region of the data track;
forming two data regions of the data track that are interconnected by the central region; and
defining wall domains in the two data regions to allow data to be selectively shifted along the data track.

27. The method of claim 26, wherein forming the central region comprises forming a trench.

28. The method of claim 27, wherein forming the two data regions comprises forming two vias in a body; and
wherein the two vias are interconnected by the trench.

29. The method of claim 28, wherein forming the central region and the two data regions comprises filling the trench and the two vias with magnetic material.

30. The method of claim 29, wherein the magnetic material is selected from the group consisting of ferromagnetic materials and ferrimagnetic materials.

31. The method of claim 30, wherein the magnetic material is selected from the group consisting of a permalloy, a nickel-iron alloy, a cobalt-iron alloy, an alloy formed from one or more of Ni, Co and Fe, and an alloy formed of one or more of Ni, Co and Fe in conjunction with any one or more of B, Zr, Hf, Cr, Pd, and Pt.

32. The method of claim 30, further comprising forming the body of a multi-layer stack structure that includes alternating layers of material A and layers of material B.

33. The method of claim 32, wherein material A includes silicon dioxide and material B includes silicon.

34. The method of claim 30, wherein material A includes silicon dioxide and material B includes silicon nitride.

35. The method of claim 30, wherein the layers of materials A and B have different etch rates with respect to a preselected etchant.

36. The method of claim 30, wherein the thickness of one of the layers of materials A and B corresponds to the domain walls in the data track.

37. The method of claim 36, wherein the thicknesses of the layers of materials A and B are similar, and range between approximately 0.5 and 5 microns.

38. The method of claim 36, wherein the thicknesses of the layers of materials A and B are different.

39. The method of claim 32, wherein defining the wall domains in the two data regions comprises etching the layers of materials A and B to form a series of notches that correspond to domain walls along the data track.

40. The method of claim 32, wherein defining the wall domains in the two data regions comprises etching the layers of materials A and B to form a series of protuberances that correspond to domain walls along the data track.

41. The method of claim 32, wherein forming the two vias comprises selectively etching the two vias.

42. The method of claim 41, wherein selectively etching the two vias comprises using a first etching process to etch the layers of material A selectively relative to material B.

43. The method of claim 42, wherein etching the two vias further comprises using a second etching process to etch the layers of material B selectively relative to material A, alternately with the first etching process.

44. The method of claim 32, wherein filling the trench and the two vias with the magnetic material comprises using an electroless plating process.

45. The method of claim 32, wherein filling the trench and the two vias with the magnetic material comprises using an electroplating process.

46. The method of claim 28, further comprising forming the body of a uniform structure.

47. The method of claim 46, wherein forming the central region, the two data regions comprises filling the trench and the two vias with alternating layers of magnetic materials.

48. The method of claim 47, wherein forming the central region, the two data region comprises filling each of the vias with at least two alternating magnetic materials.

49. The method of claim 48, wherein the magnetic materials are selected from the group consisting of ferromagnetic materials and ferrimagnetic materials.

50. The method of claim 47, wherein forming the two vias comprises etching the two vias in the uniform structure using a non-selective etching process.

51. The method of claim 47, wherein the two alternating materials are selected from the group consisting of ferromagnetic materials and ferrimagnetic materials.

52. The method of claim 46, wherein the uniform structure includes a material that is selected from the group consisting of silicon and a dielectric material.

53. The method of claim 52, wherein the uniform structure includes a material that is selected from the group consisting of silicon dioxide and silicon nitride.

54. A method of making a magnetic shift register comprising a data track, the method comprising:
forming at least two data regions of the data track;
then defining wall domains in the at least two data regions to allow data to be selectively shifted along the at least two data regions; and
then forming a central region of the data track that interconnects the at least two data regions.

55. The method of claim 54, further comprising forming two conductive pads that are connected to the at least two data regions.

56. The method of claim 55, wherein forming the two conductive pads comprises etching two lower trenches in an insulator substrate.

57. The method of claim 56, further comprising filling the two lower trenches with an electrically conductive trench material.

58. The method of claim 57, wherein forming the central region comprises forming an upper trench in a multi-layer stack structure.

59. The method of claim 58, wherein forming the at least two data regions comprises forming two vias through the multi-layer stack structure to expose the two lower trenches.

60. The method of claim 59, wherein the multi-layer stack structure connects the two vias.

61. The method of claim 60, wherein forming the at least two data regions of the data track comprises filling the two vias and the upper trench with a magnetic material.

62. The method of claim 60, wherein forming the multi-layer stack structure comprises forming the multi-layer stack structure of a plurality of layers of alternating materials A and B.

63. The method of claim 61, wherein forming the two vias comprises etching the two vias in the multi-layer stack structure using a non-selective etching process.

64. The method of claim 63, wherein the two vias comprise inner walls; and
wherein forming the two vias further comprises using a selective etching process to selectively etch the inner walls of the vias, by selectively etching material A faster than material B.

65. The method of claim 64, further comprising filling the two vias with a magnetic material that is selected from the group consisting of ferromagnetic materials and ferrimagnetic materials.

66. The method of claim 65, further comprising forming two conductor vias through the multi-layer stack structure to expose the two lower trenches.

67. The method of claim 66, further comprising filling the two conductor vias with an electrically conductive material.

* * * * *